US008552484B2

(12) United States Patent
Nagai

(10) Patent No.: US 8,552,484 B2
(45) Date of Patent: Oct. 8, 2013

(54) SEMICONDUCTOR DEVICE AND METHOD FOR FABRICATING THE SAME

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 545 days.

(21) Appl. No.: 11/647,198

(22) Filed: Dec. 29, 2006

(65) Prior Publication Data

US 2007/0108489 A1    May 17, 2007

Related U.S. Application Data

(63) Continuation of application No. PCT/JP2005/011955, filed on Jun. 29, 2005, and a continuation of application No. PCT/JP2004/009429, filed on Jul. 2, 2004.

(51) Int. Cl.
| | |
|---|---|
| H01G 7/06 | (2006.01) |
| H01L 27/108 | (2006.01) |
| H01L 29/76 | (2006.01) |
| H01L 29/92 | (2006.01) |

(52) U.S. Cl.
USPC ............. 257/295; 257/E27.104; 257/E21.664

(58) Field of Classification Search
USPC ............. 257/295, E21.009, E21.01, E21.663, 257/E21.664, 296–313, E29.164, E29.272, 257/E21.208, E21.436, E27.104
See application file for complete search history.

(56) References Cited

U.S. PATENT DOCUMENTS

| | | | |
|---|---|---|---|
| 6,218,197 | B1 | 4/2001 | Kasai |
| 6,509,597 | B2 | 1/2003 | Waki et al. |
| 6,611,014 | B1 | 8/2003 | Kanaya et al. |
| 6,642,563 | B2 | 11/2003 | Kanaya |
| 6,828,189 | B2 | 12/2004 | Igarashi |
| 6,867,446 | B2 | 3/2005 | Otani et al. |
| 6,911,686 | B1 | 6/2005 | Itoh |

(Continued)

FOREIGN PATENT DOCUMENTS

| | | |
|---|---|---|
| EP | 1061573 A2 | 12/2000 |
| JP | 2001-15703 A | 1/2001 |

(Continued)

OTHER PUBLICATIONS

International Search Report of PCT/JP2005/011955, date of mailing Oct. 18, 2005.

(Continued)

*Primary Examiner* — Robert J Hoffberg
*Assistant Examiner* — Eric Ward
(74) *Attorney, Agent, or Firm* — Westerman, Hattori, Daniels & Adrian, LLP

(57) ABSTRACT

The semiconductor device according to the present invention comprises: a ferroelectric capacitor 42 formed above a semiconductor substrate 10 and including a lower electrode 36, a ferroelectric film 38 formed on the lower electrode 36 and an upper electrode 40 formed on the ferroelectric film 38; a silicon oxide film 60 formed above the semiconductor substrate 10 and the ferroelectric capacitor 42 and having the surface planarized; a flat barrier film 62 formed on the silicon oxide film 60 with a silicon oxide film 61 formed therebetween, for preventing the diffusion of hydrogen or water; a silicon oxide film 64 formed above the barrier film 62 and having the surface planarized; and a flat barrier film 78 formed on the silicon oxide film 74 with a silicon oxide film 76 formed therebetween, for preventing the diffusion of hydrogen or water.

9 Claims, 55 Drawing Sheets

(56) References Cited

U.S. PATENT DOCUMENTS

| | | | |
|---|---|---|---|
| 7,232,764 B1 * | 6/2007 | Yaegashi | 438/702 |
| 2001/0020708 A1 | 9/2001 | Kasai | |
| 2002/0011616 A1 * | 1/2002 | Inoue et al. | 257/295 |
| 2002/0038402 A1 | 3/2002 | Kanaya | |
| 2002/0042185 A1 | 4/2002 | Waki et al. | |
| 2003/0060007 A1 | 3/2003 | Igarashi | |
| 2003/0071293 A1 * | 4/2003 | Otani et al. | 257/295 |
| 2004/0038154 A1 | 2/2004 | Muramatsu et al. | |
| 2004/0046185 A1 * | 3/2004 | Sashida | 257/200 |
| 2004/0084701 A1 | 5/2004 | Kanaya et al. | |
| 2004/0097100 A1 | 5/2004 | Sato et al. | |

FOREIGN PATENT DOCUMENTS

| | | |
|---|---|---|
| JP | 2001-36026 A | 2/2001 |
| JP | 2001-60669 A | 3/2001 |
| JP | 2001-68639 A | 3/2001 |
| JP | 2002-76114 A | 3/2002 |
| JP | 2002-94025 A | 3/2002 |
| JP | 2002-110932 A | 4/2002 |
| JP | 2002-110937 A | 4/2002 |
| JP | 2002110932 | 4/2002 |
| JP | 2002-141485 A | 5/2002 |
| JP | 2002-176149 A | 6/2002 |
| JP | 2002-343962 A | 11/2002 |
| JP | 2003-100994 A | 4/2003 |
| JP | 2003-100995 A | 4/2003 |
| JP | 2003-174145 A | 6/2003 |
| JP | 2003-197878 A | 7/2003 |
| JP | 2004-133384 A | 4/2004 |

OTHER PUBLICATIONS

Korean Office Action dated Dec. 10, 2007, Application No. 10-2006-7027308.

Japanese Office Action dated Nov. 20, 2012, issued in corresponding Japanese patent application No. 2006-528750, w/ English translation.

* cited by examiner

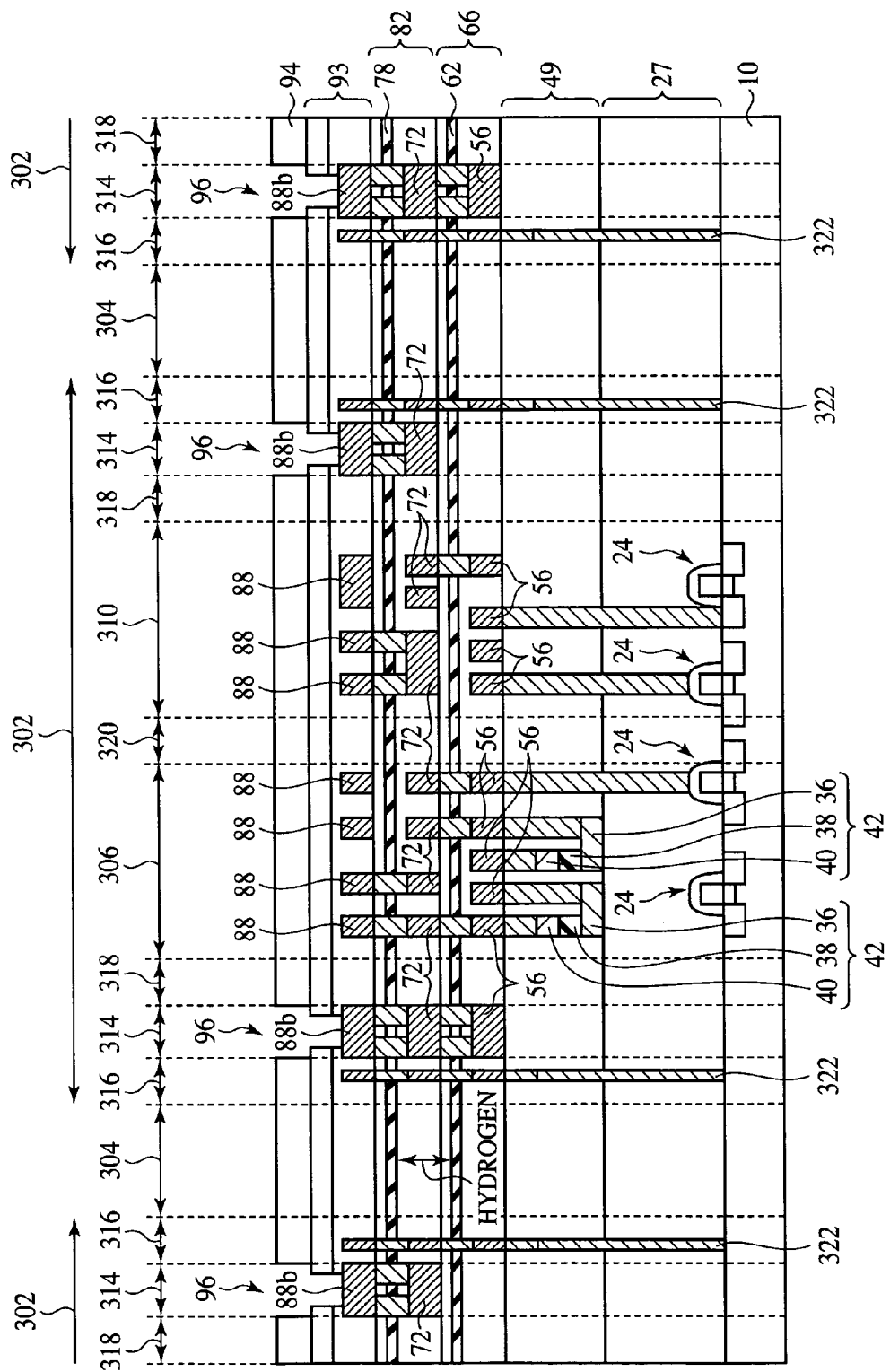

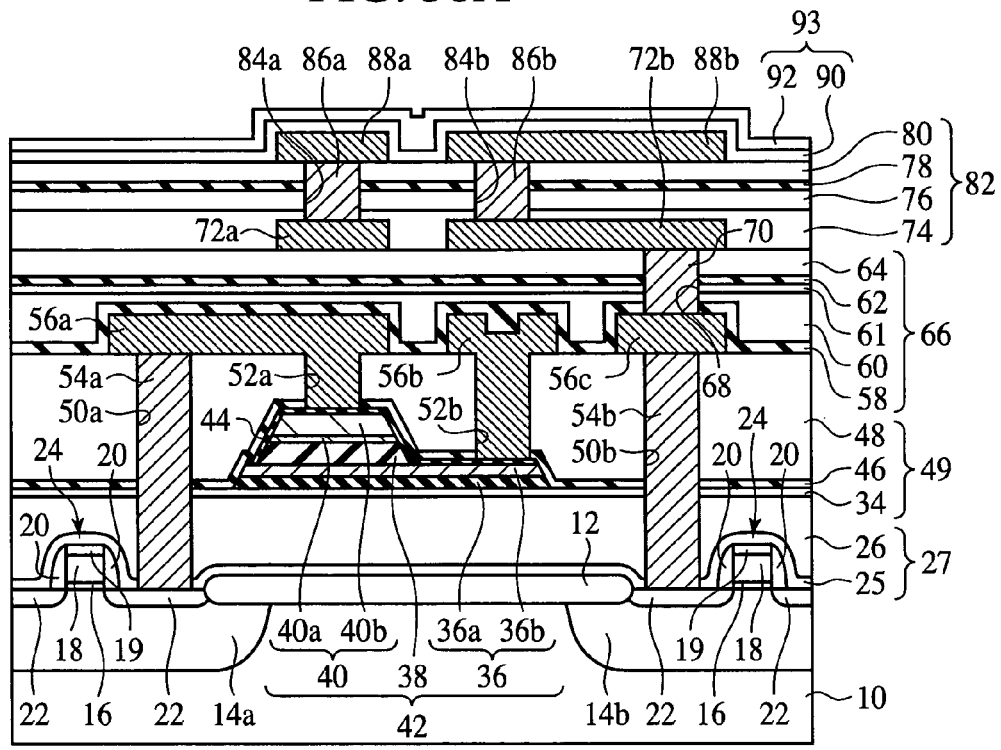

US 8,552,484 B2

SEMICONDUCTOR DEVICE AND METHOD FOR FABRICATING THE SAME

CROSS REFERENCE TO RELATED APPLICATIONS

This application is a continuation of International Application PCT/JP2005/011955, with an International filing date of Jun. 29, 2005, which claims the benefit under 35 U.S.C. 120 and/or 365(c) International Application PCT/JP2004/009429 with an International filing date of Jul. 2, 2004.

TECHNICAL FIELD

The present invention relates to a semiconductor device and a method for fabricating the semiconductor device, more specifically, a semiconductor device including a ferroelectric capacitor and a method for fabricating the same.

BACKGROUND ART

Recently, it is noted to use ferroelectric film as the dielectric film of capacitors. An FeRAM (Ferroelectric Random Access Memory) including such ferroelectric capacitors is a nonvolatile memory having characteristics, such as being operative at high speed and having low electric power consumption, good write and read endurance, etc. and is prospective.

However, the ferroelectric capacitor has the characteristic that the characteristics are easily deteriorated by hydrogen gas and water from the outside. Specifically, it is generally known that the ferroelectric capacitor of the standard FeRAM, having the lower electrode of Pt film, the ferroelectric film of PZT film and the upper electrode of Pt film substantially loses the ferroelectricity of the $PbZr_{1-x}Ti_xO_3$ film (PZT film) when the substrate is heated to around 200° C. in an atmosphere of an about 40 Pa (0.3 Torr) hydrogen partial pressure. It is known that the ferroelectricity of the ferroelectric film of the ferroelectric capacitor is much deteriorated when thermal processing is performed with the ferroelectric capacitor adsorbing water or with water being present near the ferroelectric capacitor.

Because of these properties of the ferroelectric capacitor, in the process for fabricating the FeRAM, processes which generate small amounts of water and are made at low temperatures as far as possible are selected as the processes following the formation of the dielectric film. As the process for forming the inter-layer insulation film, the film forming processes, such as CVD (Chemical Vapor Deposition), etc., using raw material gases which generate relatively small mounts of hydrogen are selected.

Furthermore, as the technique for preventing the deterioration of the ferroelectric film due to hydrogen and water are proposed the technique of forming aluminum oxide film covering the ferroelectric capacitors, the technique of forming aluminum oxide film on an inter-layer insulation film formed above the ferroelectric capacitors. Aluminum oxide film has the function of preventing the diffusion of hydrogen and water. These proposed techniques can prohibit hydrogen and water from arriving at the ferroelectric film, and the deterioration of the ferroelectric film due to hydrogen and water can be prevented. These techniques are disclosed in, e.g., Patent References 1 to 7.

[Patent Reference 1]
Japanese Patent Application Unexamined Publication No. 2003-197878
[Patent Reference 2]
Japanese Patent Application Unexamined Publication No. 2001-68639
[Patent Reference 3]
Japanese Patent Application Unexamined Publication No. 2003-174145
[Patent Reference 4]
Japanese Patent Application Unexamined Publication No. 2002-176149
[Patent Reference 5]
Japanese Patent Application Unexamined Publication No. 2003-100994
[Patent Reference 6]
Japanese Patent Application Unexamined Publication No. 2001-36026
[Patent Reference 7]
Japanese Patent Application Unexamined Publication No. 2001-15703

DISCLOSURE OF THE INVENTION

Problems to be Solved by the Invention

As described above, the ferroelectric capacitor has the characteristic that the characteristics are easily deteriorated by hydrogen and water from the outside. Accordingly, the conventional FeRAM cannot have good test result of PTHS (Pressure Temperature Humidity Stress) test, which is one of the accelerated lifetime tests.

Usually, the PTHS test is made under conditions of, e.g., the temperature: 135° C. and the humidity: 85%, based on the specifications of JEDEC (Joint Electron Device Engineering Council), etc. In the PTHS test, unless the FeRAM has the resistance to hydrogen and humidity resistance ensured, the ferroelectric capacitors are deteriorated, and defects are generated.

Techniques for preventing the deterioration of the ferroelectric film due to hydrogen and water have been so far proposed but have not been sufficient to improve the PTHS characteristics of the semiconductor devices, such as FeRAM etc. including ferroelectric capacitors and give good test results which sufficiently exceed the mass production qualification level in the PTHS test.

An object of the present invention is to provide a semiconductor device which has good resistance to hydrogen gas and humidity, and can prevent the deterioration of the characteristics of the ferroelectric capacitors and improve the PTHS characteristics, and a method for fabricating the same.

Means for Solving the Problems

According to one aspect of the present invention, there is provided a semiconductor device comprising: a ferroelectric capacitor formed above a semiconductor substrate and including a lower electrode, a ferroelectric film formed on the lower electrode and an upper electrode formed on the ferroelectric film; a first insulation film formed above the semiconductor substrate and the ferroelectric capacitor, and having a surface planarized; a flat first barrier film formed above the first insulation film, for preventing the diffusion of hydrogen or water; a second insulation film formed above the first barrier film and having a surface planarized; and a flat second barrier film formed above the second insulation film, for preventing the diffusion of hydrogen or water.

According to another aspect of the present invention, there is provided a semiconductor device comprising: a memory cell region including a ferroelectric capacitor formed above a semiconductor substrate and including a lower electrode, a ferroelectric film formed on the lower electrode and an upper electrode formed on the ferroelectric film; a first insulation film formed above the semiconductor substrate and the ferroelectric capacitor, and having a surface planarized; a flat first barrier film formed above the first insulation film, for preventing the diffusion of hydrogen or water; a second insulation film formed above the first barrier film and having a surface planarized; and a flat second barrier film formed above the second insulation film, for preventing the diffusion of hydrogen or water; and a pad region where a bonding pad is formed, at least either of the first barrier film and the second barrier film being formed over the memory cell region and the pad region.

According to further another aspect of the present invention, there is provided a semiconductor device comprising: a chip region including a ferroelectric capacitor formed above a semiconductor substrate and including a lower electrode, a ferroelectric film formed on the lower electrode and an upper electrode formed on the ferroelectric film; a first insulation film formed above the semiconductor substrate and the ferroelectric capacitor, and having a surface planarized; a flat first barrier film formed above the first insulation film, for preventing the diffusion of hydrogen or water; a second insulation film formed above the first barrier film and having a surface planarized; and a flat second barrier film formed above the second insulation film, for preventing the diffusion of hydrogen or water; and a scribe region provided on the semiconductor substrate, adjacent to the chip region, at least either of the first barrier film and the second barrier film being formed over the chip region and the scribe region.

According to further another aspect of the present invention, there is provided a method for fabricating a semiconductor device comprising the steps of: forming above a semiconductor substrate a ferroelectric capacitor including a lower electrode, a ferroelectric film formed on the lower electrode and an upper electrode formed on the ferroelectric film; forming a first insulation film above the semiconductor substrate and the ferroelectric capacitor; planarizing a surface of the first insulation film; forming above the first insulation film a flat first barrier film for preventing the diffusion of hydrogen or water; forming a second insulation film above the first barrier film; planarizing a surface of the second insulation film; and forming above the second insulation film a flat second barrier film for preventing the diffusion of hydrogen or water.

In the specification of the present application, "on" or "above" as in "on the substrate", "above the substrate", "on the ferroelectric capacitor", "above the ferroelectric capacitor", "on the insulation film", "above the insulation film", "on the interconnection layer", "above the interconnection layer", etc. includes "immediately on" and also "above" the substrate, etc.

Effects of the Invention

According to the present invention, in the semiconductor device comprising a ferroelectric capacitor formed above a semiconductor substrate and including a lower electrode, a ferroelectric film formed on the lower electrode and an upper electrode formed on the ferroelectric film, a first insulation film having a surface planarized is formed above the semiconductor substrate and the ferroelectric capacitor; a flat first barrier film for preventing the diffusion of hydrogen or water is formed above the first insulation film; a second insulation film having a surface planarized is formed above the first barrier film and; and a flat second barrier film for preventing the diffusion of hydrogen or water is formed above the second insulation film, whereby hydrogen and water can be surely barriered to surely prevent the arrival of the hydrogen and water at the ferroelectric film of the ferroelectric capacitor. Thus, the deterioration of the electric characteristics of the ferroelectric capacitor due to hydrogen and water can be prevented, and the PTHS characteristics of the semiconductor device including the ferroelectric capacitor can be much improved.

BRIEF DESCRIPTION OF DRAWINGS

FIG. 21 is a view illustrating the advantageous effect produced by the semiconductor device according to the first embodiment of the present invention (Part 5).

FIGS. 38A-38B are sectional views of the semiconductor device according to the first embodiment in the steps of the method for fabricating the same, which illustrate the method (Part 15).

DESCRIPTION OF THE REFERENCE NUMBERS

Figure 1A:
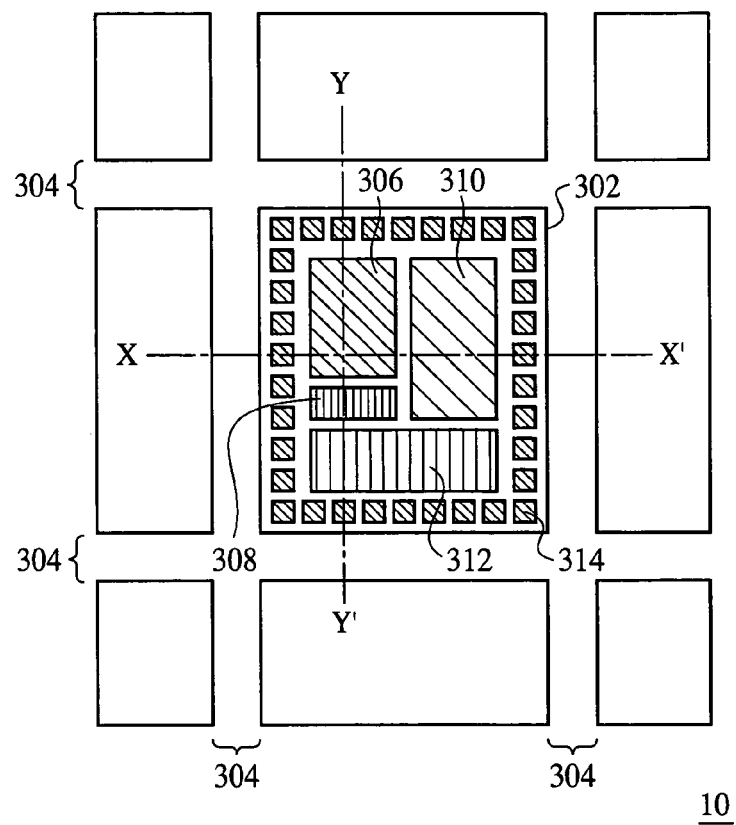
FIGS. 1A and 1B are plan views illustrating the chip structure of the semiconductor device according to a first embodiment of the present invention.

10 . . . semiconductor substrate
12 . . . device isolation region
14a, 14b . . . well
16 . . . gate insulation film
18 . . . gate electrode
19 . . . insulation film
20 . . . sidewall insulation film
22 . . . source/drain diffused layer
24 . . . transistor
25 . . . SiON film
26 . . . silicon oxide film
27 . . . inter-layer insulation film
34 . . . silicon oxide film
36 . . . lower electrode
36a . . . aluminum oxide film
36b . . . Pt film
38 . . . ferroelectric film
40 . . . upper electrode
40a . . . $IrO_X$ film
40b . . . $IrO_Y$ film
42 . . . ferroelectric capacitor
44 . . . barrier film
46 . . . barrier film
48 . . . silicon oxide film
49 . . . inter-layer insulation film
50a, 50b . . . contact hole
52a, 52b . . . contact hole
54a, 54b . . . conductor plug
56 . . . the first metal interconnection layer
56a, 56b, 56c . . . interconnection
58 . . . barrier film
60 . . . silicon oxide film
61 . . . silicon oxide film
62 . . . barrier film
64 . . . silicon oxide film
66 . . . inter-layer insulation film
68 . . . contact hole
70 . . . conductor plug
72 . . . the second metal interconnection layer
72a, 72b . . . interconnection
74 . . . silicon oxide film
76 . . . silicon oxide film
78 . . . barrier film
80 . . . silicon oxide film
82 . . . inter-layer insulation film
84a, 84b . . . contact hole
86a, 86b . . . conductor plug
88 . . . the third metal interconnection layer
88a, 88b . . . interconnection
90 . . . silicon oxide film
92 . . . silicon nitride film
93 . . . layered film
94 . . . polyimide resin film
96a, 96a, 96a . . . opening
98 . . . photoresist film
100 . . . photoresist film
102 . . . photoresist film
104 . . . SiON film
106 . . . photoresist film
108 . . . opening
110 . . . defective part
112 . . . silicon oxide film
114 . . . barrier film
116 . . . barrier film
118 . . . silicon oxide film
120a, 120b . . . contact hole
122 . . . SiON film
210 . . . semiconductor substrate
212 . . . device isolation region
214a, 214b . . . well
216 . . . gate insulation film
218 . . . gate electrode
219 . . . silicon oxide film
220 . . . sidewall insulation film
222 . . . source/drain diffused layer
224 . . . transistor
225 . . . SiON film
226 . . . silicon oxide film
227 . . . inter-layer insulation film
228 . . . barrier film
230a, 230b . . . contact hole
232a, 232b . . . conductor plug
234 . . . Ir film
236 . . . lower electrode
238 . . . ferroelectric film
240 . . . upper electrode
242 . . . ferroelectric capacitor
244 . . . SiON film
246 . . . barrier film
248 . . . silicon oxide film
250 . . . barrier film
252 . . . silicon oxide film
253 . . . inter-layer insulation film
254a, 254b . . . contact hole
256a, 256b . . . conductor plug
258a, 258b . . . interconnection
260, 260a, 260b . . . silicon oxide film
262 . . . barrier film
264 . . . silicon oxide film
265 . . . inter-layer insulation film
268 . . . contact hole
270 . . . conductor plug
272 . . . interconnection
274 . . . silicon oxide film
276 . . . barrier film
278 . . . silicon oxide film
280a, 280b . . . interconnection trench
282a, 282b . . . Cu interconnection
284 . . . inter-layer insulation film
285 . . . interconnection trench
286 . . . Cu interconnection
288 . . . silicon oxide film
289 . . . contact hole
290 . . . conductor plug
292 . . . bonding pad
294 . . . silicon oxide film
296 . . . silicon nitride film
298 . . . polyimide resin film
299, 299a, 299b . . . opening
300 . . . shot
302 . . . FeRAM chip region
304 . . . scribe region
306 . . . FeRAM cell region
308 . . . peripheral circuit region for FeRAM
310 . . . logic circuit region 312 . . . peripheral circuit region for logic circuit
314 . . . pad region
316 . . . scribe region-pad region interface
318 . . . pad region-circuit region interface
320 . . . circuit region-circuit region interface
322 . . . moisture resistant ring
324 . . . inter-layer insulation film
326 . . . interconnection layer
328 . . . barrier film
330 . . . inter-layer insulation film
332 . . . contact hole
334 . . . conductor plug
336 . . . interconnection layer
338 . . . defect in conductor plug
400 . . . inter-layer insulation film
402 . . . lower electrode
404 . . . ferroelectric film
406 . . . upper electrode
408 . . . ferroelectric capacitor
410 . . . SOG film
412 . . . interconnection
414 . . . aluminum oxide film
416 . . . inter-layer insulation film
418 . . . barrier film
420 . . . photoresist film
422a, 422b . . . contact hole
424 . . . metal film
426 . . . photoresist film
428a, 428b . . . interconnection
430 . . . conductor plug
432 . . . inter-layer insulation film
434 . . . interconnection
436 . . . inter-layer insulation film
438 . . . barrier film
440 . . . barrier film
442 . . . Al interconnection
444 . . . conductor plug
446 . . . contact hole

BEST MODE FOR CARRYING OUT THE INVENTION

A First Embodiment

The semiconductor device and method for fabricating the same according to a first embodiment of the present invention will be explained with reference to FIGS. 1A-1B to 39A-39B.

(The Semiconductor Device)

First, the semiconductor device according to the present embodiment will be explained with reference to FIGS. 1A-1B to 23A-23B.

Figure 1B:
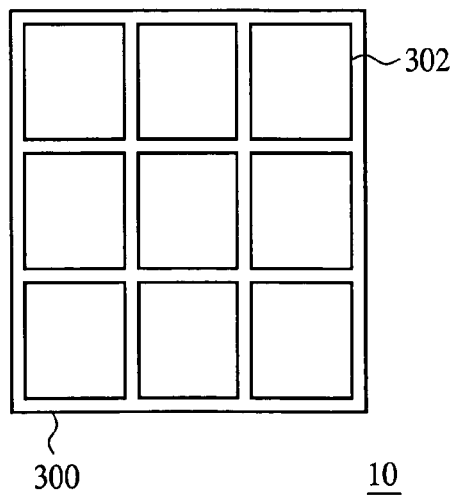
Figure 2A:
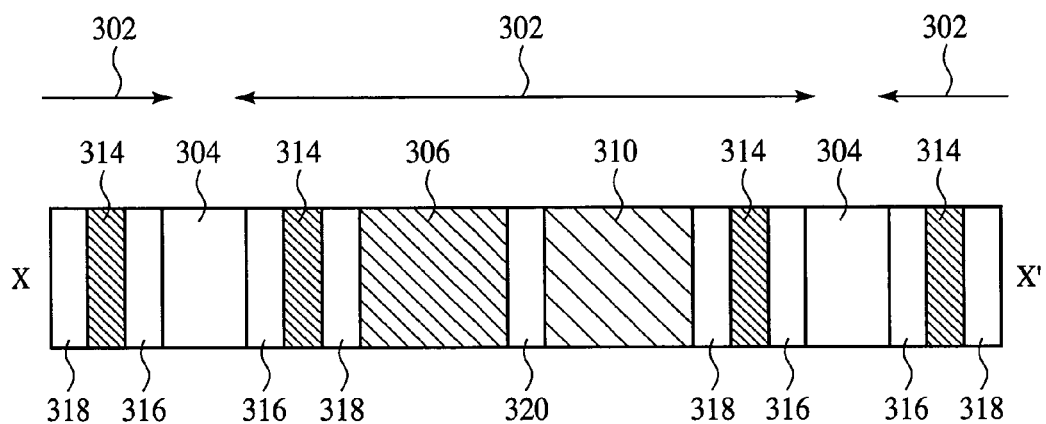
FIGS. 2A and 2B are plan views illustrating the area structure of the chip surface layer of the semiconductor device according to the first embodiment of the present invention.
Figure 2B:
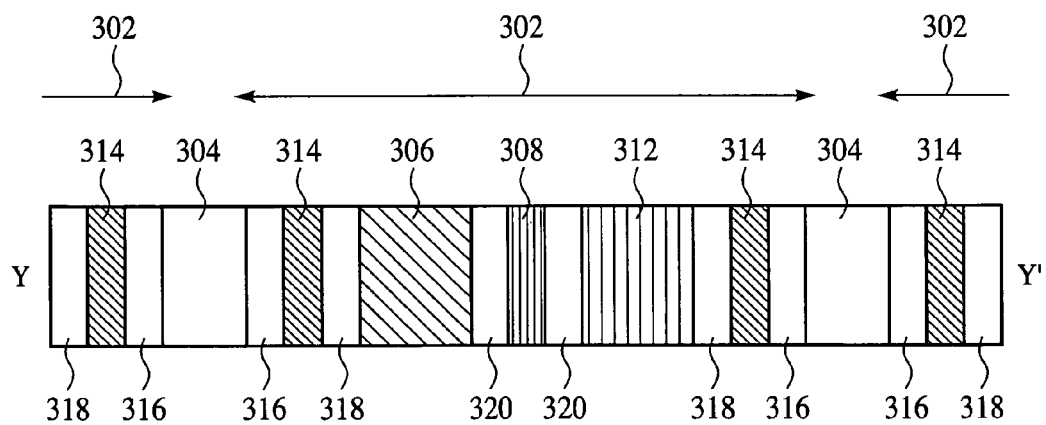

First, a chip structure of the semiconductor device according to the present embodiment will be explained with reference to FIGS. 1A-1B and 2A-2B. FIGS. 1A-1B are plan views of chips of the semiconductor device according to the present embodiment, which illustrate the chip structure, and FIGS. 2A-2B are plan views of the chip surface layer of the semiconductor device according to the present embodiment, which illustrate an area constitution thereof. FIG. 1B is a plan view of the FeRAM chip regions in one shot, and FIG. 1A is an enlarged plan view of the FeRAM chip region in FIG. 1B. FIG. 2A is a plan view of the area constitution of the chip surface layer along the line X-X' in FIG. 1A, and FIG. 2B is a plan view of the area constitution of the chip surface layer along the line Y-Y' in FIG. 1A.

As illustrated in FIGS. 1A and 1B, on a semiconductor substrate 10, a plurality of FeRAM chip regions 302 are formed in each shot 300. Between the neighboring FeRAM chip regions 302, a scribe region 304 which is a cut region to be cut to separate the respective FeRAM chip regions 302 into FeRAM chips are provided.

In each FeRAM chip region 302, an FeRAM cell region 306 where FeRAM cells are formed, a peripheral circuit region 308 where a peripheral circuit for the FeRAM is formed, a logic circuit region 310 where a logic circuit is formed, and a peripheral circuit region 312 where a peripheral circuit for the logic circuit is formed are provided. In the periphery of the FeRAM chip region 302, pad regions 314 where bonding pads for connecting the chip circuits to outside circuits are formed. The pad regions 314 may be formed along all the side in the periphery or along only one set of the opposed sides of the rectangular FeRAM chip region 302.

The area constitution of the chip surface layer along the line X-X' in FIG. 1A includes, as illustrated in FIG. 2A, sequentially from the side of X to the side of X', the scribe region 304, the scribe region-pad region interface 316, the pad region 314, the pad region-circuit region interface 318, the FeRAM cell region 306, the circuit region-circuit region interface 320, the logic circuit region 310, the pad region-circuit region interface 318, the pad region 314, the scribe region-pad region interface 316, and the scribe region 304.

The area constitution of the chip surface layer along the line Y-Y' in FIG. 1A includes, as illustrated in FIG. 2B, sequentially from the side of Y to the side of Y', the scribe region 304, the scribe region-pad region interface 316, the pad region 314, the pad region-circuit region interface 318, the FeRAM cell region 306, the circuit region-circuit region interface 320, the peripheral circuit region 308 for the FeRAM, the circuit region-the circuit region interface 320, the peripheral circuit region 312 for the logic circuit, the pad region-the circuit region interface 318, the pad region 314, the scribe region-the pad region interface 316 and the scribe region 304.

Figure 3:
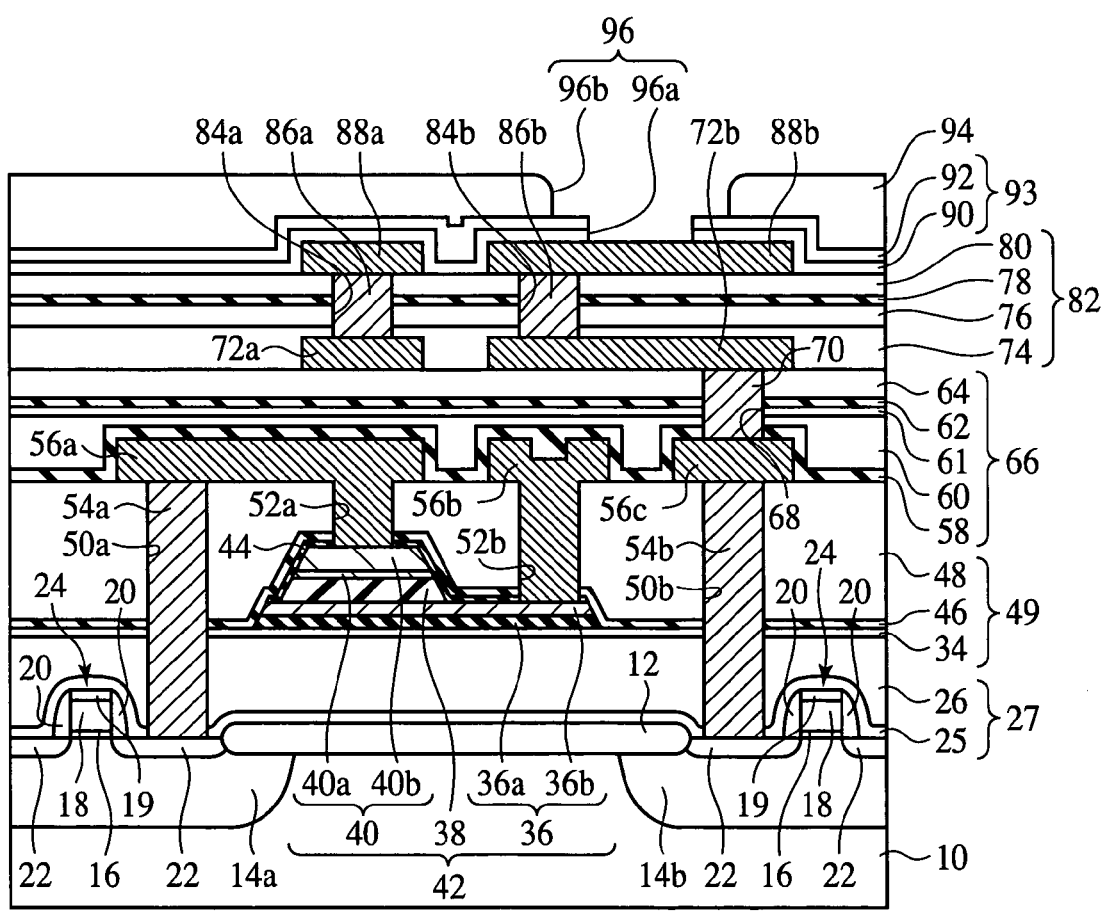
FIG. 3 is a sectional view of the semiconductor device according to the first embodiment of the present invention, which illustrates a structure thereof (Part 1).
Figure 4:
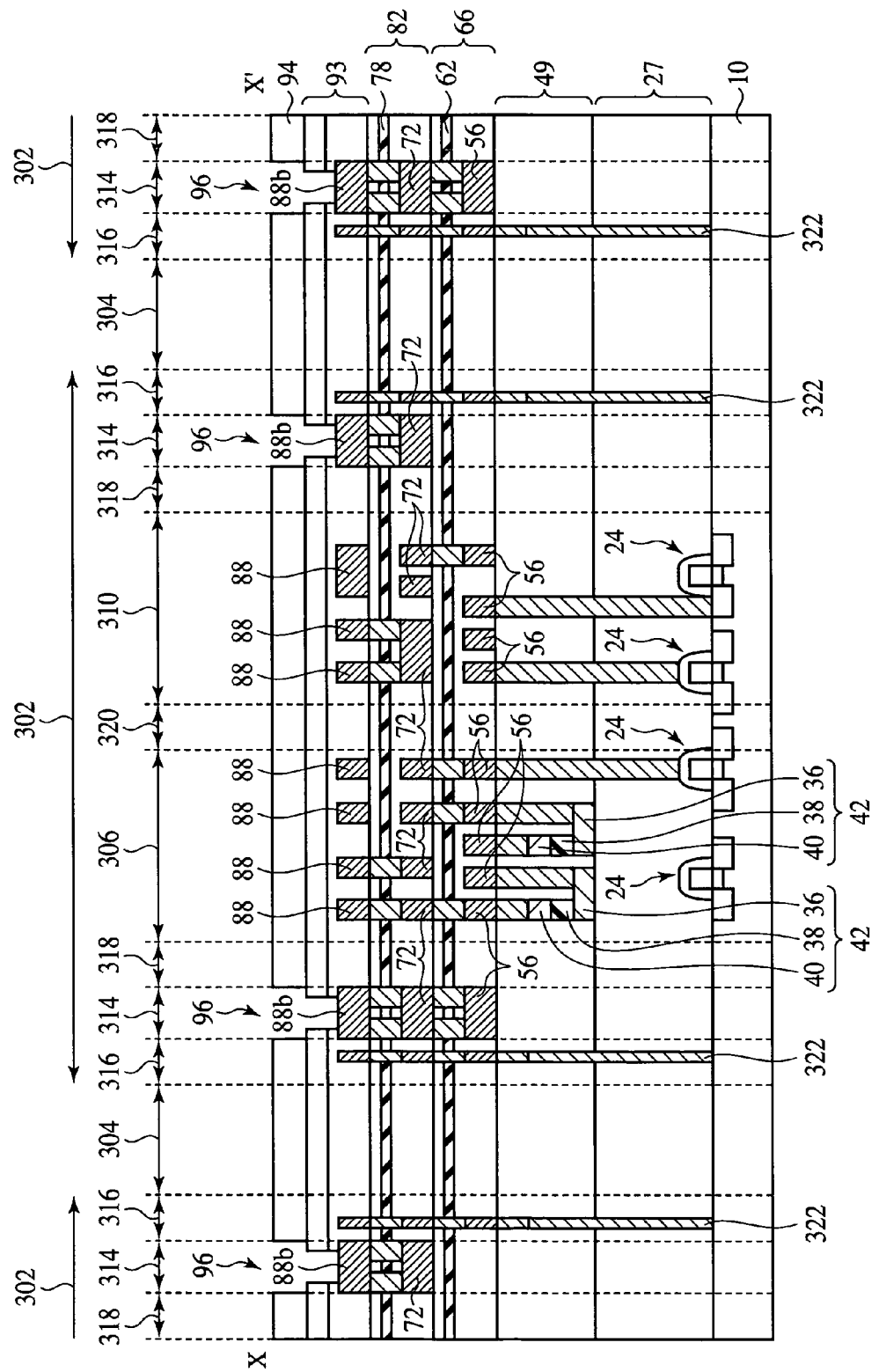
FIG. 4 is a sectional view of the semiconductor device according to the first embodiment of the present invention, which illustrates a structure thereof (Part 2).
Figure 5:
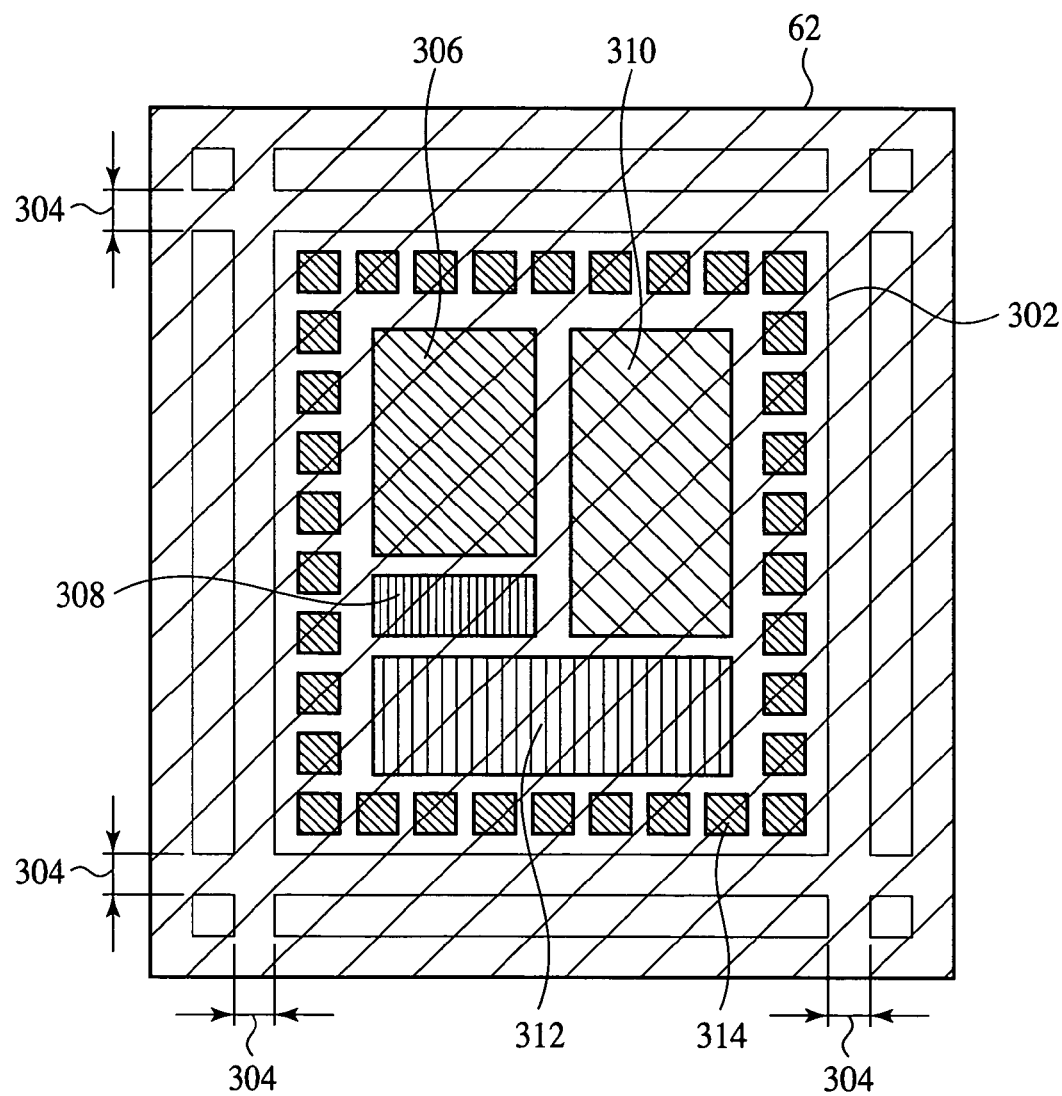
FIG. 5 is a plan view illustrating the area where the barrier film is formed in the semiconductor device according to the first embodiment of the present invention (Part 1).
Figure 6:
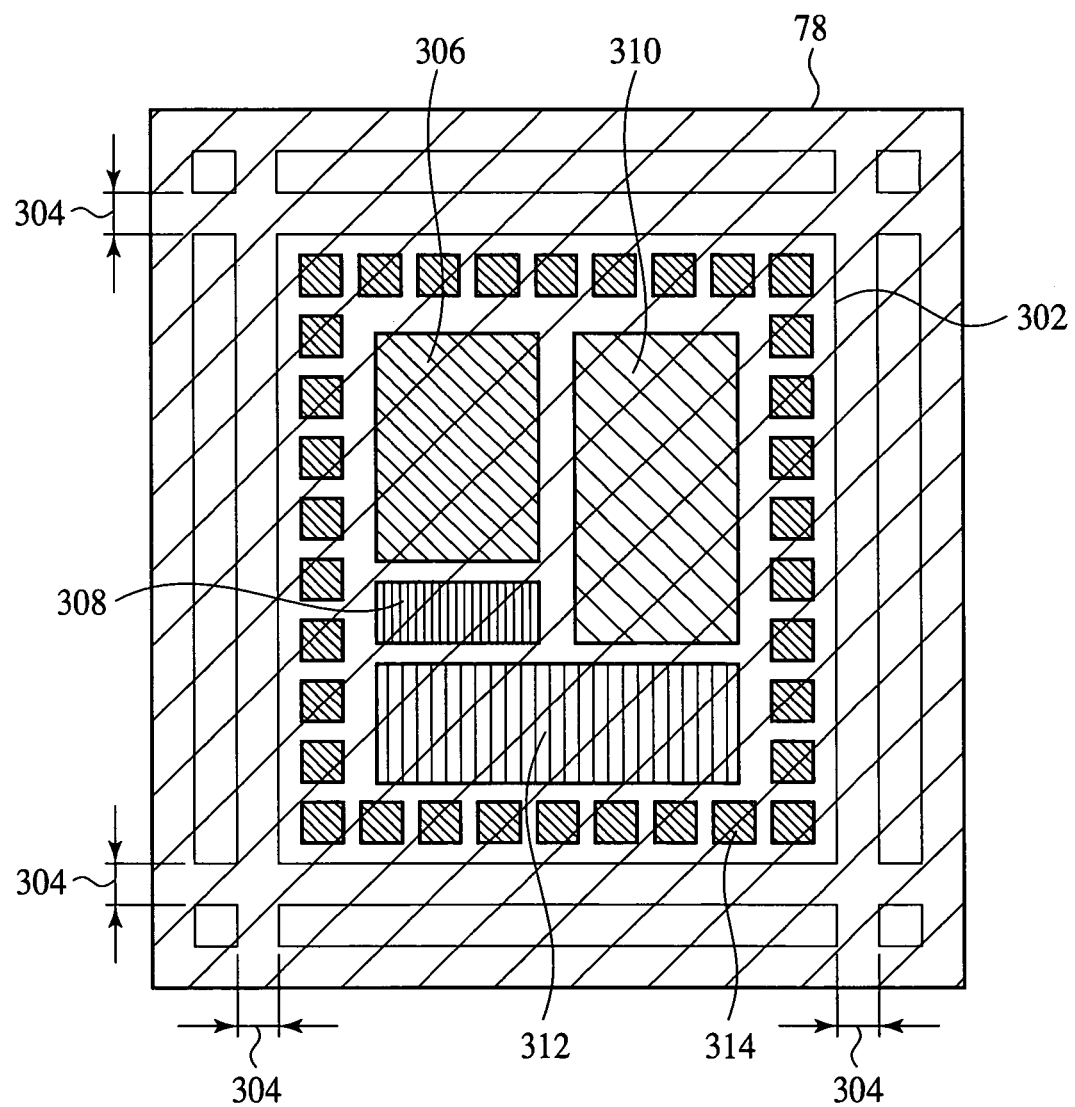
FIG. 6 is a plan view illustrating the area where the barrier film is formed in the semiconductor device according to the first embodiment of the present invention (Part 2).

Then, the structure of the semiconductor device according to the present embodiment will be explained with reference to FIGS. 3 to 6. FIGS. 3 and 4 are sectional views of the semiconductor device according to the present embodiment, which illustrate the structure thereof. FIGS. 5 and 6 are plan views which illustrate the area where barrier films are formed in the semiconductor device according to the present embodiment. In FIG. 4, the sectional structure of the FeRAM chip region 32 to the scribe regions 304 is illustrated as it is, but FIG. 3 shows the sectional structure in which the FeRAM chip region 306, the peripheral circuit region 308 and the pad region 314 constituting the FeRAM chip region 302 are illustrated in one to simplify the illustration.

As illustrated in FIG. 3, on a semiconductor substrate 10 of, e.g., silicon, a device isolation region 12 defining a device region is formed. In the semiconductor substrate 10 with the device isolation region 12 formed on, wells 14a, 14b are formed.

On the semiconductor substrate 10 with the wells 14a, 14b formed in, gate electrodes (gate interconnections) 18 are formed with gate insulation films 16 formed therebetween. The gate electrode 18 has the polycide structure of a metal silicide film, such as tungsten silicide film or others, laid on, e.g., a polysilicon film. On the gate electrode 18, an insulation film 19 of silicon oxide film is formed. On the side wall of the gate electrode 18 and the insulation film 19, a sidewall insulation film 20 is formed.

Source/drain diffused layers 22 are formed in the semiconductor substrate 10 on both sides of the gate electrode 18 with the sidewall insulation film 20 formed on. Thus, transistors 24 each including the gate electrode 18 and the source/drain diffused layers 22 are formed. The gate length of the transistor 24 is set at, e.g., 0.35 μm or, e.g., 0.11-0.18 μm.

On the semiconductor substrate 10 with the transistors 24 formed on, an SiON film 25 of, e.g., a 200 nm-thickness and a silicon oxide film 26 of, e.g., a 600 nm-thickness are sequentially laid. Thus, an inter-layer insulation film 27 of the SiON film 25 and the silicon oxide film 26 sequentially laid the latter on the former is formed. The surface of the inter-layer insulation film 27 is planarized.

On the inter-layer insulation film 27, a silicon oxide film 34 of, e.g., a 100 nm-thickness is formed. The silicon oxide film 34, which is formed on the planarized inter-layer insulation film 27, is flat.

On the silicon oxide film 34, the lower electrode 36 of a ferroelectric capacitor 42 is formed. The lower electrode 36 is formed of the layered film of a 20-50 nm-thickness aluminum oxide film 36a and a 100-200 nm-thickness Pt film 36, for example, sequentially laid the latter on the former. The film thickness of the Pt film 36b is set at 165 nm here.

On the lower electrode 36, a ferroelectric film 38 of the ferroelectric capacitor 42 is formed. The ferroelectric film 38 is $PbZr_{1-X}Ti_XO_3$ film (PZT film) of, e.g., a 100-250 nm-thickness. A 150 nm thickness PZT film is used as the ferroelectric film 38 here.

On the ferroelectric film 38, the upper electrode 40 of the ferroelectric capacitor 42 is formed. The upper electrode 40 is formed of the layered film of, a 25-75 nm-thickness $IrO_X$ film 40a and a 150-250 nm-thickness $IrO_Y$ film 40b sequentially laid the latter on the former. The film thickness of the $IrO_X$ film 40a is set at 50 nm, and the film thickness of the $IrO_Y$ film 40b is set at 200 nm here. The composition ratio Y of the oxygen of the $IrO_Y$ film 40b is set higher than the composition ratio X of the oxygen of the $IrO_X$ film 40a.

Thus, the ferroelectric capacitor 42 including the lower electrode 36, the ferroelectric film 38 and the upper electrode 40 is constituted.

On the ferroelectric film 38 and the upper electrode 40, a barrier film 44 is formed, covering the upper surfaces and the side surfaces of the ferroelectric film 38 and the upper electrode 40. The barrier film 44 is formed of an aluminum oxide film ($Al_2O_3$) film of, e.g., a 20-100 nm-thickness.

The barrier film 44 has the function of preventing the diffusion of hydrogen and water. When hydrogen and water arrive at the ferroelectric film 38 of the ferroelectric capacitor 42, the metal oxide forming the ferroelectric film 38 is reduced with the hydrogen and water, and the electric characteristics of the ferroelectric capacitor 42 are deteriorated. The barrier film 44 is formed covering the upper surfaces and the side surfaces of the ferroelectric film 38 and the upper electrode 40, whereby the arrival of hydrogen and water at the ferroelectric film 38 is suppressed, and the deterioration of the electric characteristics of the ferroelectric capacitor 42 can be suppressed.

On ferroelectric capacitor 42 covered by the barrier film 44 and on the silicon oxide film 34, a barrier film 46 is formed. The barrier film 46 is an aluminum oxide film of, e.g. a 20-100 nm-thickness.

The barrier film 46 has the function of preventing the diffusion of hydrogen and water, as does the barrier film 44.

On the barrier film 40, a silicon oxide film 48 of, e.g., a 1500 nm-thickness is formed. The surface of the silicon oxide film 48 is planarized. The silicon oxide film 48 is formed by, e.g., CVD, MOCVD or others.

An inter-layer insulation film 49 is formed of the silicon oxide film 34, the barrier film 46 and the silicon oxide film 48.

In the silicon oxide film 48, the barrier film 46, the silicon oxide film 34 and the inter-layer insulation film 27, contact holes 50a, 50b are formed respectively down to the source/drain diffused layers 22. In the silicon oxide film 48, the barrier film 46 and the barrier film 44, a contact hole 52a is formed down to the upper electrode 40. In the silicon oxide film 48, the barrier film 46 and the barrier film 44, a contact hole 52b is formed down to the lower electrode 36.

In the contact holes 50a, 50b, a barrier metal film (not illustrated) of, e.g., a 20 nm-thickness Ti film and, e.g., a 50 nm-thickness TiN film laid the latter on the former is formed. The Ti film of the barrier metal film is formed for the reduction of the contact resistance, and the TiN film is formed for the prevention of the diffusion of tungsten which is the conductor plug material. The barrier metal films formed in the respective contact holes which will be described later are formed for the same purpose.

Conductor plugs 54a, 54b of tungsten are buried respectively in the contact holes 50a, 50b with the barrier metal film formed in.

On the silicon oxide film 48 and in the contact hole 52a, an interconnection 56a is formed, electrically connected to the conductor plug 54a and the upper electrode 40. On the silicon oxide film 48 and in the contact hole 52b, an interconnection 56b is formed, electrically connected to the lower electrode 36. On the silicon oxide film 48, an interconnection 56c is formed, electrically connected to the conductor plug 54b. The interconnections 56a, 56b, 56c (a first metal interconnection layer 56) are formed of the layered film of, e.g., a 150 nm-thickness TiN film, a 550 nm-thickness AlCu alloy film, a 5 nm-thickness Ti film and a 150 nm-thickness TiN film sequentially laid the latter on the former.

Thus, a 1T1C-type memory cell including one transistor 24 and one ferroelectric capacitor 42 having the source/drain diffused layer 22 of the transistor 24 and the upper electrode 40 of the ferroelectric capacitor 42 electrically connected via the conductor plug 54a and the interconnection 56a is formed. Actually, a plurality of memory cells are laid out in the memory cell region of the FeRAM chip.

On the silicon oxide film 48 with the interconnections 56a, 56b, 56c formed on, a barrier film 58 is formed, covering the upper surfaces and the side surfaces of the interconnections 56a, 56b, 56c. The barrier film 58 is an aluminum oxide film of, e.g. a 20 nm-thickness.

The barrier film 58 has the function of preventing the diffusion of hydrogen and water, as do the barrier films 44, 46. The barrier film 58 is used for the purpose of suppressing the damage with plasma as well.

A silicon oxide film 60 of, e.g., a 2600 nm-thickness is formed on the barrier film 58. The surface of the silicon oxide film 60 is planarized. The planarized silicon oxide film 60 remains in, e.g., a 1000 nm-thickness on the interconnections 56a, 56b, 56c.

A silicon oxide film 61 of, e.g., a 100 nm-thickness is formed on the silicon oxide film 60. The silicon oxide film 61, which is formed on the planarized silicon oxide film 60, is flat.

A barrier film 62 is formed on the silicon oxide film 61. The barrier film 62 is an aluminum oxide film of, e.g., a 20-70 nm-thickness. The barrier film 62 is a 50 nm-thickness aluminum oxide film here. The barrier film 62, which is formed on the flat silicon oxide film 61, is flat.

The barrier film 62 has the function of preventing the diffusion of hydrogen and water, as do the barrier films 44, 46, 58. Furthermore, the barrier film 62, which is formed on the flat silicon oxide film 61, is flat and is formed with very good coverage in comparison with the barrier films 44, 46, 58. Accordingly, such flat barrier film 62 can more surely prevent the diffusion of hydrogen and water. Actually, the barrier film 62 is formed not only over the FeRAM cell region 306, where a plurality of the memory cells including the ferroelectric capacitors 42 are laid out, and also over the FeRAM chip region 302 and the scribe region 304, and further over the neighboring FeRAM chip regions 302. This will be described later.

A silicon oxide film 64 of, e.g., a 50-100 nm-thickness is formed on the barrier film 62. The film thickness of the silicon oxide film 64 is set at 100 nm here. The silicon oxide film 64 functions as the stopper film for etching to form interconnections 72a, 72b which will be described later. The silicon oxide film 64 protects the barrier film 62 to prevent the decrease of the film thickness of the barrier film 62 and the removal of the barrier film 62 by the etching for forming the interconnections 72a, 72b. Thus, the barrier film 62 can be prevented from deteriorating the function of preventing the diffusion of hydrogen and water.

Thus, an inter-layer insulation film 66 is formed of the barrier film 58, the silicon oxide film 60, the silicon oxide film 61, the barrier film 62 and the silicon oxide film 64.

In the inter-layer insulation film 66, a contact hole 68 is formed down to the interconnection 56c.

In the contact hole 68, a barrier metal film (not illustrated) of a Ti film of, e.g., a 20 nm-thickness and a TiN film of, e.g., a 50 nm-thickness sequentially laid the latter on the former is formed. The barrier metal film may be formed of the TiN film alone without forming the Ti film.

In the contact hole 68 with the barrier metal film formed in, a conductor plug 70 of tungsten is buried.

The interconnection 72a is formed on the inter-layer insulation film 66. On the inter-layer insulation film, the interconnection 72b is formed, electrically connected to the conductor plug 70. The interconnections 72a, 72b (a second metal interconnection layer 72) is formed, for example, of a 50 nm-thickness TiN film, a 500 nm-thickness AlCu alloy film, a 5 nm-thickness Ti film, and a 150 nm-thickness TiN film sequentially laid the latter on the former. The TiN film below the AlCu alloy film may not be formed.

A silicon oxide film 74 of, e.g., a 2200 nm-thickness is formed on the inter-layer insulation film 66 and the interconnections 72a, 72b. The surface of the silicon oxide film 74 is planarized.

On the silicon oxide film 74, a silicon oxide film 76 of, e.g., a 100 nm-thickness is formed. The silicon oxide film 76, which is formed on the planarized silicon oxide film 74, is flat.

A barrier film 78 is formed on the silicon oxide film 76. The barrier film 78 is an aluminum oxide film of, e.g., a 20-100 nm-thickness. The barrier film 78 is a 50 nm-thickness aluminum oxide film here. The barrier film 78, which is formed on the flat silicon oxide film 76, is flat.

The barrier film 78 has the function of preventing the diffusion of hydrogen and water, as do the barrier films 44, 46, 58, 62. Furthermore, the barrier film 78, which is formed on the flat silicon oxide film 76, is flat, and has very good coverage in comparison with the barrier films 44, 46, 58, as does the barrier film 78. Accordingly, such flat barrier film 78 can more surely prevent the diffusion of hydrogen and water. Actually, as is the barrier film 78, the barrier film 78 is formed not only over the FeRAM cell region 306, where a plurality of the memory cells including the ferroelectric capacitors 42 are laid out, and also over the FeRAM chip region 302 and the scribe region 304, and further over the neighboring FeRAM chip regions 302. This will be described later.

A silicon oxide film 80 of, e.g., a 50-100 nm-thickness is formed on the barrier film 78. The film thickness of the silicon oxide film 80 is set at 100 nm here. The silicon oxide film 80 functions as the stopper film for etching interconnections 88a, 88b which will be described later. The silicon oxide film 80 protects the barrier film 78 to thereby prevent the decrease of the film thickness of the barrier film 78 and the removal of the barrier film 78 by the etching for forming the interconnections 88a, 88b. Thus, the barrier film 78 is prevented from deteriorating the function of preventing the diffusion of hydrogen and water.

Thus, an inter-layer insulation film 82 is formed of the silicon oxide film 74, the silicon oxide film 76, the barrier film 78 and the silicon oxide film 80.

In the inter-layer insulation film 82, contact holes 84a, 84b are formed respectively down to the interconnections 72a, 72b.

In the contact holes 84a, 84b, a barrier metal film (not illustrated) of a Ti film of, e.g., a 20 nm-thickness and a TiN film of, e.g., 50 nm-thickness sequentially laid the latter on the former is formed. The barrier metal film may be formed of the TiN film alone without forming the Ti film.

Conductor plugs 86a, 86b are buried respectively in the contact holes 84a, 84b with the barrier metal film formed in.

On the inter-layer insulation film 82 with the conductor plugs 86a, 86b buried in, the interconnection 88a electrically connected to the conductor plug 86a and the interconnection (bonding pad) 88b electrically connected to the conductor plug 86b are formed. The interconnections 88a, 88b (a third metal interconnection layer 88) are formed of the layered film of, e.g., a 50 nm-thickness TiN film, a 500 nm-thickness AlCu alloy film and a 150 nm-thickness TiN film sequentially laid the latter on the former. The TiN film below the AlCu alloy film may not be formed.

On the inter-layer insulation film 82 and on the interconnections 88a, 88b, a silicon oxide film 90 of, e.g. a 100-300 nm-thickness is formed. The film thickness of the silicon oxide film 90 is set at 100 nm here.

On the silicon oxide film 90, a silicon nitride film 92 of, e.g., a 350 nm-thickness is formed.

Thus, on the inter-layer insulation film 82 and on the interconnections 88a, 88b, a layered film 93 of the silicon oxide film 90 and the silicon nitride film 92 sequentially laid the latter on the former is formed.

On the silicon nitride film 92, a polyimide resin film 94 of, e.g., 2-6 μm-thickness is formed.

In the polyimide resin film 94, the silicon nitride film 92 and the silicon oxide film 90, an opening 96 is formed down to the interconnection (bonding pad) 88b. That is, in the silicon nitride film 92 and the silicon oxide film 90, an opening 96a is formed. In the polyimide resin film 94, an opening 96b is formed in the region containing the opening 96a formed in the silicon nitride film 92 and the silicon oxide film 90.

An outside circuit (not illustrated) is electrically connected to the interconnection (bonding pad) 88b through the opening 96.

Here, the barrier films 62, 78 of the semiconductor device according to the present embodiment will be detailed with reference to FIGS. 4 to 6. FIG. 4 is a sectional view of the semiconductor device according to the present embodiment, which illustrates the structure corresponding to the area constitution of FIG. 2A. FIGS. 5 and 6 are plan views illustrating the area where the barrier films 62, 78 are formed in the semiconductor device according to the present embodiment.

In FIG. 4, the transistors 24 are formed on the semiconductor substrate 10 in the FeRAM cell region 306 and the logic circuit region 310.

On the entire surface of the semiconductor substrate 10 with the transistors 24 formed on, an inter-layer insulation film 27 is formed.

On the inter-layer insulation film 27 in the FeRAM cell region 306, the ferroelectric capacitors 42 are formed.

On the entire surface of the inter-layer insulation film 27 with the ferroelectric capacitors 42 formed on, the inter-layer insulation film 49 is formed.

On the inter-layer insulation film 49 in the FeRAM cell region 306, the logic circuit region 310 and the pad regions 314, the first metal interconnection layer 56 is formed. The first metal interconnection layer 56 in the FeRAM cell region 306 is electrically connected suitably to the upper electrodes 40 or the lower electrodes 36 of the ferroelectric capacitors 42, or the transistors 24 via the conductor plugs. The first metal interconnection layer 56 in the logic circuit region 310 is electrically connected suitably to the transistors 24 via the conductor plugs.

The inter-layer insulation film 66 is formed on the entire surface of the inter-layer insulation film 49 with the first metal interconnection layer 56 formed on.

As illustrated in FIGS. 4 and 5, the barrier film 62 constituting the inter-layer insulation film 66 is formed over the FeRAM chip region 302 and the scribe regions 304 and even over the neighboring FeRAM chip regions 302. That is, the barrier film 62 is formed over the scribe regions 304, the FeRAM cell region 306, the peripheral circuit region 308 for FeRAM, the logic circuit region 310, the peripheral circuit region 312 for logic circuit, the pad regions 314, the scribe region-pad region interfaces 316, the pad region-circuit region interfaces 318, and the circuit region-circuit region interface 320.

On the inter-layer insulation film 66 in the FeRAM cell region 306, the logic circuit region 310 and the pad regions 314, the second metal interconnection layer 72 is formed. The second metal interconnection layer 72 is electrically connected suitably to the first metal interconnection layer 56 via the conductor plugs.

On the entire surface of the inter-layer insulation film 66 with the second metal interconnection layer 72 formed on, the inter-layer insulation film 82 is formed.

As illustrated in FIGS. 4 and 6, the barrier film 78 constituting the inter-layer insulation film 82 is formed over the FeRAM chip region 302 and the scribe regions 304 and also over the neighboring FeRAM chip regions 302. That is, the barrier film 78 is formed over the scribe regions 304, the FeRAM cell region 306, the peripheral circuit region 308 for FeRAM, the logic circuit region 310, the peripheral circuit region 312 for logic circuit, the pad regions 314, the scribe region-pad region interfaces 316, the pad region-circuit region interfaces 318, and the circuit region-circuit region interface 320.

On the inter-layer insulation film 82 in the FeRAM cell region 306, the logic circuit region 310 and the pad regions 314, the third metal interconnection layer 88 is formed. The third metal interconnection layer 88 in the pad regions 314 is the bonding pads 88b. The third metal interconnection layer 88 is electrically connected suitably to the second metal interconnection layer 72 via the conductor plugs.

On the inter-layer insulation film 82 with the third metal interconnection layer 88 formed on, the layered film 93 is formed.

The polyimide resin film 94 is formed on the layered film 93.

In the layered film 93 and the polyimide resin film 94 in the pad regions 314, the openings 96 are formed down to the bonding pads 88.

In the inter-layer insulation films 27, 49, 66, 82, 93 in the scribe region-pad region interfaces 316, a moisture-resistance ring 322 for suppressing the influence of moisture on the FeRAM chips is formed. The moisture-resistance ring 322 is formed of the same metal layer, etc. as the metal interconnection layers and the conductor plugs formed in the inter-layer insulation films 27, 49, 66, 82, 93. The moisture-resistance ring 322 is formed not to short-circuit with the interconnections in the FeRAM chip region 302, etc.

Thus, the semiconductor device according to the present embodiment is constituted.

The semiconductor device according to the present embodiment is characterized mainly in that as the barrier films for preventing the diffusion of hydrogen and water, the flat barrier film 62 formed between the first metal interconnection layer 56 (the interconnections 56a, 56b, 56c) and the second metal interconnection layer 72 (the interconnections 72a, 72b) formed above the ferroelectric capacitor 42, and the flat barrier film 78 formed between the second metal interconnection layer 72 (the interconnections 72a, 72b) and the third metal interconnection layer 88 (the interconnections 88a, 88b) are provided in addition to the barrier films 44, 46, 58.

In the semiconductor device including a ferroelectric capacitor, it is an idea to form a barrier film of aluminum oxide or others for preventing the diffusion of hydrogen and water above the ferroelectric capacitor as effective means for preventing the deterioration of the electric characteristics of the ferroelectric capacitor due to hydrogen and water.

When a barrier film is formed on a base, such as an inter-layer insulation film or others, having the surface stepped or sloped, the barrier film does not have good coverage, and cannot sufficiently prevent the diffusion of hydrogen and water. When hydrogen and water arrive at the ferroelectric film of the ferroelectric capacitor, the ferroelectricity of the ferroelectric film is decreased or lost due to the hydrogen and water, and the electric characteristics of the ferroelectric capacitor are deteriorated.

Disadvantages caused when a barrier film is formed on a base, such as an inter-layer insulation film or others, having the surface stepped or sloped will be detailed with reference to FIGS. 7 to 16A-16B.

When a coated insulation film, such as an organic insulation film, SOG (Spin On Glass) film or others as in, e.g., Patent Reference 1 is formed on the surface having concavities and convexities due to an interconnection layer, a ferroelectric capacitor, etc., it is difficult to sufficiently flatten the surface of the coated insulation film. Accordingly, steps and slopes take place in the surface of the coated insulation film.

Figure 7:
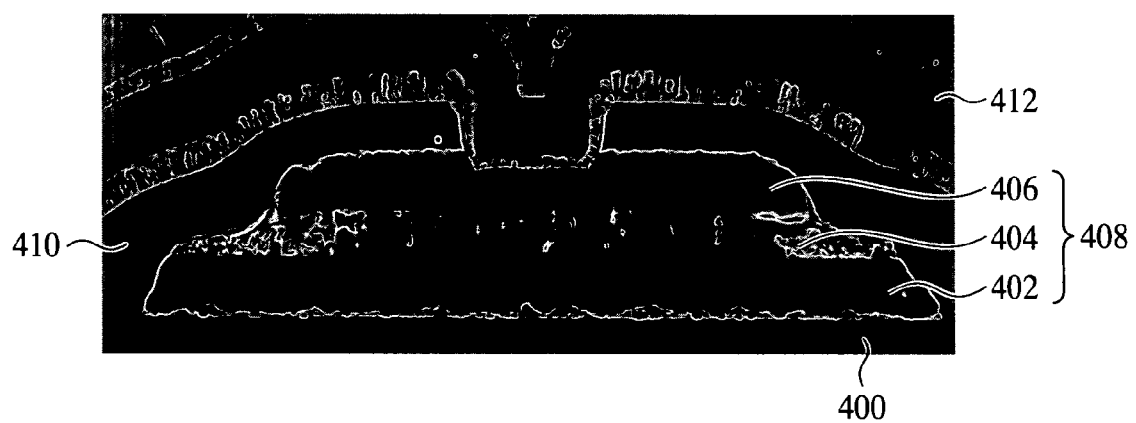
FIG. 7 is a transmission electron microscopic picture showing the result of the sectional observation of the SOG film burying the ferroelectric capacitor.

FIG. 7 is a transmission electron microscopic picture of the result of the sectional observation of an SOG film a ferroelectric capacitor is buried in. In the transmission electron microscopic picture of FIG. 7, a ferroelectric capacitor 408 including a lower electrode 402, a ferroelectric film 404 and an upper electrode 406 is formed on an inter-layer insulation film 400. The ferroelectric capacitor 408 is buried with the SOG film 410. On the SOG film 410, an interconnection 412 is formed, electrically connected to the upper electrode 406.

As evident in the transmission electron microscopic picture of FIG. 7, the surface of the SOG film 140 is not flat and has blunt steps.

When a barrier film of aluminum oxide film or others is formed on the base having such steps and slopes in the surface, the film thickness of the barrier film becomes ununiform.

Figure 8:
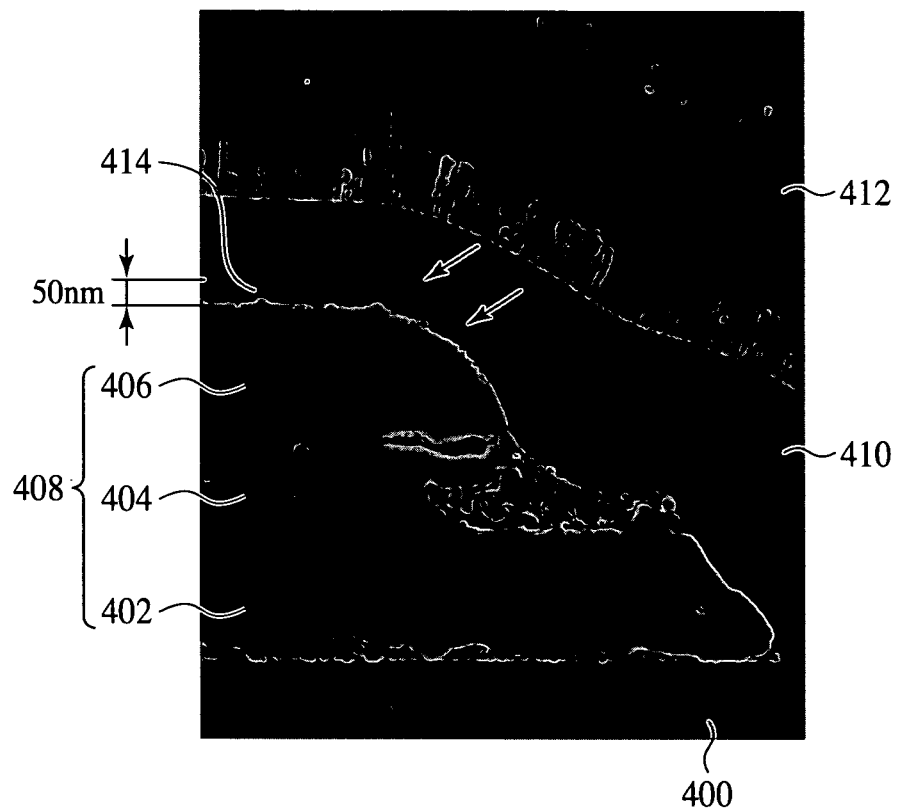
FIG. 8 is a transmission electron microscopic picture showing the result of the sectional observation of the aluminum oxide film formed on the step due to the ferroelectric capacitor.

For example, FIG. 8 is a transmission electron microscopic picture of the result of the sectional observation of an aluminum oxide film formed on a step formed due to a ferroelectric capacitor.

As evident in the transmission electron microscopic picture of FIG. 8, a 50 nm-thickness aluminum oxide film 424 is formed substantially uniform on the substantially horizontal surface of the upper electrode 406. On the sloped surface of the end of the upper electrode 406, however, in the section sandwiched by the arrows in the picture, the aluminum oxide film 424 decreases the film thickness downward along the sloped surface.

As described above, when a barrier film is formed on a coated insulation film, such as an organic insulation film or SOG film or others as in, e.g., Patent Reference 1, the decrease of the film thickness of the barrier film takes place. In such case, the following disadvantages take place.

FIGS. 9A-9D and 10A-10D are sectional views of a barrier film formed on a coated insulation film in the fabrication steps, which illustrate a disadvantage.

Figure 9A:
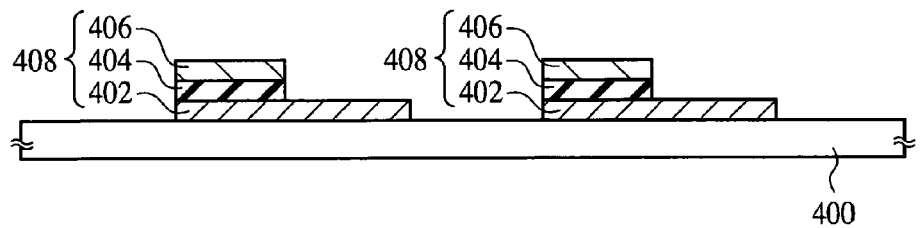
FIGS. 9A-9D are sectional views of the barrier film formed on a coated insulation film in the steps of forming the barrier film on the coated insulation film, which illustrate a disadvantage caused thereby (Part 1).

First, ferroelectric capacitors 408 each including a lower electrode 402, a ferroelectric film 404 and an upper electrode 406 are formed on an inter-layer insulation film 400 (see FIG. 9A).

Figure 9B:
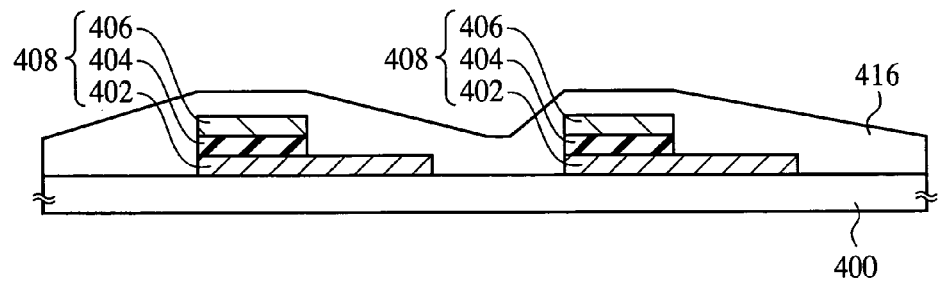

Next, on the inter-layer insulation film 400 with the ferroelectric capacitors 408 formed on, an inter-layer insulation film 416 of a coated insulation film, such as an organic insulation film, SOG film or others, is formed (see FIG. 9B). The surface of the inter-layer insulation film 416 is not sufficiently flat, and steps and slopes are formed in the surface of the inter-layer insulation film 416.

Figure 9C:
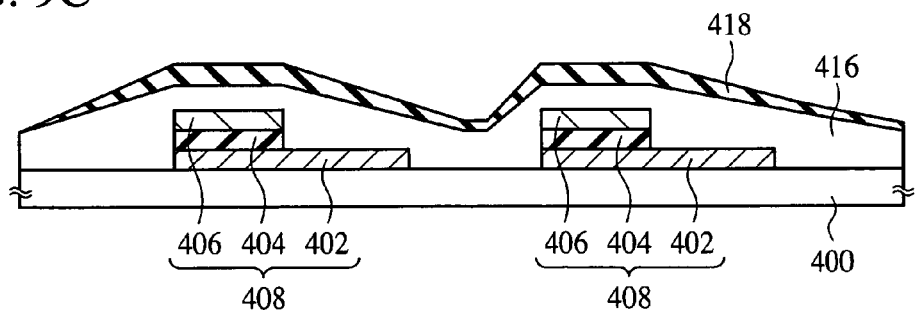

Then, on the inter-layer insulation film 416, a barrier film 418 of aluminum oxide film, titanium oxide film or others is formed (see FIG. 9C). When the barrier film 418 is formed by a process other than MOCVD, the barrier film 418 has the film thickness decreased on the sloped surfaces than on the horizontal surfaces.

Figure 9D:
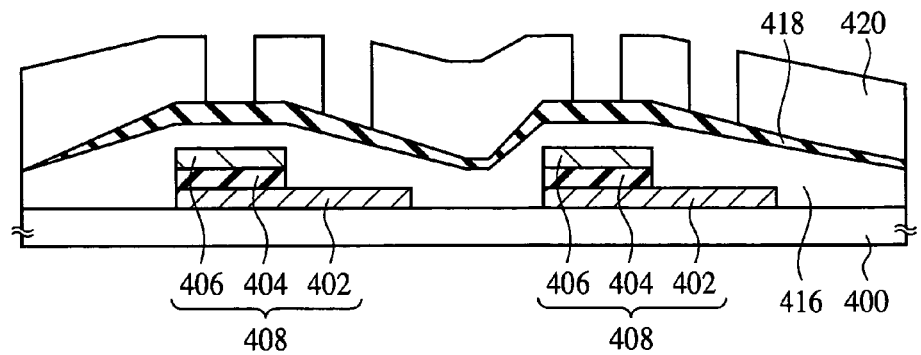

Then, by photolithography, a photoresist film 420 exposing regions for contact holes to be formed down to the upper electrodes 406 and the lower electrodes 402 and covering the rest region is formed (see FIG. 9D).

Next, with the photoresist film 420 as the mask, the barrier film 418 and the inter-layer insulation film 416 are etched. Thus, in the barrier film 418 and the inter-layer insulation film 416, contact holes 422a and contact holes 422b are formed respectively down to the upper electrodes 406 and down to the lower electrodes 402 (see FIG. 10A).

Figure 10A:
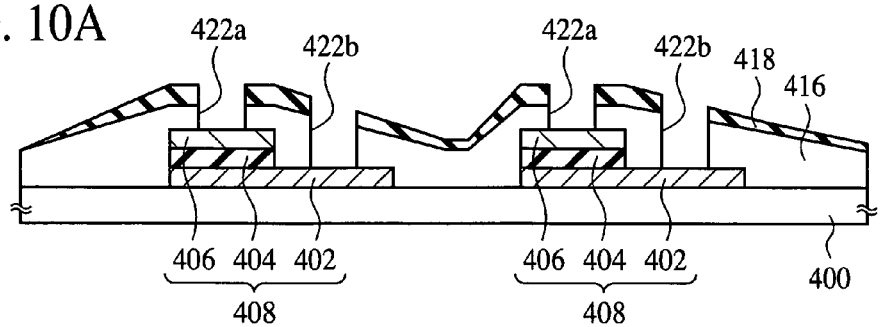
FIGS. 10A-10D are sectional views of the barrier film formed on the coated insulation film in the steps of forming the barrier film on the coated insulation film, which illustrate the disadvantage caused thereby (Part 2).
Figure 10B:
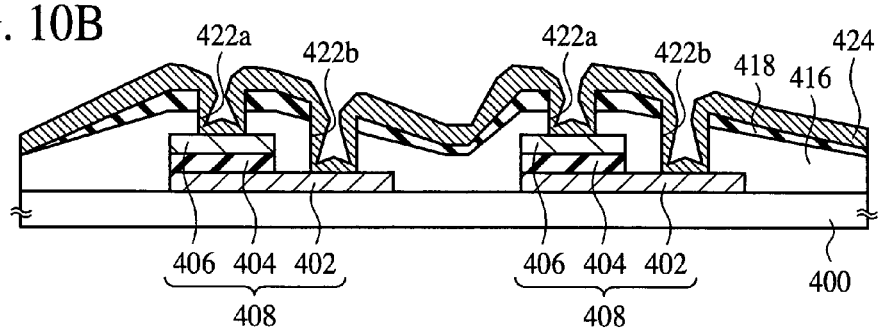

Then, a metal film 424 for forming interconnections is formed on the entire surface (see FIG. 10B).

Figure 10C:
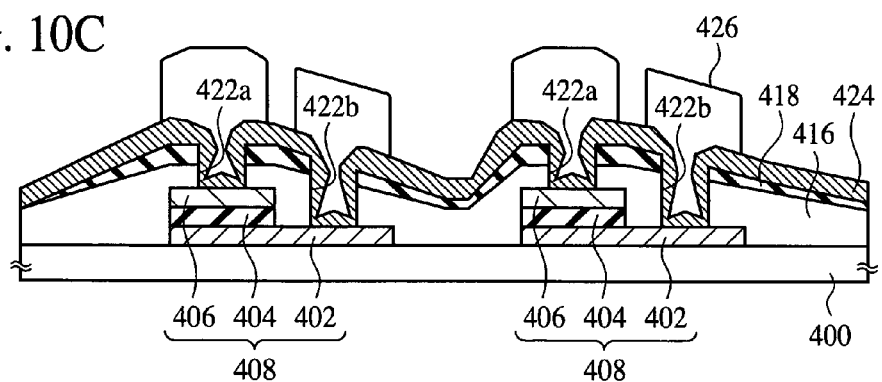
Figure 10D:
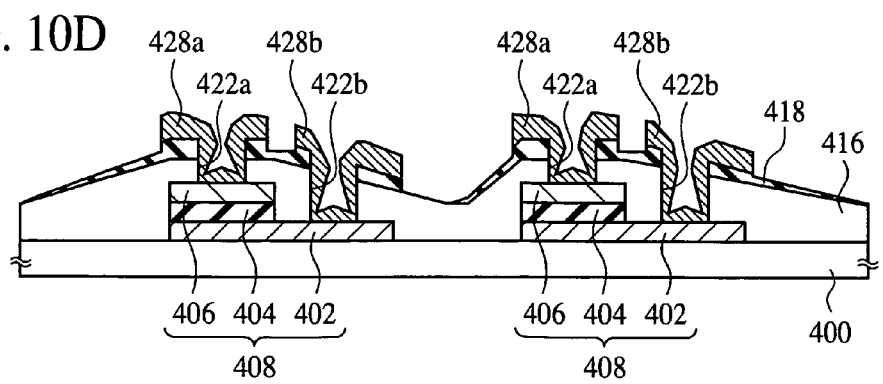

Then, by photolithography, a photoresist film 426 covering the regions where the interconnections to be connected to the upper electrodes 406 and the lower electrodes 402 are to be formed and exposing the rest region is formed (see FIG. 10C).

Next, with the photoresist film 426 as the mask, the metal film 424 is etched. Thus, the interconnections 428a and the interconnections 428b of the metal film 424 connected respectively to the upper electrodes 406 and to the lower electrodes 402 are formed (see FIG. 10D).

When the metal film 424 is etched to form the interconnections 428a, 428b, the barrier film 418 is used as the stopper film for the etching. The barrier film 418 is accordingly etched and decreases the film thickness. At this time, when the barrier film 418 has an ununiform film thickness due to steps and slopes of the base, the barrier film much decreases the film thickness by the etching at the thin parts and is often removed. Resultantly, the barrier film 418 cannot sufficiently make the function of preventing the diffusion of hydrogen and water.

For example, when the film thickness of the barrier film is set at 100 nm, on the horizontal surfaces, a 50 nm-thickness is removed by the etching, and the film thickness of the barrier film is decreased to 50 nm, and on the sloped surfaces, the defect due to the removal of barrier film by the etching takes place. When the film thickness of the barrier film is set at 200 nm, on the horizontal surfaces, a 50 nm-thickness is removed, and the film thickness of the barrier film is decreased to 150 nm, but on the sloped surfaces, the film thickness is decreased to 0-50 nm by the etching, and the defect due to the removal of the barrier film locally takes place.

In addition to the above-described disadvantage, when a barrier film is formed on a coated insulation film, such as an organic insulation film, SOG film or others as in, e.g., Patent reference 1, the following disadvantage takes place.

FIGS. 11A-11D to 14 are sectional views of a barrier film formed on a coated insulation film in the fabrication steps, which illustrate another disadvantage. FIGS. 11A-11D and 12 illustrate the case that a 50 nm-thickness barrier film is formed. FIGS. 13A-13D and 14 illustrate the case that a 100 nm-thickness barrier film is formed.

The case that a 50 nm-thickness barrier film is formed will be explained with reference to FIGS. 11A-11D and 12.

Figure 11A:
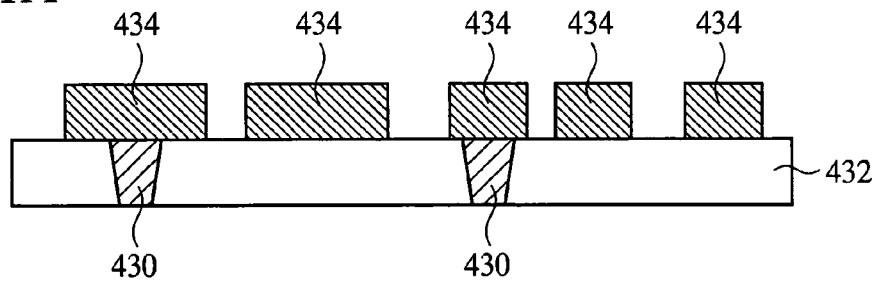
FIGS. 11A-11D are sectional views of the barrier film formed on the coated insulation film in the steps of forming the barrier film on the coated insulation film, which illustrate another disadvantage caused thereby (Part 1).

First, interconnections 434 are formed on an inter-layer insulation film 432 with conductor plugs 430 buried in (see FIG. 11A).

Figure 11B:
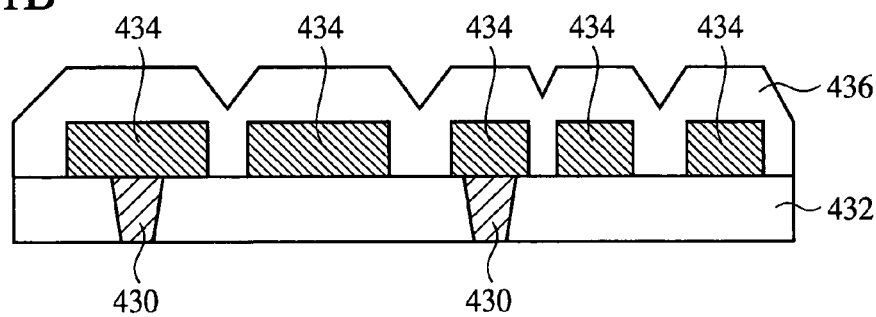

Then, on the inter-layer insulation film 432 with the interconnections 434 formed on, an inter-layer insulation film 436 of a coated insulation film of an organic insulation film, SOG film or others is formed (see FIG. 11B). The surface of the inter-layer insulation film 436 is not sufficiently flat and has steps and slopes.

Figure 11C:
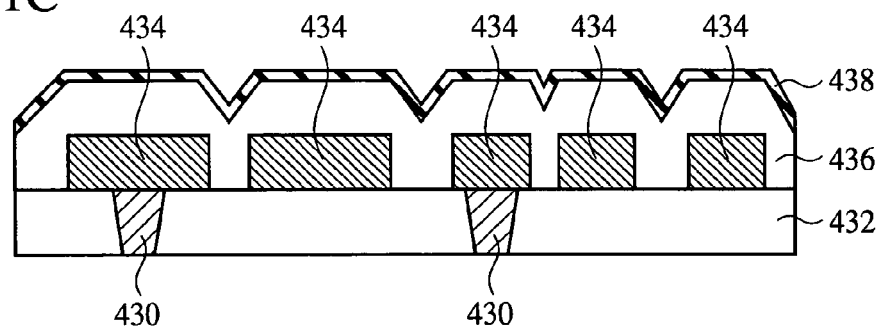

Next, on the inter-layer insulation film 436, a 50 nm-thickness barrier film 438 is formed (see FIG. 11C).

Figure 11D:
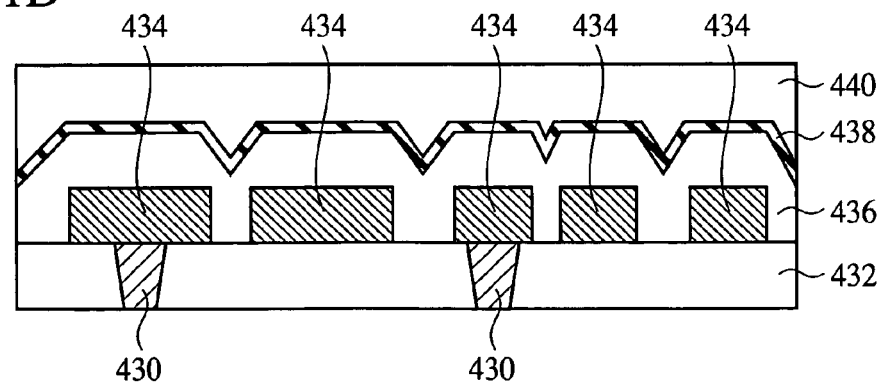

Next, an inter-layer insulation film 440 is formed on the barrier film 438 (see FIG. 11D).

Figure 12:
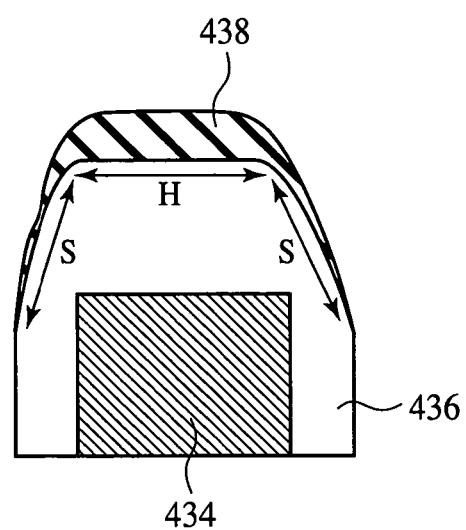
FIG. 12 is a sectional view of the barrier film on the coated insulation film in the steps of forming the barrier film on the coated insulation film, which illustrates said another disadvantage caused thereby (Part 2).

FIG. 12 is an enlarged sectional view of the barrier film 438 illustrated in FIG. 11C. As illustrated, on the horizontal surface H of the inter-layer insulation film 436, the film thickness of the barrier film 438 is 50 nm, and on the sloped surfaces S of the inter-layer insulation film 436, the film thickness of the barrier film 438 is actually 20 nm or below 20 nm. When the barrier film 438 is thus formed in a 50 nm-thickness, the barrier film 438 does not have good coverage and is locally thin. Accordingly, the barrier film 438 cannot sufficiently make the function of preventing the diffusion of hydrogen and water.

Next, the case that a 100 nm-thickness barrier film is formed will be explained with reference to FIGS. 13A-13D and 14.

Figure 13A:
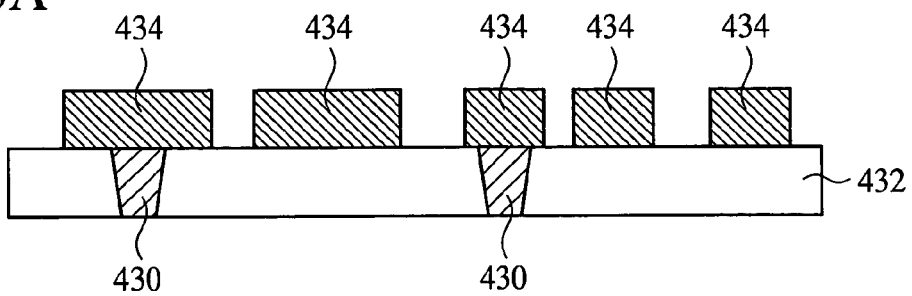
FIGS. 13A-13D are sectional views of the barrier film formed on the coated insulation film in the steps of forming the barrier film on the coated insulation film, which illustrate said another disadvantage caused thereby (Part 3).

First, interconnections 434 are formed on an inter-layer insulation film 432 with conductor plugs 430 buried in (see FIG. 13A).

Figure 13B:
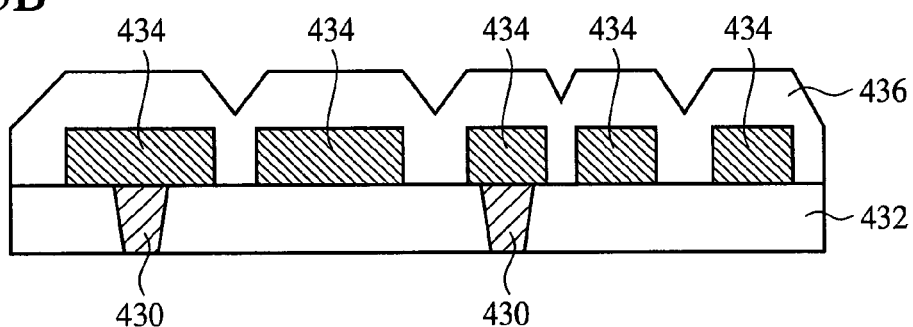

Then, on the inter-layer insulation film 432 with the interconnections 434 buried in, an inter-layer insulation film 436 of an organic insulation film, SOG film or others is formed (see FIG. 13B). The surface of the inter-layer insulation film 436 is not sufficiently flat and has steps and slopes.

Figure 13C:
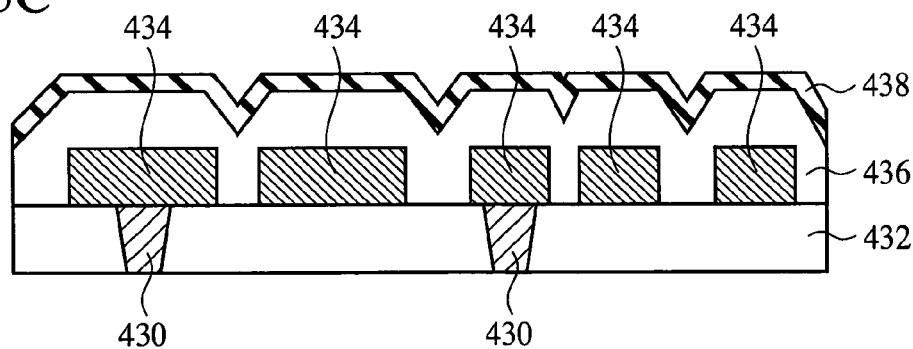

Then, a 100 nm-thickness barrier film 438 is formed on the inter-layer insulation film 436 (see FIG. 13C).

Figure 13D:
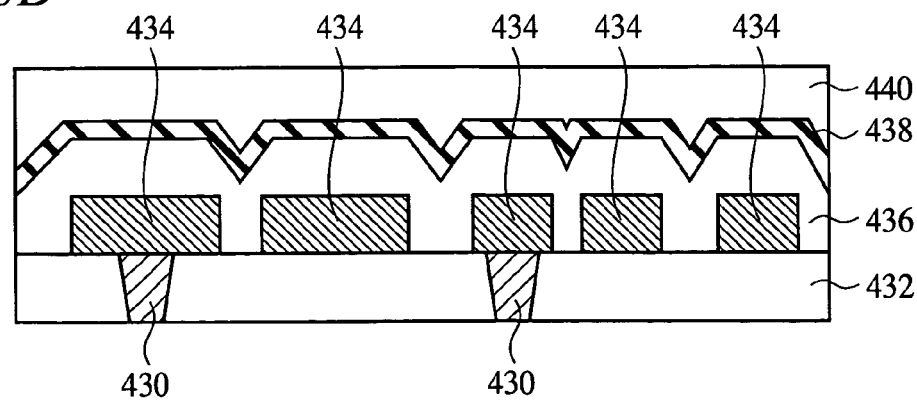

Next, an inter-layer insulation film 440 is formed on the barrier film 438 (see FIG. 13D).

Figure 14:
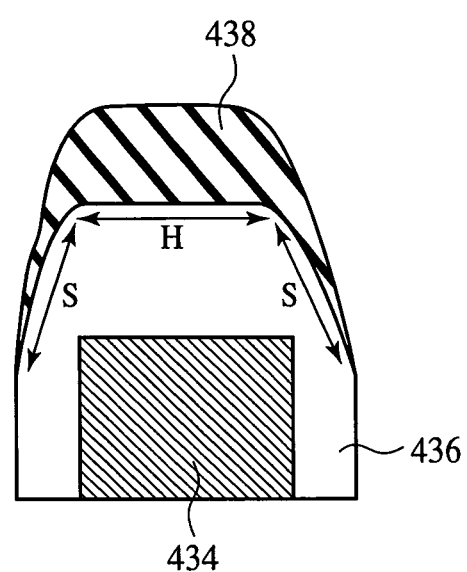
FIG. 14 is a sectional view of the barrier film formed on the coated insulation film in the steps of forming the barrier film on the coated insulation film, which illustrates said another disadvantage (Part 4).

FIG. 14 is an enlarged sectional view of the barrier film 438 illustrated in FIG. 13C. As illustrated, the film thickness of the barrier film 438 is 100 nm on the horizontal surface H of the inter-layer insulation film 436. The film thickness of the barrier film 438 on most parts of the sloped surfaces S of the inter-layer insulation film 436 is actually 20-50 nm. The film thickness of the barrier film 438 at the most steep parts of the sloped surfaces S is below 20 nm including 20 nm.

Thus, the 100 nm-thickness barrier film 438 has good coverage in comparison with the 50 nm-thickness barrier film. However, the barrier film 438 still has the parts where the film thickness is below 20 nm including 20 nm. Accordingly, the barrier film 438 cannot sufficiently make the function of preventing the diffusion of hydrogen and water.

As described above, when the film thickness of the barrier film is set at 100 nm, the film thickness on the horizontal surface is 100 nm, but on the sloped surfaces, the defect that the barrier film is not formed takes place. When the film thickness of the barrier film is set at 200 nm, the film thickness on the horizontal surface is 200 nm, and on the sloped surfaces, the film thickness is 50-100 nm.

Figure 15A:
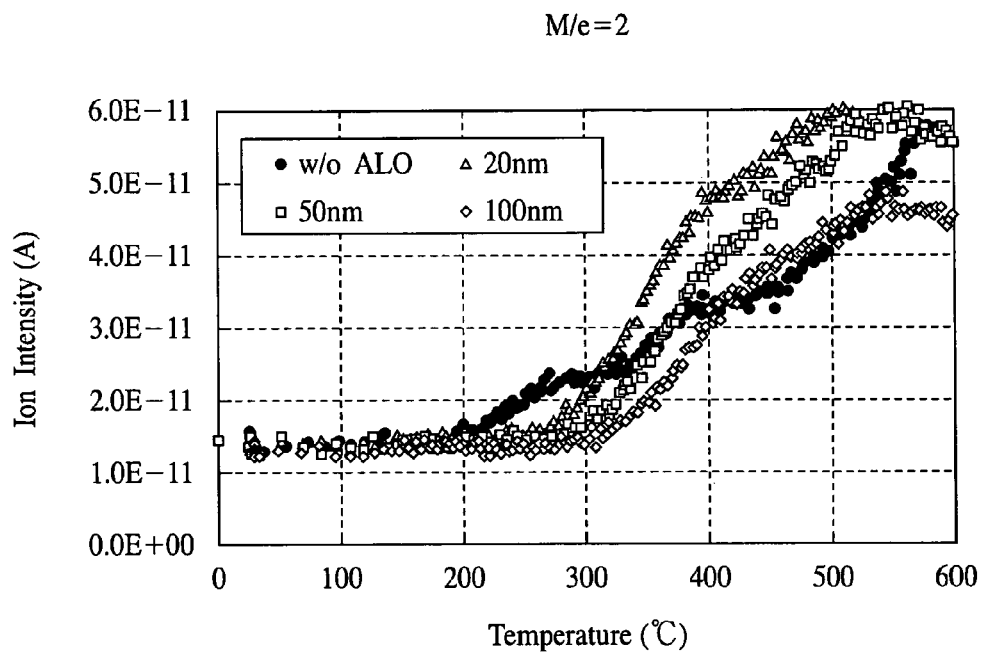
FIGS. 15A-15B are graphs of the result of the evaluation of the barrier film by the thermal desorption spectroscopy.
Figure 15B:
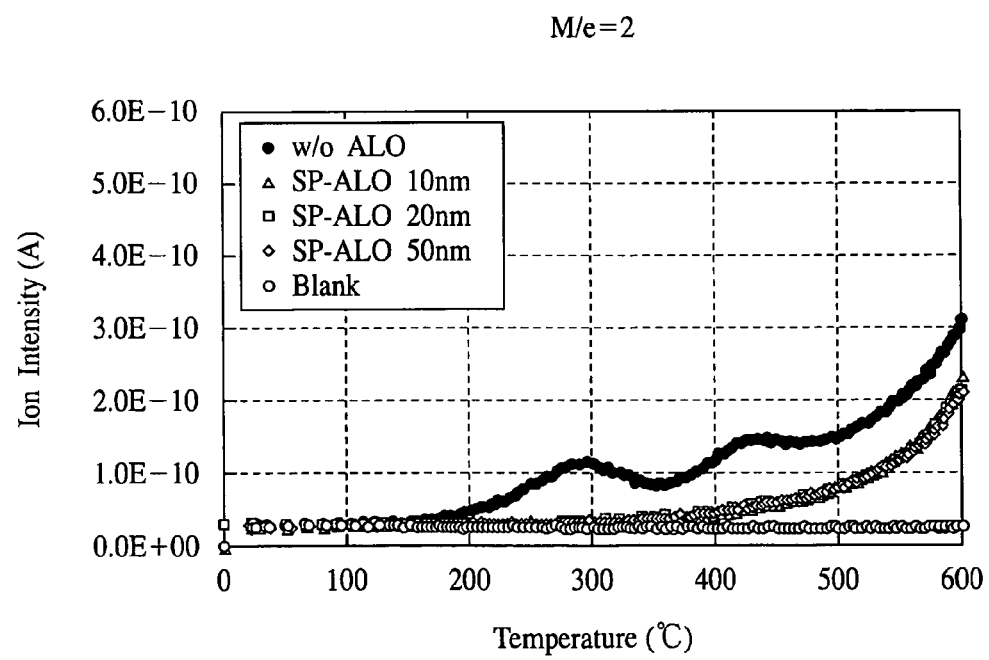

The result of the comparison between the case that a barrier film is formed on a base having blunt steps in the surface and the case that a barrier film is formed on a base having the flat surface will be explained with reference to FIGS. 15A-15B. FIGS. 15A-15B are graphs of the results of evaluating the barrier films by TDS (Thermal Desorption Spectroscopy). In FIGS. 15A-15B, the substrate temperatures are taken on the horizontal axis, and on the vertical axis, the eduction quantities of hydrogen ions from the samples are taken. The different order between the vertical axis in FIG. 15A and the vertical axis in FIG. 15B is for the area sizes of the samples the TDS analysis was made.

FIG. 15A shows the case that the barrier film is formed on the base having blunt steps present in the surface. The sample includes an SOG film formed by application on a silicon substrate and the barrier film of aluminum oxide film formed on the entire surface by sputtering. In FIG. 15A, the ● marks indicate the case that the aluminum oxide film is absent. The Δ marks indicate the case that the aluminum oxide film has a 20 nm-thickness. The □ marks indicate the case that the aluminum oxide film has a 50 nm-thickness. The ◇ marks indicate the case that the aluminum oxide film has a 100 nm-thickness.

FIG. 15B shows the case that the barrier film is formed on the base having the flat surface, as are the barrier films 62, 78 of the semiconductor device according to the present embodiment. The sample includes a silicon oxide film formed on a silicon substrate by plasma TEOS CVD, and the barrier film of aluminum oxide film formed on the entire surface by sputtering. In FIG. 15B, the ● marks indicate the case that the aluminum oxide film is absent. The Δ marks indicate the case that the aluminum oxide film has a 10 nm-thickness. The □ marks indicate the case that the aluminum oxide film has a 20 nm-thickness. The ◇ marks indicate the case that the aluminum oxide film has a 50 nm-thickness. The ○ marks indicate the case that the sample includes the silicon substrate alone.

As evident in FIG. 15A, it is found that in the case that the barrier film is formed on the base having blunt steps in the surface, sufficient barrier to hydrogen cannot be given, and the barrier film cannot sufficiently prevent the diffusion of hydrogen.

In contrast to this, as evident in FIG. 15B, it is found that the eduction quantity of hydrogen ions in all the cases that the barrier film has a 10 nm-thickness, a 20 nm-thickness and a 50 nm-thickness is much smaller than that of the case that the barrier film is absent. Based on this, it can be said that in the case that the barrier film is formed on the base having the flat surface as in the semiconductor device according to the present embodiment, sufficient barrier to hydrogen can be given, and the barrier film can sufficiently prevent the diffusion of hydrogen.

The barrier to water is basically interlocked with the barrier to hydrogen, and when the barrier to hydrogen cannot be given, the barrier to water cannot be given either. Although not shown, the result of the evaluation of the barrier to water made by TDS was the same as the result of the evaluation of the barrier to hydrogen described above. In terms of the size of the substance, hydrogen is a smaller substance than water, and it can be said that to give sufficient barrier to both of hydrogen and water, it is necessary to form the barrier film on the base having the sufficiently flat surface.

In the case that the barrier film is formed on the base with steps and slopes formed in the surface, in order to make sufficient the barrier to hydrogen and water, it is an idea to form the barrier film in a relatively large thickness. However, forming the barrier film in a relatively large thickness of above 100 nm including 100 nm causes the disadvantage that the etching for forming contact holes becomes difficult. The disadvantage caused by forming the barrier film in a relatively large thickness will be explained with reference to FIGS. 16A-16B.

Figure 16A:
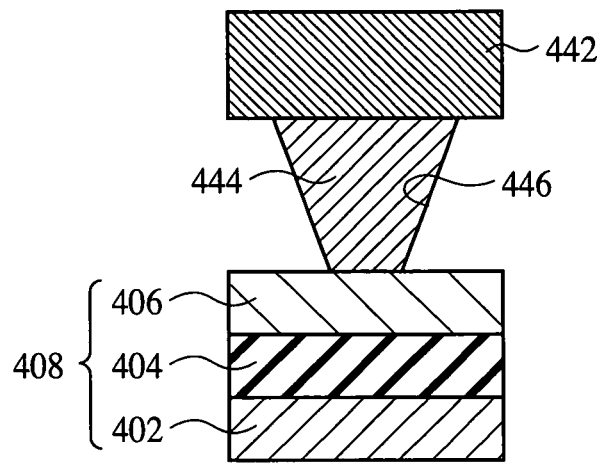
FIGS. 16A-16B are views illustrating a disadvantage taking place in forming the barrier film relatively thick.

As illustrated in FIG. 16A, in forming a conductor plug 444 interconnecting the upper electrode 406 of a ferroelectric capacitor 408 and an Al interconnection 442 with each other, the barrier film is formed in the inter-layer insulation film between the upper electrode 406 and the Al interconnection 442. At this time, when the film thickness of the barrier film is relatively large, the contact hole 446 for the conductor plug 44 to be buried is etched to make the width of the bottom of the contact hole 446 small, and the contact resistance is increased or defective contact takes place.

Figure 16B:
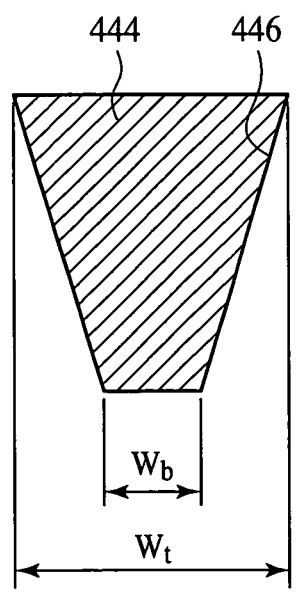

FIG. 16B is a sectional view illustrating the contact hole 446 with the conductor plug 444 buried in. The width of the top of the contact hole 446, which is to be on the side of the Al interconnection 442, is $W_t$, the width of the bottom of the contact hole 446, where the upper electrode 406 is exposed, is $W_b$, and the difference $W_t-W_b$ between both denotes the etching shift. When the barrier film was formed of a 100 nm-thickness aluminum oxide film, the etching shift was 150 nm, and the contact resistance was increased. When the barrier film was formed of a 200 nm-thickness aluminum oxide film, the etching shift was above 300 nm including 300 nm, and defective contact took place.

As detailed above, when the barrier film is formed on a coated insulation film, such as an organic insulation film, SOG film or others, as in, e.g., Patent Reference 1, i.e., the barrier film is formed on the base having steps and slopes formed in the surface, the different disadvantages take place when the barrier film is formed relatively thin or relatively thick.

Furthermore, it is known that generally SOG film has small film stress but has very much residual water in the film. Accordingly, when the inter-layer insulation film is formed of SOG film, the water in the SOG film will arrive at the ferroelectric capacitor to deteriorate the characteristics of the ferroelectric capacitors when heat of above 250° C. including 250° C. in a later step.

In contrast to such barrier film formed on the base having steps and slopes in the surface, the flat barrier film formed on the planarized insulation film of the semiconductor device according to the present embodiment has very good coverage. Accordingly, hydrogen and water are surely blocked by such flat barrier film, and the arrival of hydrogen and water at the ferroelectric film of the ferroelectric capacitor can be prevented.

However, when one flat barrier film is simply formed above the ferroelectric capacitor, the resistance to hydrogen and the humidity resistance have not been able to be surely ensured in severe environments, e.g., defects have taken place in a PTHS test. This will be due to steps formed by micro-scratches generated in the surface of the inter-layer insulation film when the inter-layer insulation film to be the base layer of the flat barrier film is planarized by CMP or others. That is, even the flat barrier film has defective parts whose coverage is not so good due to the steps formed by micro-scratches generated in the surface of the inter-layer insulation film, and these defective parts will be one cause for even the flat barrier film being unable to sufficiently ensure the resistant to hydrogen and humidity resistance. Actually, in consideration of such defective parts, a 100 nm-thickness silicon oxide film, for example, is formed after the base layer has been planarized by CMP or others, but even such method has not been able to perfectly hinder the influence of the micro-scratches.

Figure 17:
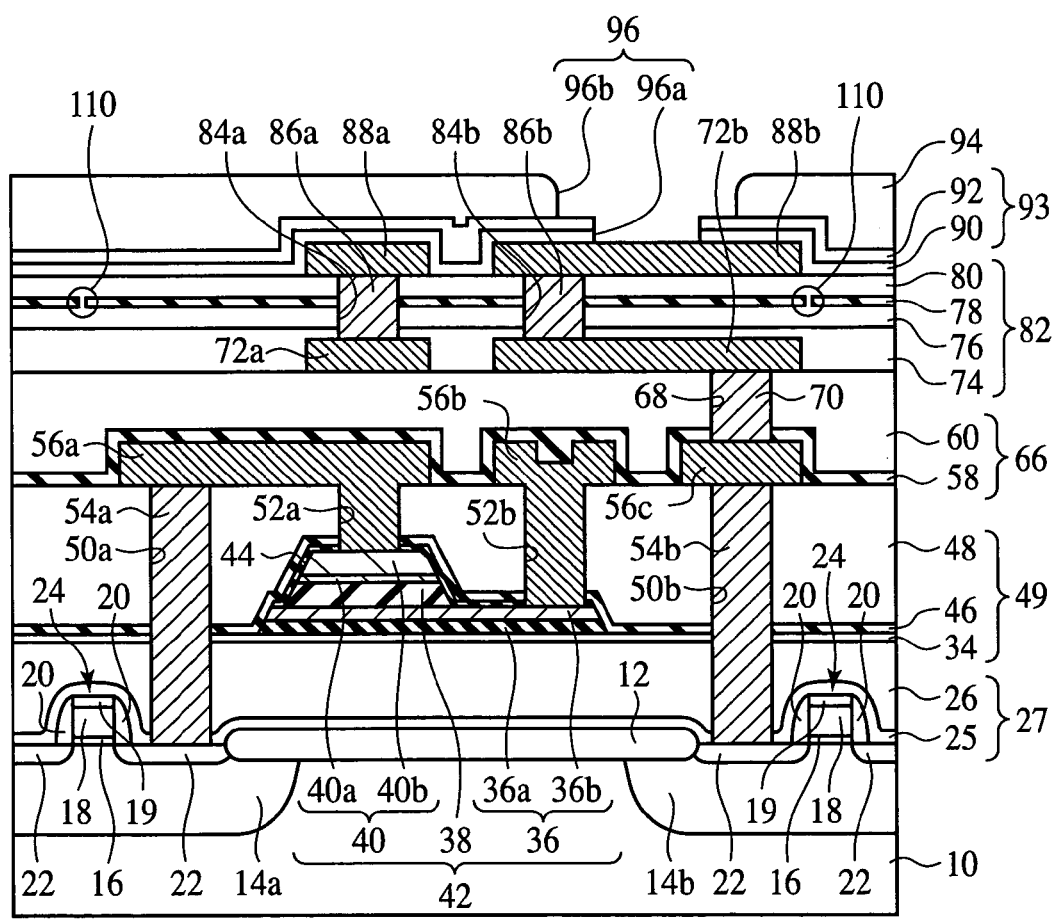
FIG. 17 is a view illustrating an advantageous effect produced by the semiconductor device according to the first embodiment of the present invention (Part 1).

FIG. 17 is a sectional view illustrating a defect part formed in the flat barrier film of the semiconductor substrate including ferroelectric capacitors. The semiconductor device illustrated in FIG. 17 does not include the barrier film 62 but includes one barrier film 78 alone as the flat barrier film, as does the semiconductor device according to the present embodiment.

As illustrated in FIG. 17, even in the flat barrier film, the defective parts 110 whose coverage is not so good will take place due to steps, etc. formed by micro-scratches generated in the surface of the base insulation film.

Accordingly, in severe environments the semiconductor device is placed, hydrogen and water will intrude into the semiconductor device through the defective parts 110 of the flat barrier film 78.

Furthermore, with only one layer of the barrier film, it is difficult to sufficiently prevent the arrival of hydrogen and water intruding into the semiconductor device through the defective parts 110 at the ferroelectric capacitor 42. Resultantly, even in the case that the flat barrier film is formed above the ferroelectric capacitor, with only one layer of the flat barrier film, the electric characteristics of the ferroelectric capacitor will be deteriorated.

In the semiconductor device according to the present embodiment, however, there are formed two layers of the barrier film, i.e., the flat barrier film 62 formed between the first metal interconnection layer 56 formed above the ferroelectric capacitor 42 and the second metal interconnection layer 72, and the flat barrier film 78 formed between the second metal interconnection layer 72 and the third metal interconnection layer 88.

Figure 18:
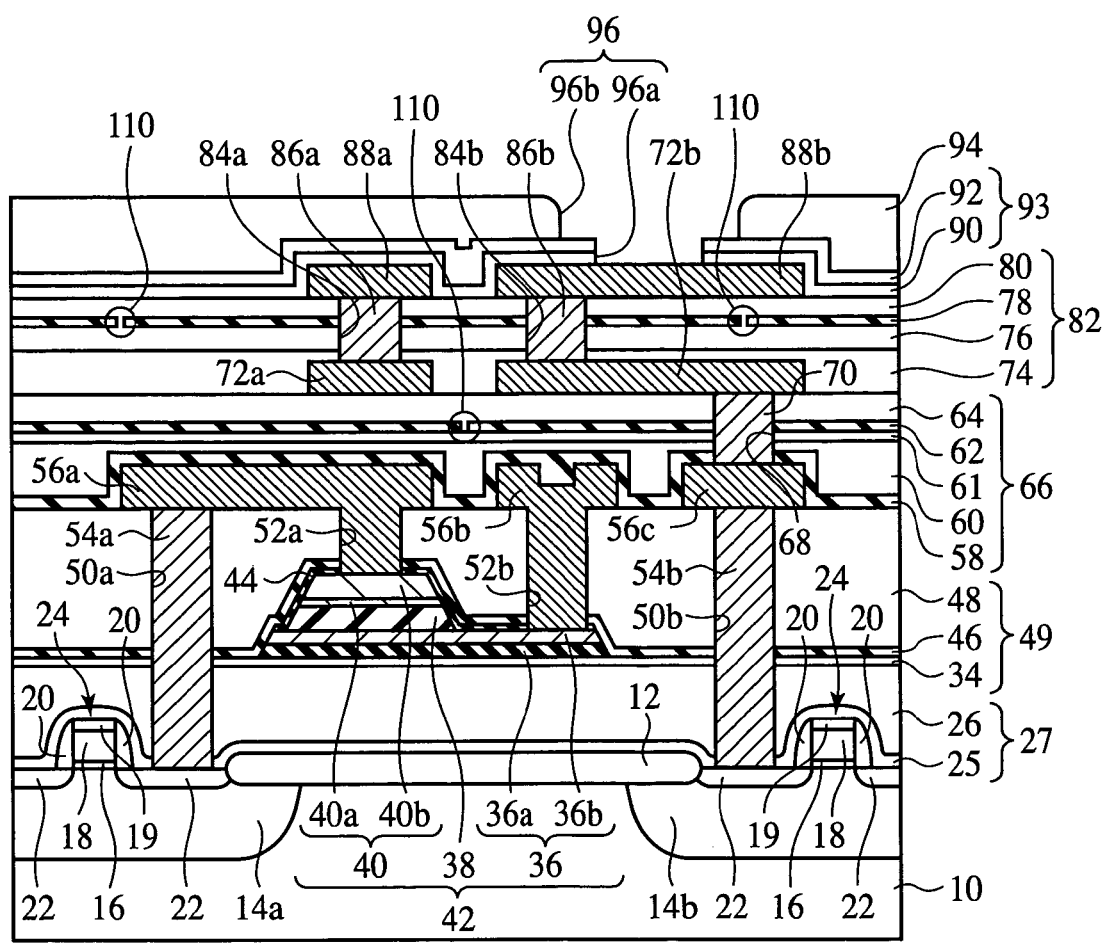
FIG. 18 is a view illustrating the advantageous effect produced by the semiconductor device according to the first embodiment of the present invention (Part 2).
Figure 19A:
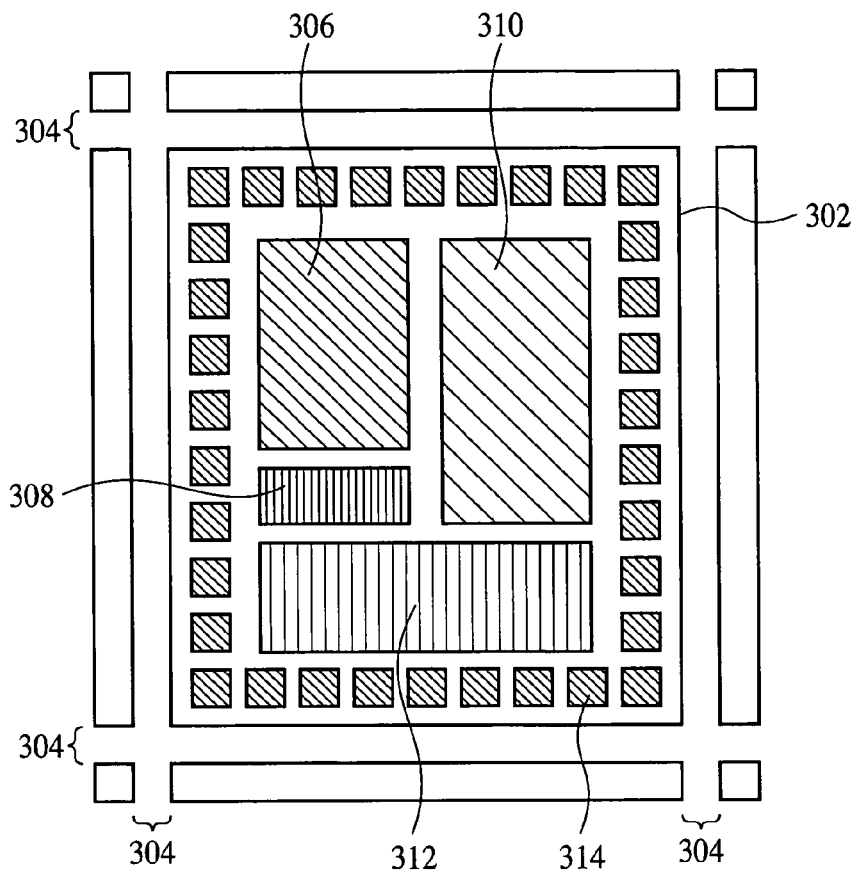
FIGS. 19A-19B are views illustrating the advantageous effect produced by the semiconductor device according to the first embodiment of the present invention (Part 3).
Figure 19B:
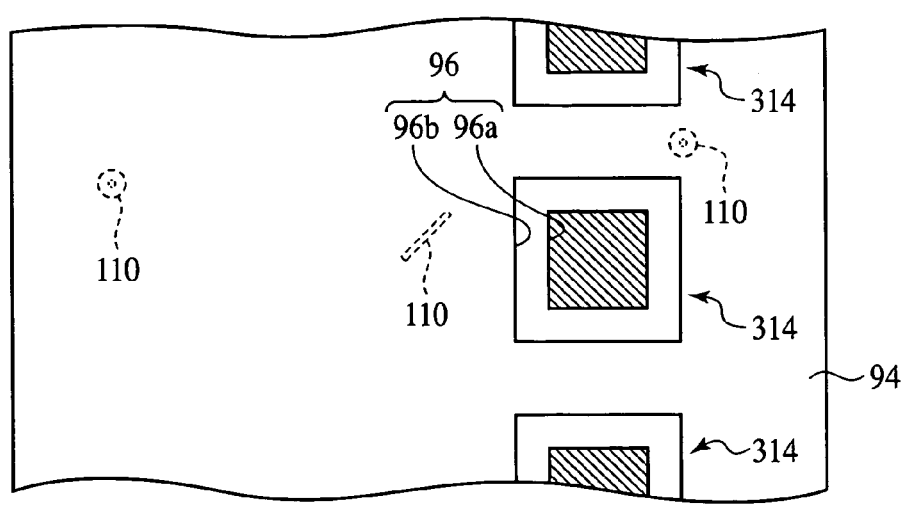

In the semiconductor device according to the present embodiment as well, it can be assumed that, as illustrated in FIGS. 18 and 19A-19B, the defective parts 110 whose coverage is not so good have taken place in the two layers of the barrier film 62, 78. FIG. 18 is a sectional view of the semiconductor device according to the present embodiment, which illustrates the structure thereof, and FIG. 19B is the enlarged plan view of a region containing the pad regions 314 in FIG. 19A. FIGS. 18 and 19B diagrammatically illustrate the defective parts 110 formed in the two layers of the barrier film 62, 78.

However, the probability that the defective parts 110 take place in the flat barrier films 62, 78 at substantially the same planar positions is very low. Accordingly, in the semiconductor device according to the present embodiment, even if hydrogen and water should intrude into the semiconductor device through the defective part generated in the upper flat barrier film 78, the lower flat barrier film 62 can surely block the arrival of the intruding hydrogen and water at the ferroelectric capacitors 42.

Although detailed mechanism is unknown, because of the two layers of the barrier films 62, 78, the residual hydrogen present in the inter-layer insulation film will be sealed between the two layers of the barrier films 62, 78, and the residual hydrogen above the ferroelectric capacitors 42 will be prevented from arriving at the ferroelectric capacitor. Such another factor will prevent the deterioration of the electric characteristics of the ferroelectric capacitor 42, and the PTHS characteristics could be improved.

Figure 20:
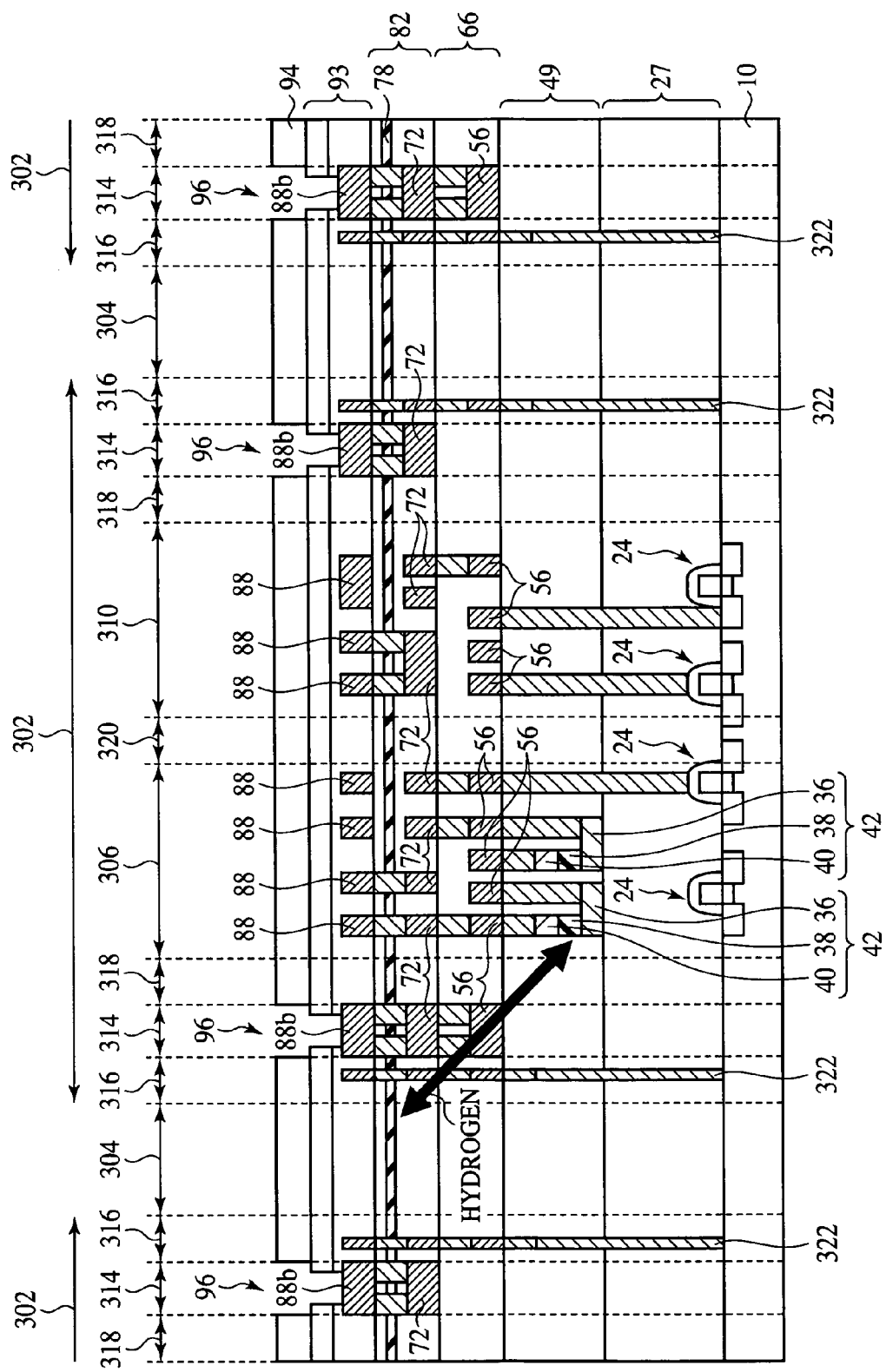
FIG. 20 is a view illustrating the advantageous effect produced by the semiconductor device according to the first embodiment of the present invention (Part 4).

That is, as illustrated in FIG. 20, only one layer of the barrier film 78 is formed as the flat barrier film, and without the barrier film 62, the residual hydrogen above the ferroelectric capacitor 42 can easily arrive at the ferroelectric capacitors 42. Accordingly, in this case, it will be difficult to sufficiently prevent the deterioration of the electric characteristics of the ferroelectric capacitor 42.

On the other hand, with two layers of the barrier films 62, 78 as in the semiconductor device according to the present embodiment illustrated in FIG. 21, the residual hydrogen in the inter-layer insulation film is sealed between the two layers of the barrier films 62, 78. Accordingly, the arrival of the residual hydrogen above the ferroelectric capacitor 42 at the ferroelectric capacitor 42 can be prevented. Resultantly, the deterioration of the electric characteristics of the ferroelectric capacitor 42 could be prevented, and the PTHS characteristics could be improved.

The semiconductor device according to the present embodiment is also characterized mainly in that the barrier films 62, 78 are formed over the FeRAM chip region 302 and also over the scribe regions 304, and also over the neighboring FeRAM chip regions 302.

In the semiconductor device disclosed in, e.g., Patent Reference 7, the hydrogen-barrier layer is formed only in the FeRAM cell region. Accordingly, in the semiconductor device disclosed in Patent Reference 7, it is difficult to prevent the intrusion of hydrogen and water into the FeRAM cell region from above and the sides of the FeRAM cell region and the arrival of the hydrogen and water at ferroelectric capacitors. Accordingly, the characteristics of the ferroelectric capacitors will be deteriorated when exposed for a long period of time to environments of, e.g., high humidity.

In the semiconductor device according to the present embodiment, the barrier films 62, 78 are formed over the FeRAM chip region 302 and the scribe regions 304 and even over the neighboring FeRAM chip regions 302, whereby the intrusion of hydrogen and water into the FeRAM cell region 306 from above or from the sides of the FeRAM cell region 306 can be surely prevented. Accordingly, the deterioration of the electric characteristics of the ferroelectric capacitors 42 due to the exposure in environments of, e.g., high humidity for a long period of time can be surely prevented.

In the semiconductor device according to the present embodiment, to ensure the coverage of the barrier films 62, 78, it is not necessary to form the barrier films 62, 78 relatively thick, and the barrier films 62, 78 may be formed relatively thin. Accordingly, in forming contact holes in the inter-layer insulation films including the barrier films 62, 78, the etch shift can be depressed to below 70 nm including 70 nm in the respective regions of the FeRAM chip region 306. Thus, the contact resistance increase can be suppressed. Fine contact holes can be surely formed, which can contribute to the miniaturization of the semiconductor device.

As described above, in the semiconductor device according to the present embodiment, the flat barrier film 62 and the flat barrier film 78 are formed respectively between the first metal interconnection layer 56 formed above the ferroelectric capacitor 42 and the second metal interconnection layer 72 and between the second metal interconnection layer 72 and the third metal interconnection layer 88, whereby hydrogen and water can be surely barriered, and the arrival of the hydrogen and water at the ferroelectric film 38 of the ferroelectric capacitor 42 can be surely prevented. Thus, the deterioration of the electric characteristics of the ferroelectric capacitor 42 due to hydrogen and water can be surely prevented, and the PTHS characteristics of the semiconductor device including the ferroelectric capacitor can be much improved.

Furthermore, in the semiconductor device according to the present embodiment, the flat barrier films 62, 78 are formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320, whereby the electric characteristics of the ferroelectric capacitor 42 due to hydrogen and water can be surely prevented.

The film thickness of the barrier films 62, 78 are set at preferably, e.g., above 50 nm including 50 nm up to 100 nm excluding 100 nm, more preferably above 50 nm including 50 nm and below 80 nm including 80 nm, from the following views.

First, in view of preventing defects in the conductor plugs, the film thickness of the barrier films 62, 78 is preferably set at, e.g., above 40 nm including 40 nm and below 100 nm excluding 100 nm, more preferably above 40 nm including 40 nm and below 80 nm including 80 nm. This point will be explained with reference to FIGS. 22A-22B and 23A-23B.

Figure 22A:
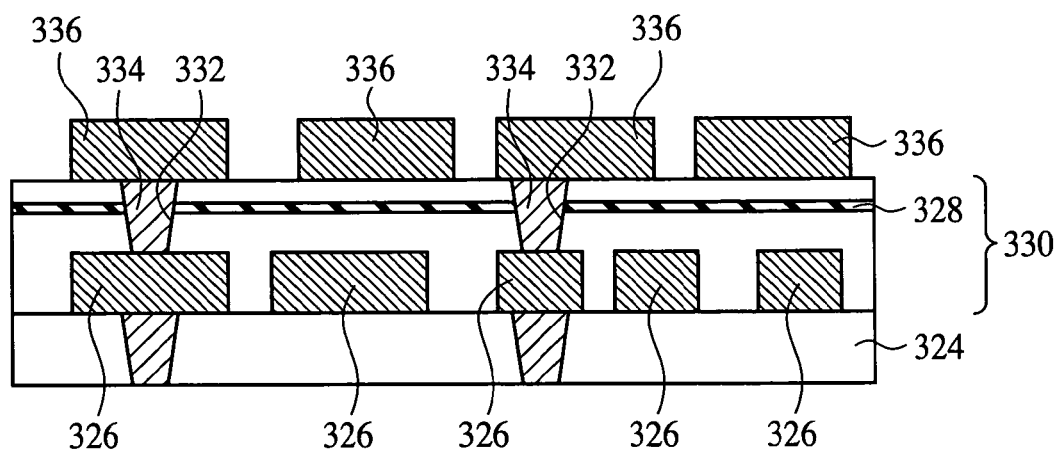
FIGS. 22A-22B are sectional views illustrating a defect caused in a conductor plug buried in the inter-layer insulation film including the barrier film.
Figure 22B:
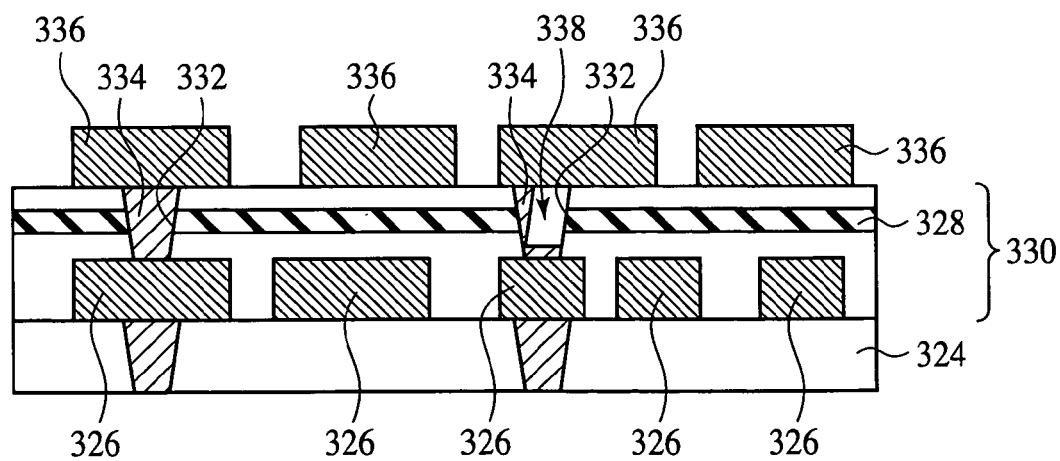
Figure 23A:
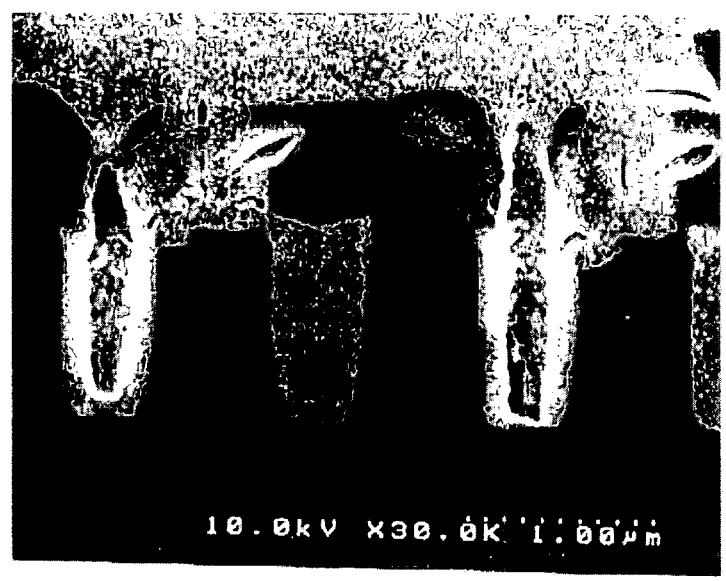
FIGS. 23A-23B are transmission electron microscopic pictures of the defect caused in the conductor plug buried in the inter-layer insulation film including the barrier film.
Figure 23B:

FIGS. 22A-22B are sectional views explaining a defect generated in the conductor plug buried in the inter-layer insulation film including the barrier film. FIG. 22A illustrates the case that the barrier film is relatively thin, and FIG. 22B illustrates the case that the barrier film is relatively thick. FIGS. 23A-23B are observed transmission electron microscopic pictures of the defect generated in the conductor plugs buried in the inter-layer insulation film including the barrier film.

As illustrated in FIGS. 22A and 22B, interconnection layers 326 are formed on the inter-layer insulation film 324. On the inter-layer insulation film 324 with the interconnection layers 326 formed on, an inter-layer insulation film 330 including a flat barrier film 328 is formed. Contact holes 332 are formed in the inter-layer insulation film 330 down to the interconnection layers 326. Conductor plugs 334 of tungsten are buried in the contact holes 332. On the inter-layer insulation film 330 with the conductor plugs 334 buried in, interconnection layers 336 are formed.

when the film thickness of the barrier film 328 of aluminum oxide film is below 80 nm including 80 nm, as illustrated in FIG. 22A, the conductor plugs 334 are fully buried in the contact holes 332, and the defect does not take place in the conductor plugs 334.

On the other hand, when the film thickness of the barrier film 328 of aluminum oxide film is above 80 nm, as illustrated in FIG. 22B, the conductor plugs 334 are not fully buried in the contact holes 332, and the defect 338 takes place in the conductor plugs 334. FIGS. 23A and 23B are observed transmission electron microscopic pictures of the defects generated in the conductor plugs buried in the inter-layer insulation films including the respective barrier films. It is confirmed that such defects 338 take place with high frequency when the film thickness of the barrier film is above 100 nm including 100 nm.

Thus, in view of preventing the generation of the defect in the conductor plug, the film thickness of the barrier films 62, 78 is set at preferably, e.g., above 40 nm including 40 nm and below 100 nm excluding 100 nm, more preferably above 40 nm including 40 nm and below 80 nm including 80 nm.

On the other hand, in order for the barrier films 62, 78 to sufficiently exert the function of preventing the diffusion of hydrogen and water, the film thickness of the barrier films is set preferably above e.g., 50 nm including 50 nm.

Based on what has been described above, it is preferable to set the film thickness of the barrier films 62, 78 at, e.g., above 50 nm including 50 nm and below 100 nm excluding 100 nm, more preferably above 50 nm including 50 nm and below 80 nm including 80 nm.

(The Method for Fabricating the Semiconductor Device)

Next, the method for fabricating the semiconductor device according to the present embodiment will be explained with reference to FIGS. 24A-24C to 30A-30B. Hereafter, the method for fabricating the semiconductor device according to the present embodiment will be explained basically with reference to the sectional views corresponding to the sectional structure of the semiconductor device illustrated in FIG. 3 in the steps of the method for fabricating the semiconductor device, but the transistors and the interconnections, etc. in the logic circuit region 310, the peripheral circuit regions 308, 312, etc. can be formed by the usual semiconductor fabrication process.

First, the device isolation region 12 for defining device regions is formed on the semiconductor substrate 10 of, e.g., silicon by, e.g., LOCOS (LOCal Oxidation of Silicon).

Next, dopant impurities are implanted by ion implantation to form the wells 14a, 14b.

Figure 24A:
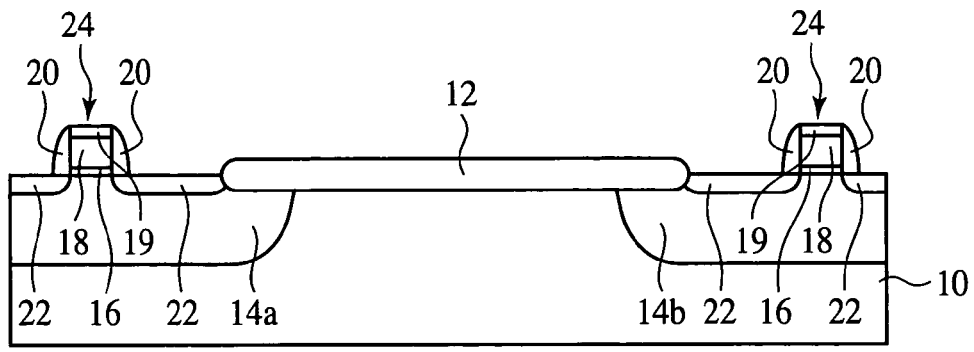
FIGS. 24A-24C are sectional views of the semiconductor device according to the first embodiment in the steps of the method for fabricating the same, which illustrate the method (Part 1).

Next, the transistors 24 each including the gate electrode (gate interconnection) 18 and the source/drain diffused layers 22 are formed by the usual transistor forming method (see FIG. 24A).

Then, the SiON film 25 of, e.g., a 200 nm-thickness is formed on the entire surface by, e.g., plasma CVD (Chemical Vapor Deposition).

Figure 24B:
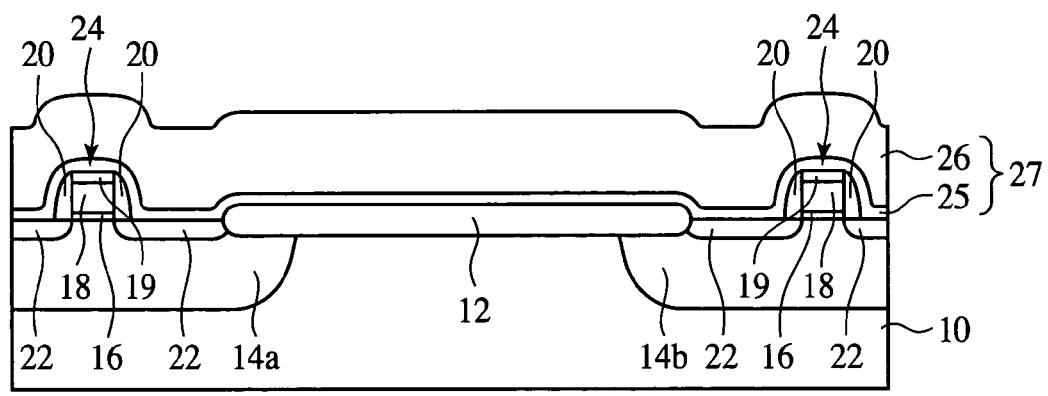

Then, the silicon oxide film 26 of, e.g., a 600 nm-thickness is formed on the entire surface by plasma TEOS CVD (see FIG. 24B).

Thus, the inter-layer insulation film 27 is formed of the SiON film 25 and the silicon oxide film 26.

Figure 24C:
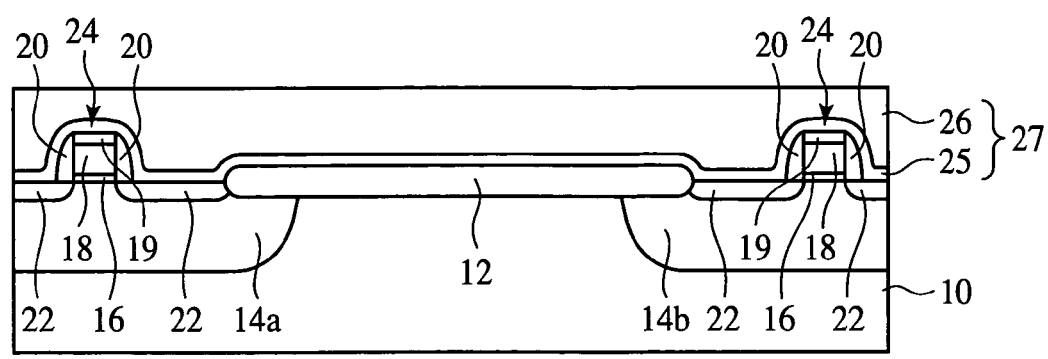

Next, the surface of the inter-layer insulation film 27 is planarized by, e.g., CMP (see FIG. 24C).

Next, thermal processing, e.g., of 650° C. and 30 minutes is made in an N$_2$O atmosphere or an N$_2$ atmosphere.

Figure 25A:
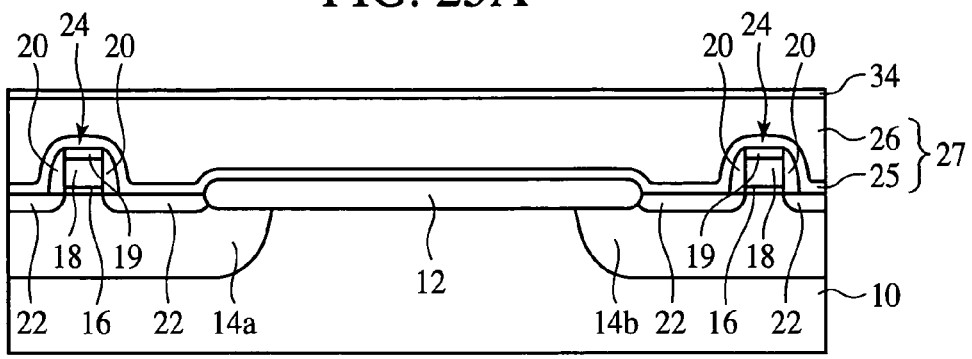
FIGS. 25A-25C are sectional views of the semiconductor device according to the first embodiment in the steps of the method for fabricating the same, which illustrate the method (Part 2).

Next, the silicon oxide film 34 of, e.g., a 100 nm-thickness is formed on the entire surface by, e.g., plasma TEOS CVD (see FIG. 25A).

Next, thermal processing, e.g., of 350° C. and 2 minutes is made in a plasma atmosphere generated with N$_2$O gas.

Then, the aluminum oxide film 36a of, e.g., a 20-50 nm-thickness is formed on the entire surface by, e.g., sputtering or CVD.

Then, thermal processing is made in an oxygen atmosphere by, e.g., RTA (Rapid Thermal Annealing). The thermal processing temperature is, e.g., 650° C., and the thermal processing period of time is, e.g., 1-2 minutes.

Then, the Pt film 36a of, e.g., a 100-200 nm-thickness is formed on the entire surface by, e.g., sputtering.

Thus, the layered film 36 is formed of the aluminum oxide film 36a and the Pt film 36b. The layered film 36 is to be the lower electrode of the ferroelectric capacitor 42.

Next, the ferroelectric film 38 is formed on the entire surface by, e.g., sputtering. As the ferroelectric film 38, a PZT film of, e.g., a 100-250 nm-thickness is formed.

The ferroelectric film 38 is formed by sputtering here, but the method for forming the ferroelectric film is not limited to sputtering. For example, the ferroelectric film may be formed by sol-gel process, MOD (Metal Organic Deposition), MOCVD or others.

Next, thermal processing is made in an oxygen atmosphere by, e.g., RTA. The thermal processing temperature is, e.g., 550-600° C., and the thermal processing period of time is, e.g., 60-120 seconds.

Next, the $IrO_X$ film 40a of, e.g., a 25-75 nm-thickness is formed, e.g., by sputtering or MOCVD.

Next, thermal processing, e.g., of 600-800° C. and 10-100 seconds is made in an argon and oxygen atmosphere.

Next, the $IrO_Y$ film 40b of, e.g., a 150-250 nm-thickness is formed, e.g., by sputtering or MOCVD. At this time, the $IrO_Y$ film 40b is formed with the composition ratio Y of oxygen of the $IrO_Y$ film 40b being higher than the composition ratio X of oxygen of the $IrO_X$ film 40a.

Figure 25B:
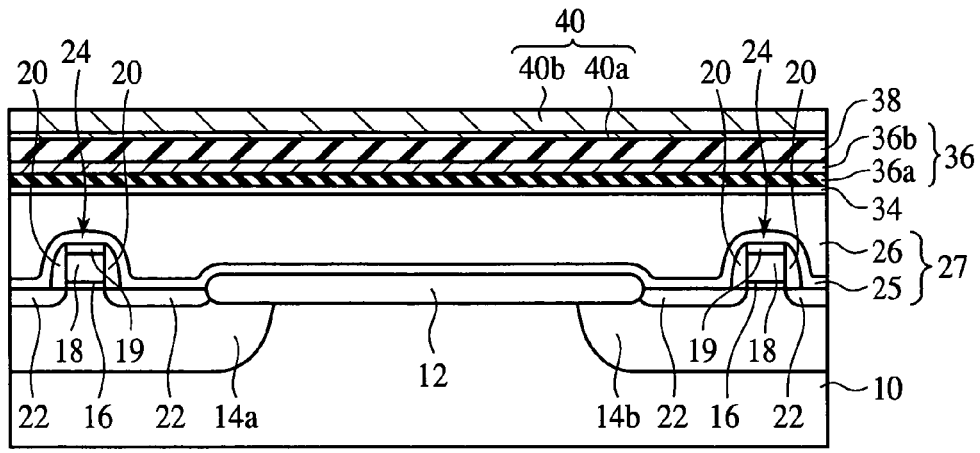

Thus, the layered film 40 of the $IrO_X$ film 40a and the $IrO_Y$ film 40b is formed (see FIG. 25B). The layered film 40 is to be the upper electrode of the ferroelectric capacitor 42.

Next, a photoresist film 98 is formed on the entire surface by spin coating.

Next, the photoresist film 98 is patterned in the plane shape of the upper electrode 40 of the ferroelectric capacitor 42 by photolithography.

Figure 25C:
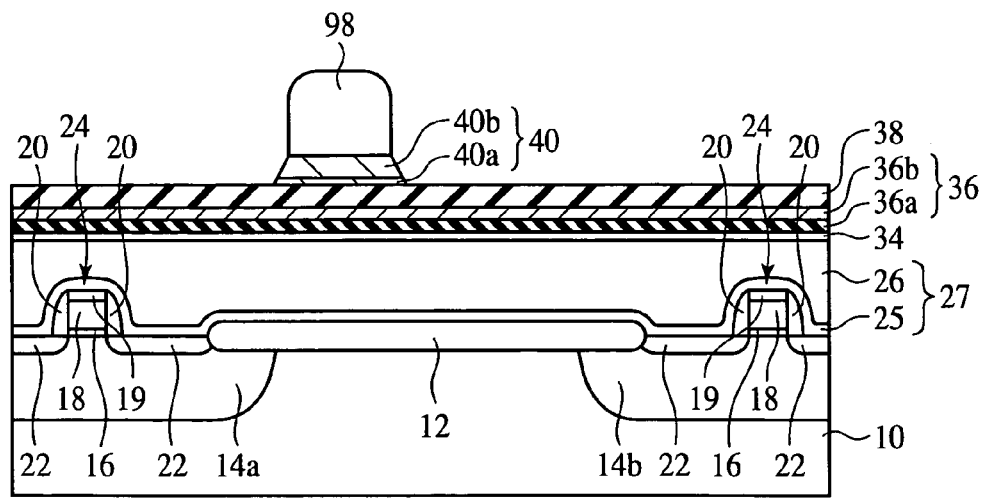

Next, with the photoresist film 98 as the mask, the layered film 40 is etched. The etching gas is, e.g., Ar gas and $Cl_2$ gas. Thus, the upper electrode 40 of the layered film is formed (see FIG. 25C). Then, the photoresist film 98 is removed.

Next, thermal processing, e.g., of 400-700° C. and 30-120 minutes is made in, e.g., an oxygen atmosphere. This thermal processing is for preventing the generation of abnormalities in the surface of the upper electrode 40.

Next, a photoresist film 100 is formed on the entire surface by, e.g., spin coating.

Next, the photoresist film 100 is patterned in the plane shape of the ferroelectric film 38 of the ferroelectric capacitor 42 by photolithography.

Figure 26A:
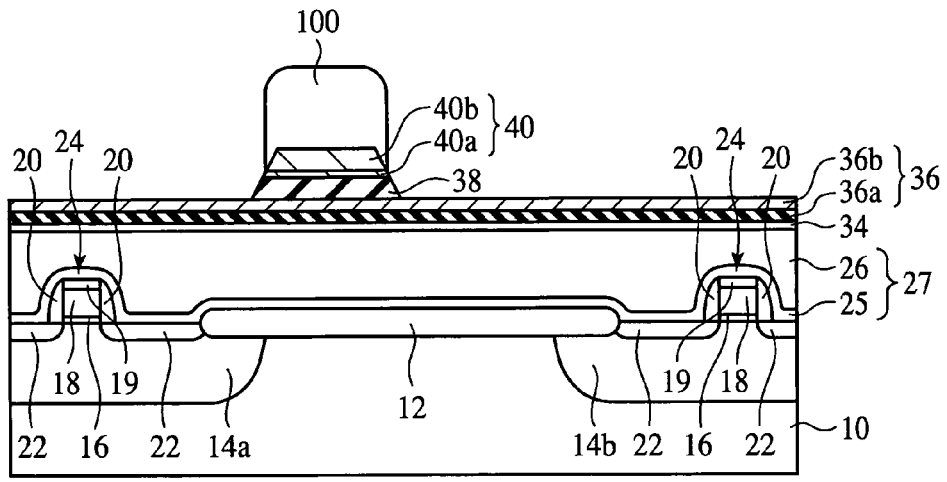
FIGS. 26A-26C are sectional views of the semiconductor device according to the first embodiment in the steps of the method for fabricating the same, which illustrate the method (Part 3).

Next, with the photoresist film 100 as the mask, the ferroelectric film 38 is etched (see FIG. 26A). Then, the photoresist film 100 is removed.

Next, thermal processing, e.g., of 300-400° C. and 30-120 minutes is made in an oxygen atmosphere.

Figure 26B:
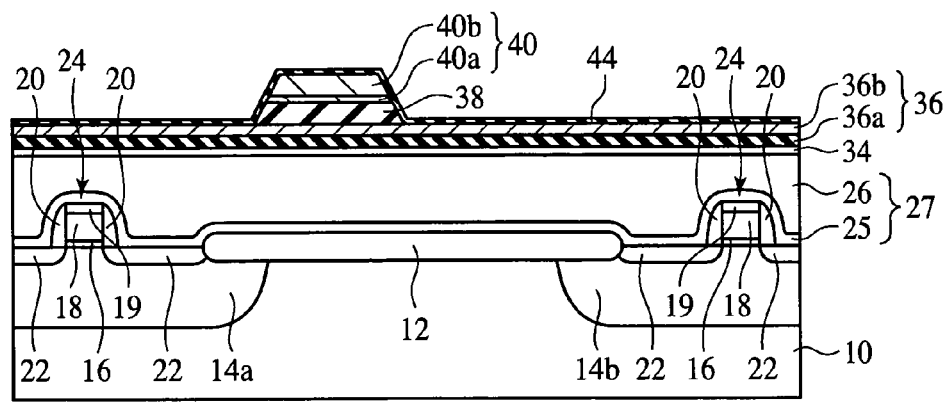

Next, the barrier film 44 is formed by, e.g., sputtering or CVD (see FIG. 26B). As the barrier film 44, an aluminum oxide film of, e.g., a 20-50 nm-thickness is formed.

Next, thermal processing, e.g., of 400-600° C. of 30-120 minutes is made in an oxygen atmosphere.

Next, a photoresist film 102 is formed on the entire surface by, e.g., spin coating.

Next, the photoresist film 102 is patterned in the plane shape of the lower electrode 36 of the ferroelectric capacitor 42 by photolithography.

Figure 26C:
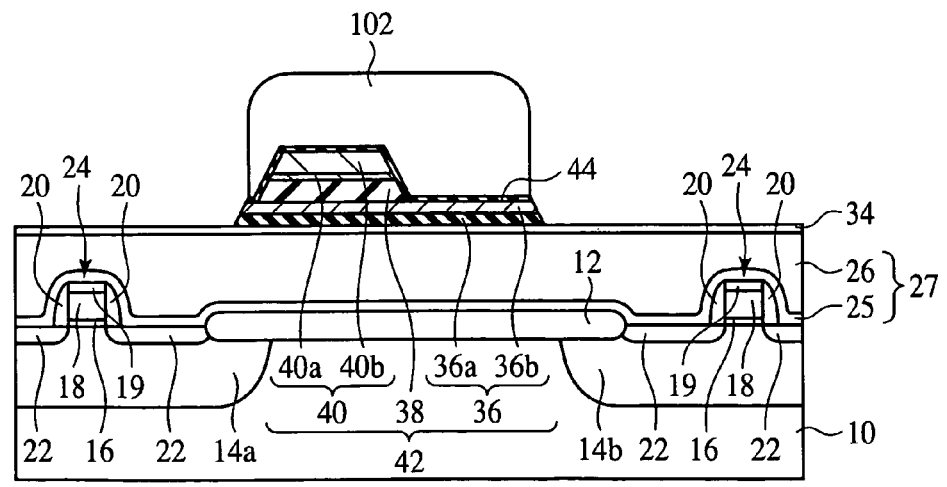

Next, with the photoresist film 102 as the mask, the barrier film 44 and the layered film 36 are etched (see FIG. 26C). Thus, the lower electrode 36 of the layered film is formed. The barrier film 44 is left, covering the upper electrode 40 and the ferroelectric film 38. Then, the photoresist film 102 is removed.

Next, thermal processing, e.g., of 400-600° C. and 30-120 minutes is made in an oxygen atmosphere.

Figure 27A:
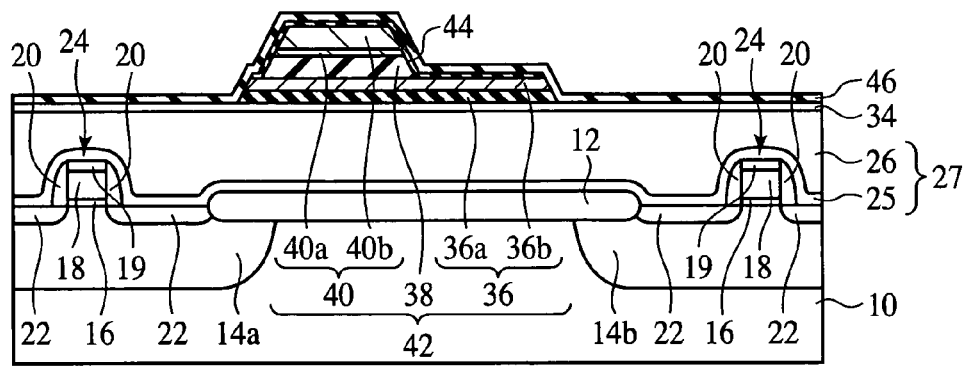
FIGS. 27A-27C are sectional views of the semiconductor device according to the first embodiment in the steps of the method for fabricating the same, which illustrate the method (Part 4).

Next, the barrier film 46 is formed on the entire surface, e.g., by sputtering or CVD. As the barrier film 46, an aluminum oxide film of, e.g., a 20-100 nm-thickness is formed (see FIG. 27A). Thus, the barrier film 46 is formed, covering the ferroelectric capacitor 42 covered by the barrier film 44.

Then, thermal processing, e.g., of 500-700° C. and 30-120 minutes is made in an oxygen atmosphere.

Figure 27B:
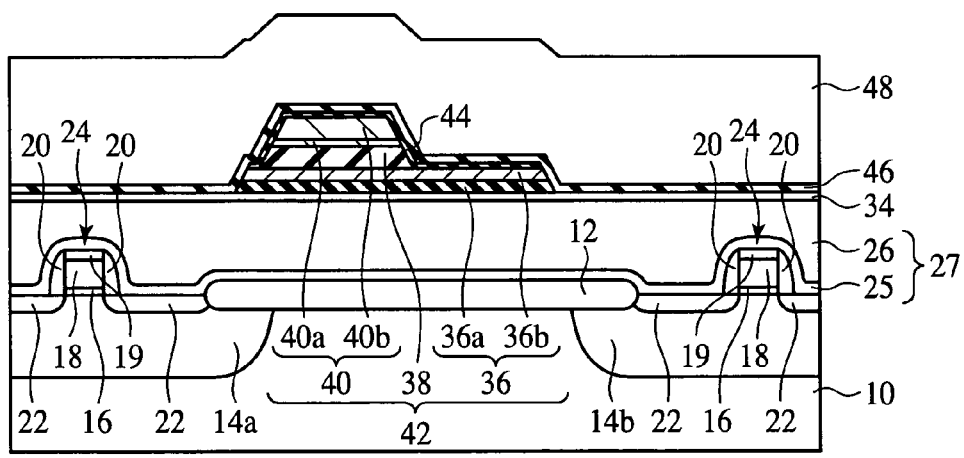

Next, the silicon oxide film 48 of, e.g., a 1500 nm-thickness is formed on the entire surface, e.g., by plasma TEOS CVD (see FIG. 27B).

Figure 27C:
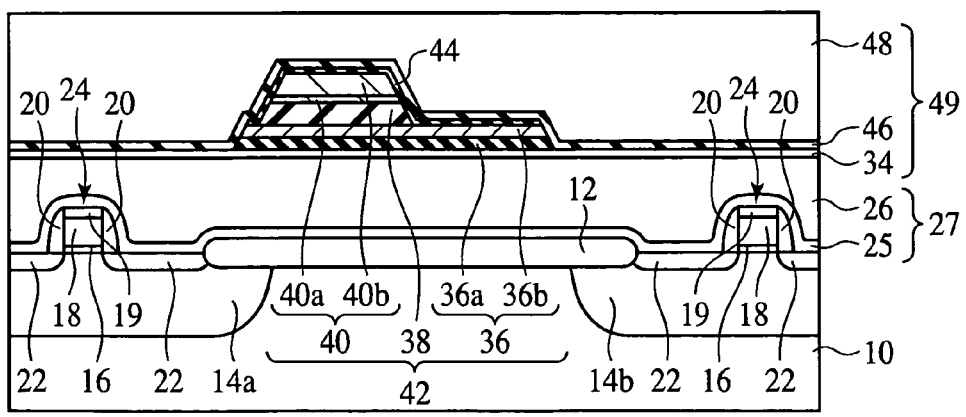

Then, the surface of the silicon oxide film 48 is planarized by, e.g., CMP (see FIG. 27C).

Then, thermal processing, e.g., of 350° C. and 2 minutes is made in a plasma atmosphere generated with $N_2O$ gas or $N_2$ gas. This thermal processing is for removing water from the silicon oxide film 48 while modifying the film quality of the silicon oxide film 48 to make it difficult for water to intrude into the silicon oxide film 48. This thermal processing nitrides the surface of the silicon oxide film 48, and SiON film (not illustrated) is formed on the surface of the silicon oxide film 48.

Figure 28A:
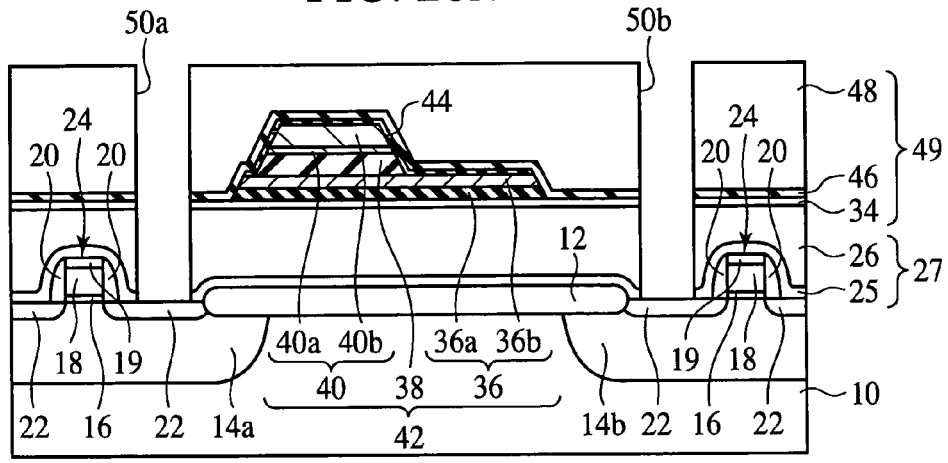
FIGS. 28A-28C are sectional views of the semiconductor device according to the first embodiment in the steps of the method for fabricating the same, which illustrate the method (Part 5).

Next, by photolithography and etching, the contact holes 50a, 50b are formed in the silicon oxide film 48, the barrier film 46, the silicon oxide film 34 and the inter-layer insulation film 27 down to the source/drain diffused layers 22 (see FIG. 28A).

Then, a Ti film of, e.g., a 20 nm-thickness is formed on the entire surface by, e.g., sputtering. Subsequently, a TiN film of, e.g., a 50 nm-thickness is formed on the entire surface by, e.g., sputtering. Thus, the barrier metal (not illustrated) of the Ti film and the TiN film is formed.

Next, a tungsten film of, e.g., a 50 nm-thickness is formed on the entire surface by, e.g., CVD.

Figure 28B:
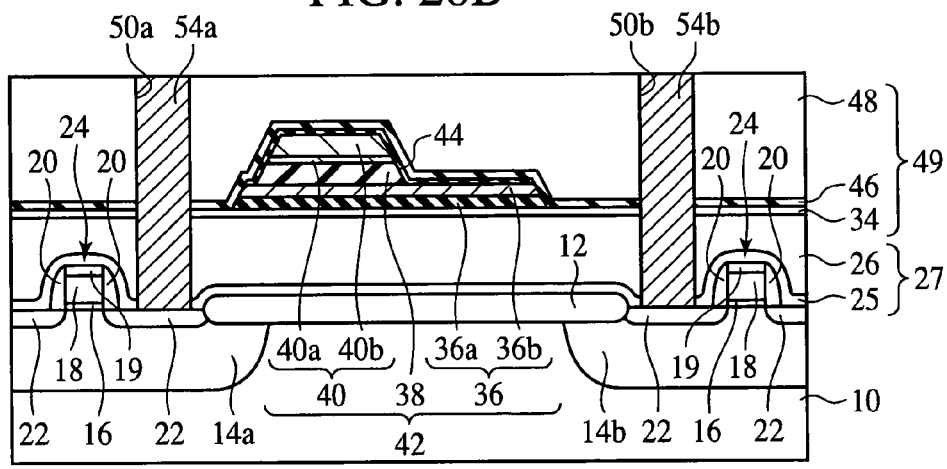

Next, the tungsten film and the barrier metal film are polished by, e.g., CMP until the surface of the silicon oxide film 48 is exposed. Thus, the conductor plugs 54a, 54b of tungsten are buried in the contact holes 50a, 50b (see FIG. 28B).

Next, plasma cleaning with, e.g., argon gas is made. Thus, natural oxide film, etc. on the surfaces of the conductor plugs 54a, 54b are removed.

Next, the SiON film 104 of, e.g., a 100 nm-thickness is formed on the entire surface by, e.g., CVD.

Figure 28C:
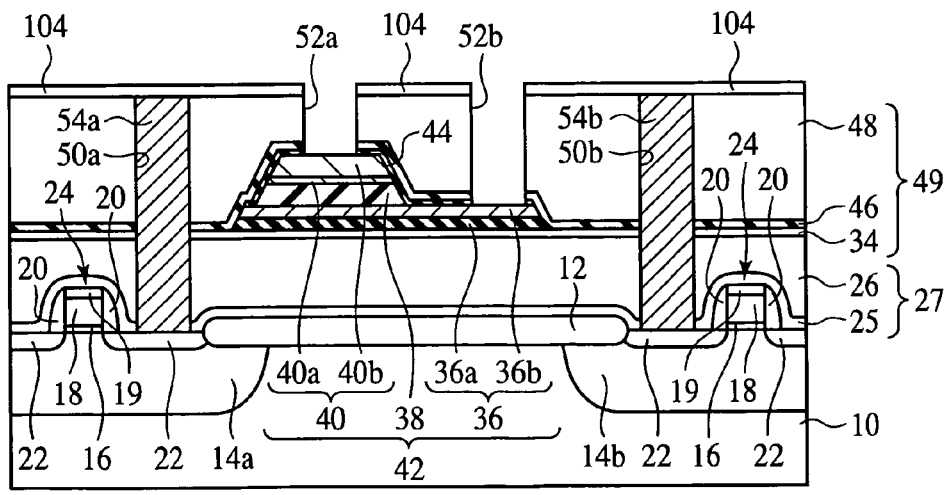

Next, by photolithography and dry etching, the contact hole 52a and the contact hole 52b are formed in the SiON film 104, the silicon oxide film 48, the barrier film 46 and the barrier film 44 respectively down to the upper electrode 40 of the ferroelectric capacitor 42 and down to the lower electrode 36 of the ferroelectric capacitor 42 (see FIG. 28C).

Then, thermal processing, e.g., of 400-600° C. of 30-120 minutes is made in an oxygen atmosphere. This thermal processing is for feeding oxygen to the ferroelectric film 38 of the ferroelectric capacitor 42 to recover the electric characteristics of the ferroelectric capacitor 42. The thermal processing is made in an oxygen atmosphere here, but may be made in an ozone atmosphere. The thermal processing in an ozone atmosphere also can feed oxygen to the ferroelectric film 38 of the ferroelectric capacitor 42 to recover the electric characteristics of the ferroelectric capacitor 42.

Next, the SiON film 104 is etched off.

Then, an TiN film of, e.g., a 150 nm-thickness, an AlCu alloy film of, e.g., a 550 nm-thickness, a Ti film of, e.g., a 5 nm-thickness and a TiN film of, e.g., a 150 nm-thickness are sequentially laid the former on the latter on the entire surface. Thus, the conductor film of the TiN film, the AlCu alloy film, the Ti film and the TiN film sequentially laid the latter on the former is formed.

Figure 29A:
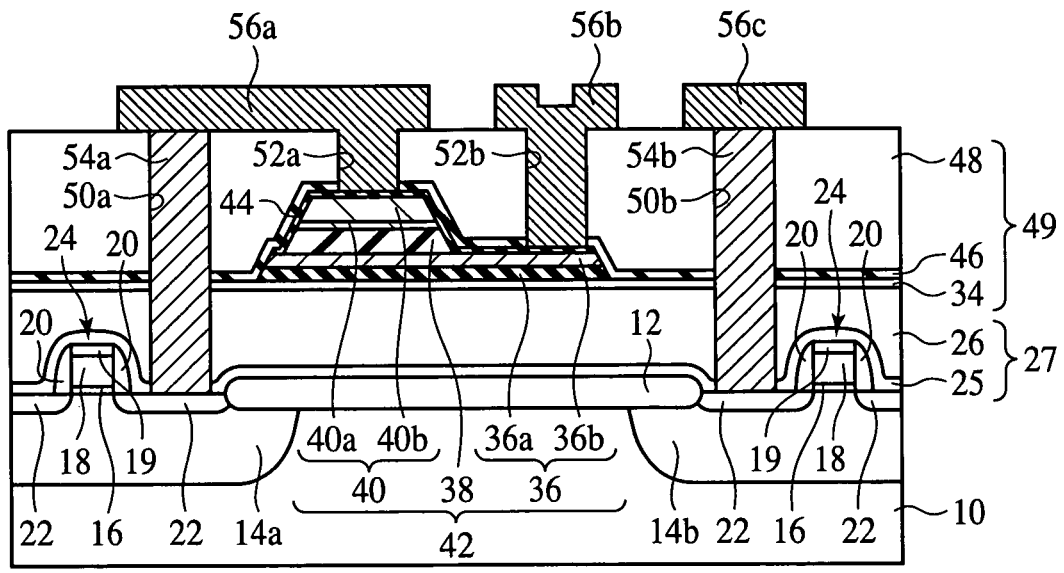
FIGS. 29A-29B are sectional views of the semiconductor device according to the first embodiment in the steps of the method for fabricating the same, which illustrate the method (Part 6).

Next, the conductor film is patterned by photolithography and dry etching. Thus, the first metal interconnection layer 56, i.e., the interconnection 56a electrically connected to the upper electrode 40 of the ferroelectric capacitor 42 and the conductor plug 54a, the interconnection 56b electrically connected to the lower electrode 36 of the ferroelectric capacitor 42, and the interconnection 56c electrically connected to the conductor plug 54b is formed (see FIG. 29A).

Next, thermal processing, e.g., of 350° C. and 30 minutes is made in an oxygen atmosphere.

Figure 29B:
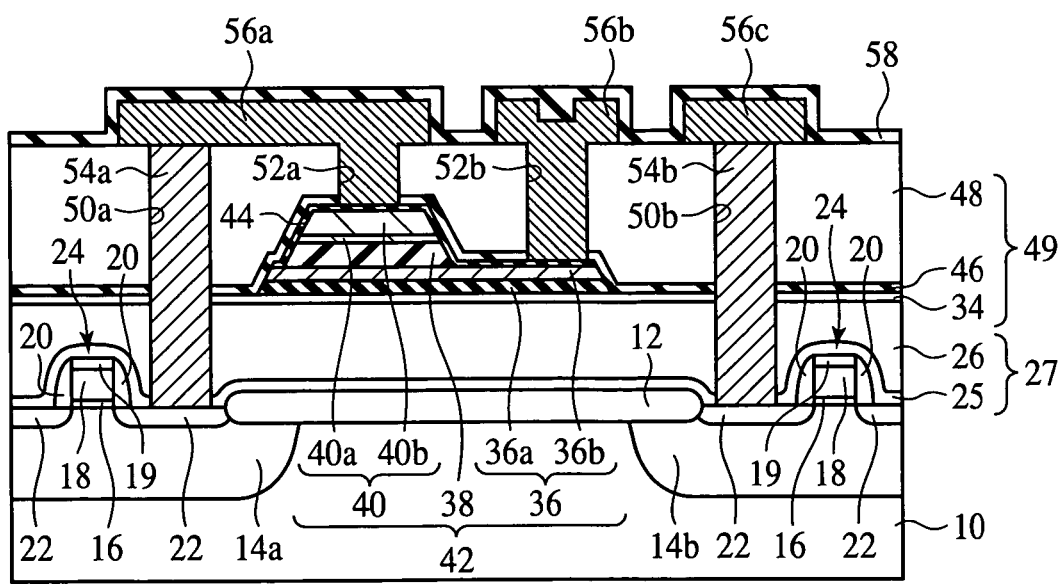

Next, the barrier film 58 is formed on the entire surface by, e.g., sputtering or CVD. As the barrier film 58, an aluminum oxide film of, e.g., a 20-70 nm-thickness is formed (see FIG. 29B). As the barrier film 58, a 20 nm-thickness aluminum oxide film is formed here. Thus, the barrier film 58 is formed, covering the upper and side surfaces of the interconnections 56a, 56b, 56c.

Figure 30A:
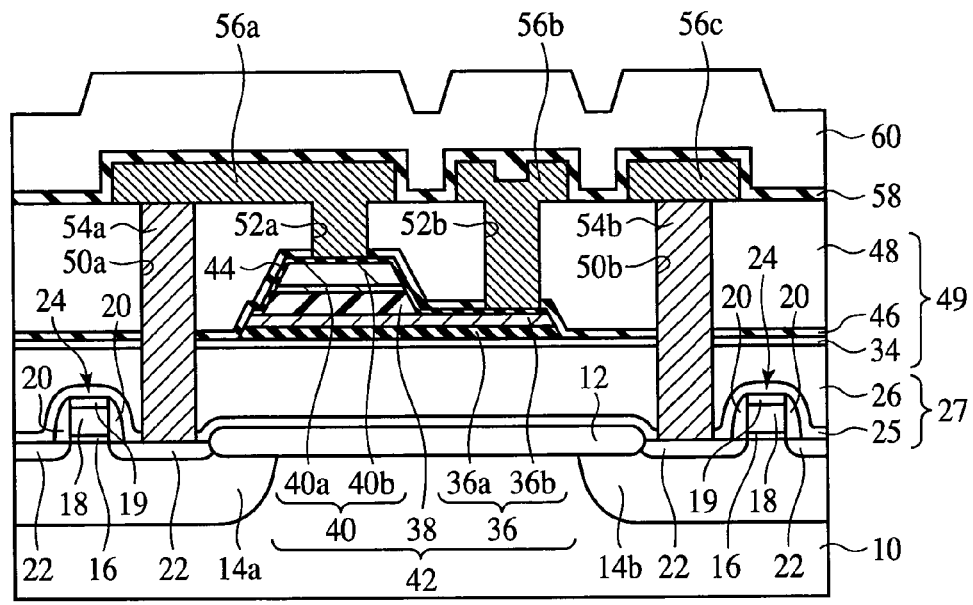
FIGS. 30A-30B are sectional views of the semiconductor device according to the first embodiment in the steps of the method for fabricating the same, which illustrate the method (Part 7).

Then, a silicon oxide film 50 of, e.g., a 2600 nm-thickness is formed on the entire surface by, e.g., plasma TEOS CVD (see FIG. 30A).

Figure 30B:
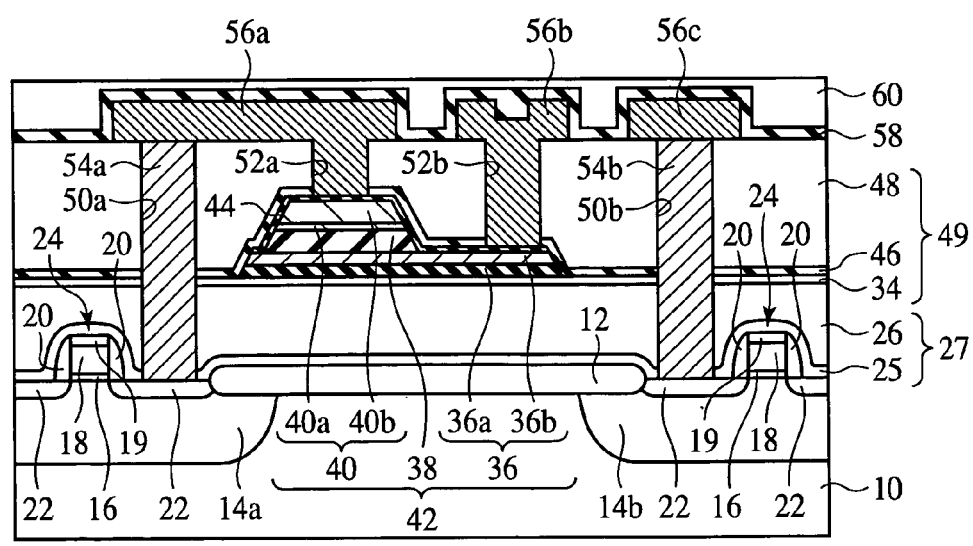

Next, the surface of the silicon oxide film 60 is planarized by, e.g., CMP (see FIG. 30B).

Next, thermal processing, e.g., of 350° C. and 4 minutes is made in a plasma atmosphere generated with $N_2O$ gas or $N_2$ gas. This thermal processing is for removing water in the silicon oxide film 60 while modifying the film quality of the silicon oxide film 60 to make it difficult for water to intrude into the silicon oxide film 60. This thermal processing nitrides the surface of the silicon oxide film 60, and SiON film (not illustrated) is formed on the surface of the silicon oxide film 60.

Then, on the planarized silicon oxide film 60, the silicon oxide film 61 of, e.g., a 100 nm-thickness is formed by, e.g., plasma TEOS CVD. The silicon oxide film 61, which is formed on the planarized silicon oxide film 60, is flat.

Next, thermal processing, e.g., of 350° C. of 2 minutes is made in a plasma atmosphere generated with $N_2O$ gas or $N_2$ gas. This thermal processing is for removing water from the silicon oxide film 61 while modifying the film quality of the silicon oxide film 61 to make it difficult for water to intrude into the silicon oxide film 61. This thermal processing nitrides the surface of the silicon oxide film 61, and SiON film (not illustrated) is formed on the surface of the silicon oxide film 61.

Then, the barrier film 62 is formed on the flat silicon oxide film 61 by, e.g., sputtering or CVD. As the barrier film 62, an aluminum oxide film of, e.g., a 20-70 nm-thickness is formed. The barrier film 62, which is formed on the flat silicon oxide film 61, is flat. The barrier film 62 is formed on the silicon oxide film 60 having the surface planarized by CMP with the silicon oxide film 61 formed therebetween. Due to this, the generation of defective parts in the barrier film 62 due to steps, etc. formed in the surface of the silicon oxide film 60 by micro-scratches can be prevented.

Figure 31:
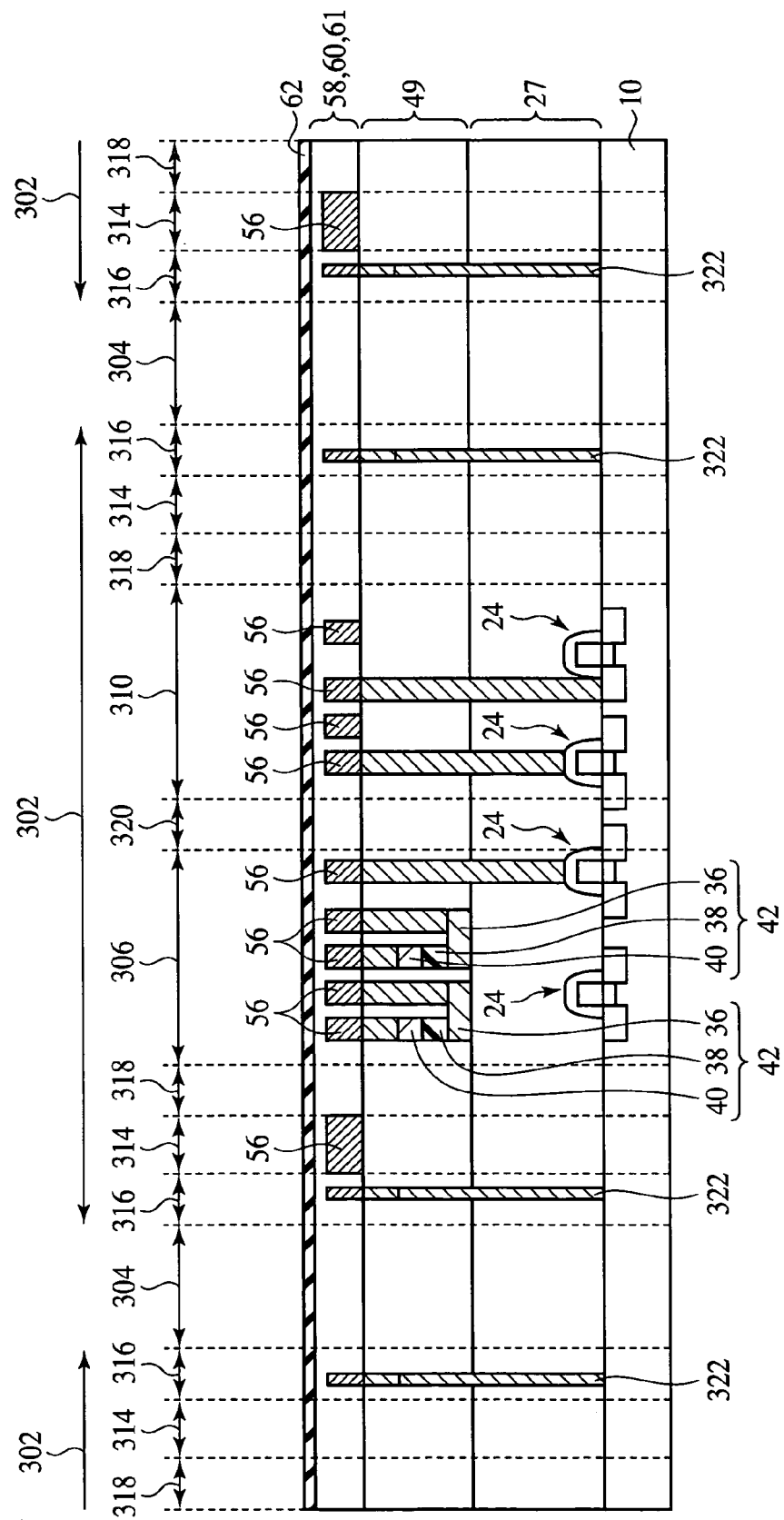
FIG. 31 is a sectional view of the semiconductor device according to the first embodiment in the step of the method for fabricating the same, which illustrate the method (Part 8).

As illustrated in FIG. 31, the barrier film 62 is formed over the FeRAM chip region 302 and the scribe regions 304, and even over the neighboring FeRAM chip regions 302. That is, the barrier film 62 is formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320.

Figure 32A:
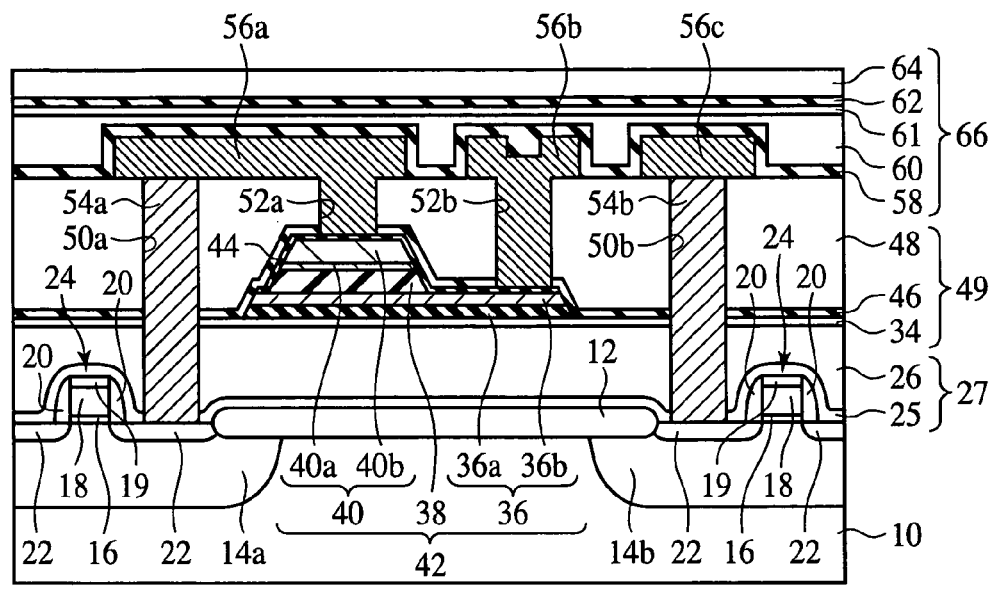
FIGS. 32A-32B are sectional views of the semiconductor device according to the first embodiment in the steps of the method for fabricating the same, which illustrate the method (Part 9).
Figure 32B:
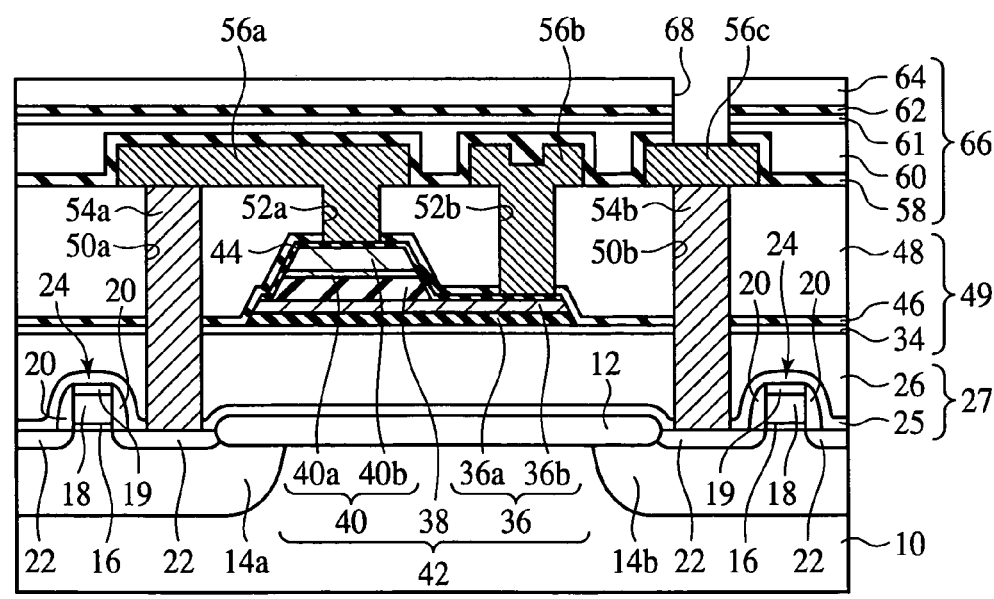

Next, the silicon oxide film 64 of, e.g., a 100 nm-thickness is formed on the entire surface by, e.g., plasma TEOS CVD (see FIG. 32A).

Thus, the inter-layer insulation film 66 is formed of the barrier film 58, the silicon oxide film 60, the silicon oxide film 61, barrier film 62 and the silicon oxide film 64.

Thermal processing, e.g., of 350° C. and 4 minutes is made in a plasma atmosphere generated with $N_2O$ gas or $N_2$ gas. This thermal processing is for removing water from the silicon oxide film 64 while modifying the film quality of the silicon oxide film 64 to make it difficult for water to intrude into the silicon oxide film 64. This thermal processing nitrides the surface of the silicon oxide film 64, and SiON film (not illustrated) is formed on the surface of the silicon oxide film 64.

Then, by photolithography and dry etching, the contact hole 68 is formed in the silicon oxide film 64, the barrier film 62, the silicon oxide film 61, the silicon oxide film 60 and the barrier film 58 down to the interconnection 56c.

Next, thermal processing, e.g., of 350° C. and 120 minutes is made in an $N_2$ atmosphere.

Next, a TiN film of, e.g., a 50 nm-thickness is formed on the entire surface by, e.g., sputtering. Thus, the barrier metal (not illustrated) is formed of the TiN film.

Next, a tungsten film of, e.g., a 50 nm-thickness is formed on the entire surface by, e.g., CVD.

Figure 33A:
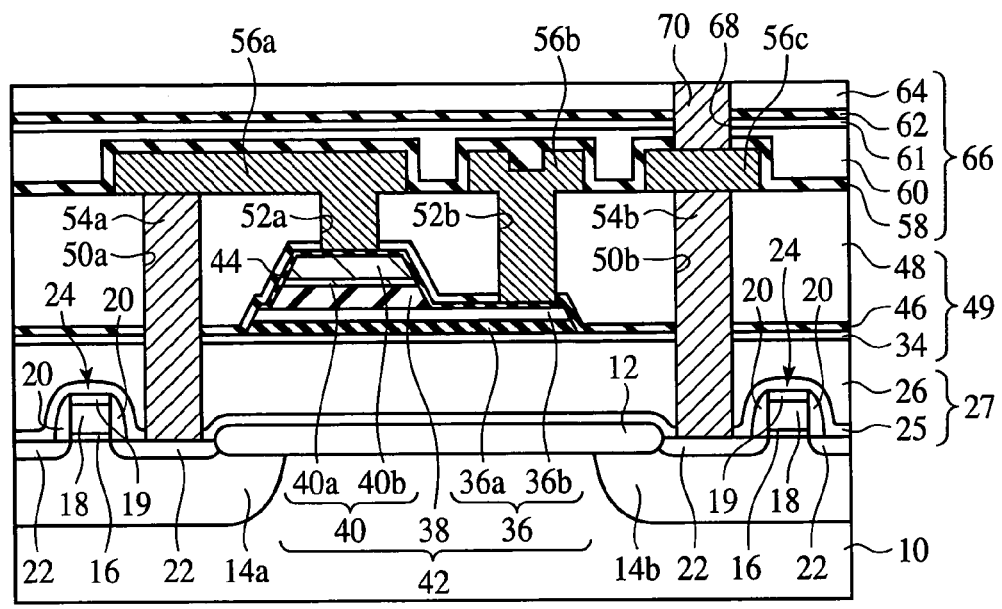
FIGS. 33A-33B are sectional views of the semiconductor device according to the first embodiment in the steps of the method for fabricating the same, which illustrate the method (Part 10).

Then, the tungsten film is etched back by, e.g., EB (Etch Back) method until the surface of the silicon oxide film 64 is exposed. Thus, the conductor plug 70 of the tungsten film is buried in the contact hole 68 (see FIG. 33A).

Next, an AlCu film of, e.g., a 500 nm-thickness, a Ti film of, e.g., a 5 nm-thickness and a TiN film of, e.g., a 150 nm-thickness are sequentially laid the latter on the former. Thus, the conductor film of the TiN film, the AlCu alloy film, the Ti film and the TiN film sequentially laid the latter on the former is formed.

Figure 33B:
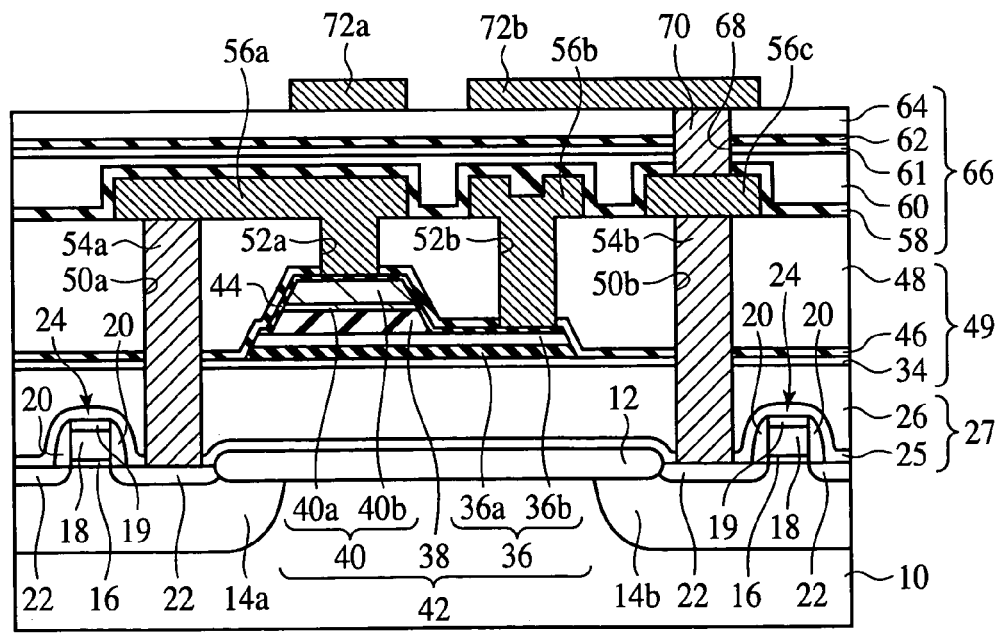

Next, the conductor film is patterned by photolithography and dry etching. Thus, the second metal interconnection layer 72, i.e., the interconnection 72a, and the interconnection 72b electrically connected to the conductor plug 70 is formed (see FIG. 33B). In the dry etching for forming the interconnections 72a, 72b, the silicon oxide film 64 functions as the stopper film for the etching. The silicon oxide film 64 protects the barrier film 62 to prevent the decrease of the film thickness of the barrier film 62 or the removal of the barrier film 62 by the etching for forming the interconnections 72a, 72b. Thus, the barrier film 62 can be prevented from deteriorating the function of preventing the diffusion of hydrogen and water.

Figure 34A:
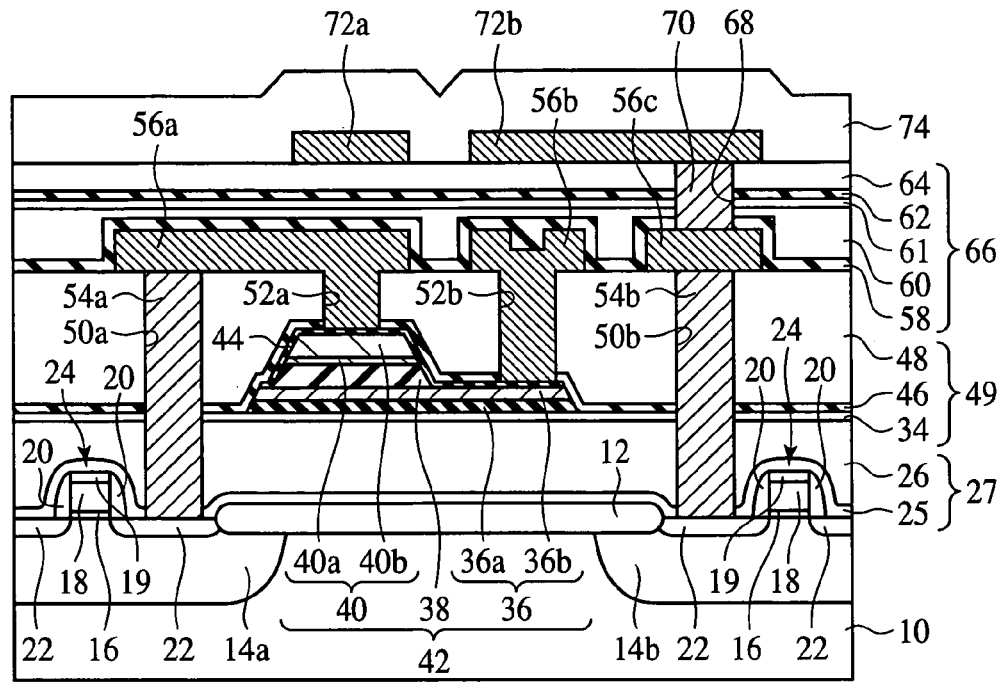
FIGS. 34A-34B are sectional views of the semiconductor device according to the first embodiment in the steps of the method for fabricating the same, which illustrate the method (Part 11).

Next, the silicon oxide film 74 of, e.g., a 2200 nm-thickness is formed on the entire surface by, e.g., plasma TEOS CVD (see FIG. 34A).

Figure 34B:
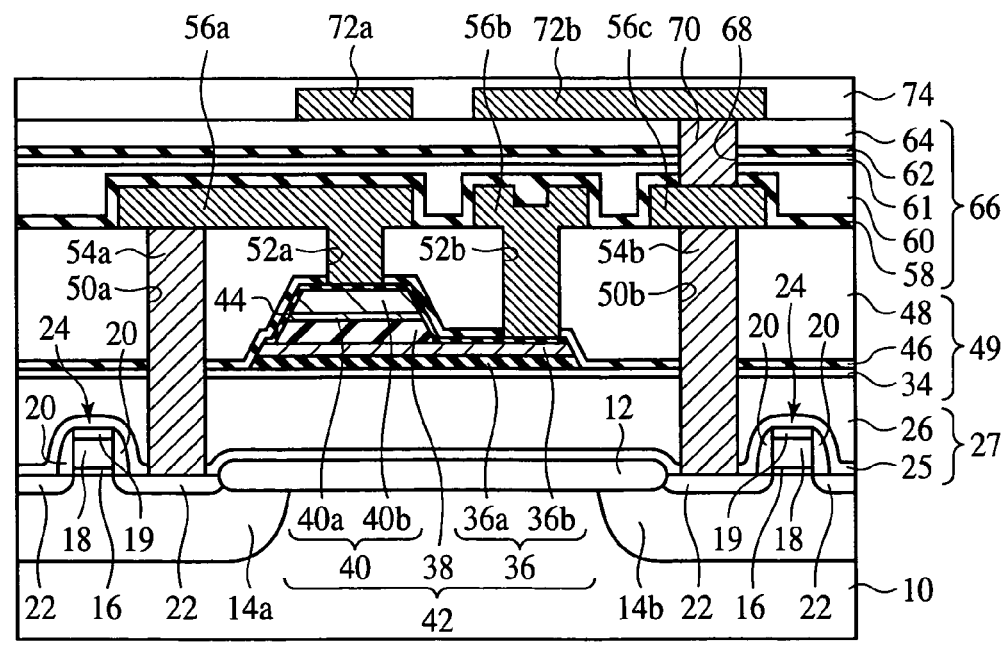

Next, the surface of the silicon oxide film 74 is planarized by, e.g., CMP (see FIG. 34B).

Next, thermal processing, e.g., of 350° C. and 4 minutes is made in a plasma atmosphere generated with $N_2O$ gas or $N_2$ gas. This thermal processing is for removing water in the silicon oxide film 74 while modifying the film quality of the silicon oxide film 74 to make it difficult for water to intrude into the silicon oxide film 74. This thermal processing nitrides the surface of the silicon oxide film 74, and SiON film (not illustrated) is formed on the surface of the silicon oxide film 74.

Next, the silicon oxide film 76 of, e.g., a 100 nm-thickness is formed on the entire surface by, e.g., plasma TEOS CVD. The silicon oxide film 76, which is formed on the planarized silicon oxide film 74, is flat.

Then, thermal processing, e.g., of 350° C. of 2 minutes is made in a plasma atmosphere generated with $N_2O$ gas or $N_2$ gas. This thermal processing is for removing water from the silicon oxide film 76 while modifying the film quality of the silicon oxide film 76 to make it difficult for water to intruded into the silicon oxide film 76. This thermal processing nitrides the surface of the silicon oxide film 76, and SiON film (not illustrated) is formed on the surface of the silicon oxide film 76.

Then, on the flat silicon oxide film 76, the barrier film 78 is formed by, e.g., sputtering or CVD. As the barrier film 78, an aluminum oxide film of, e.g., a 20-70 nm-thickness is formed.

As the barrier film 78, an aluminum oxide film of a 50 nm-thickness is formed here. The barrier film 78, which is formed on the flat silicon oxide film 76, is flat. The barrier film 78 is formed on the silicon oxide film 74 having the surface planarized by CMP with the silicon oxide film 76 formed therebetween. Due to this, the generation of defective parts in the barrier film 78 due to steps, etc. formed in the surface of the silicon oxide film 74 by micro-scratches can be prevented.

Figure 35:
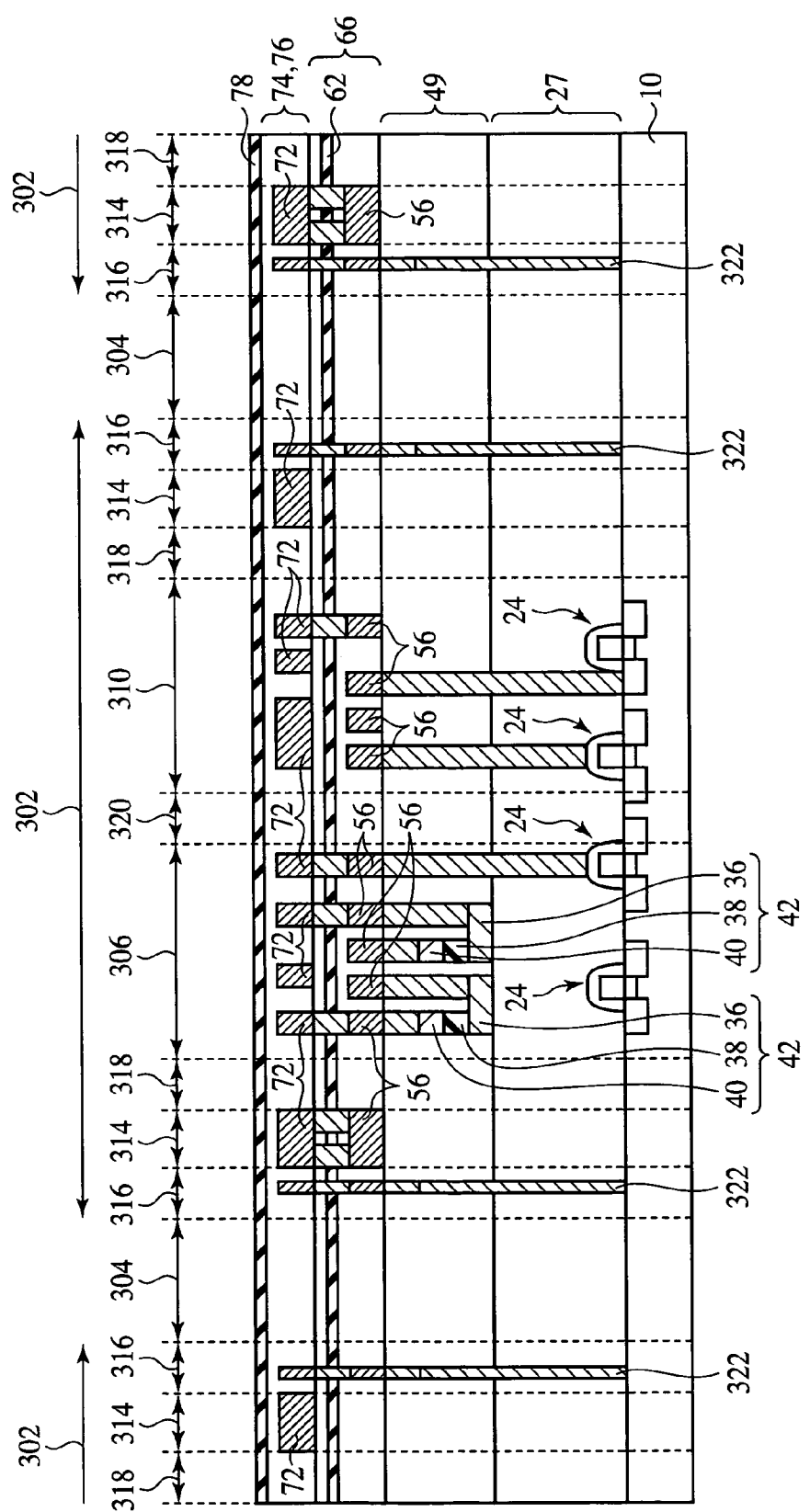
FIG. 35 is a sectional view of the semiconductor device according to the first embodiment in the step of the method for fabricating the same, which illustrate the method (Part 12).

As illustrated in FIG. 35, the barrier film 78 is formed over the FeRAM chip region 302 and the scribe regions 304, and even over the neighboring FeRAM chip regions 302. That is, the barrier film 78 is formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320.

Figure 36A:
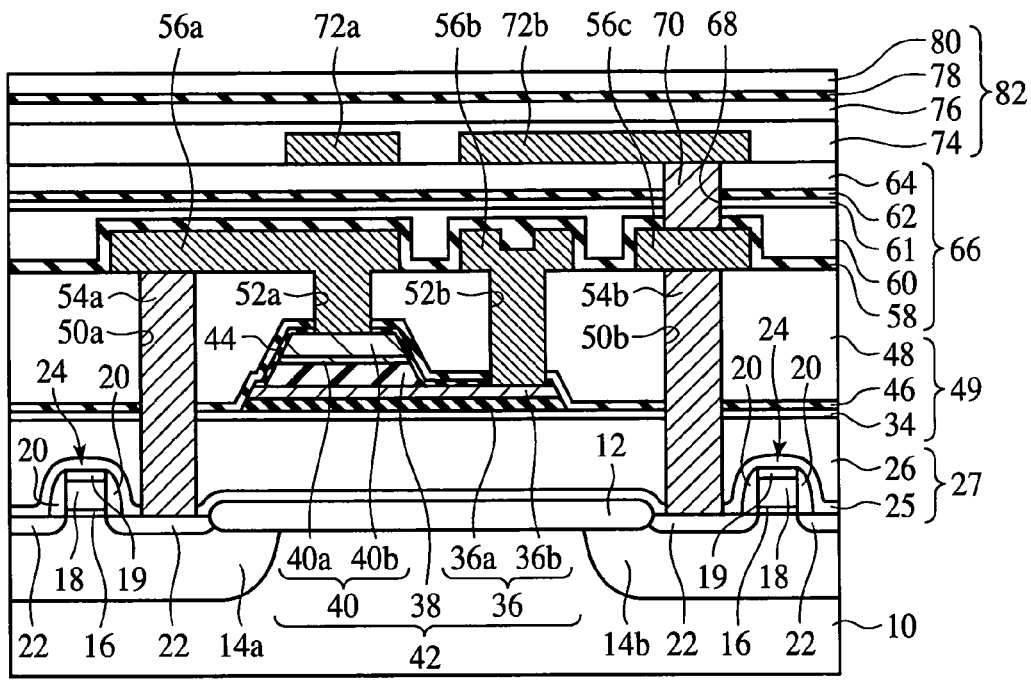
FIGS. 36A-36B are sectional views of the semiconductor device according to the first embodiment in the steps of the method for fabricating the same, which illustrate the method (Part 13).

Then, the silicon oxide film 80 of, e.g., a 100 nm-thickness is formed on the entire surface by, e.g., plasma TEOS CVD (see FIG. 36A).

Thus, the inter-layer insulation film 82 is formed of the silicon oxide film 74, the silicon oxide film 76, the barrier film 78 and the silicon oxide film 80.

Then, thermal processing, e.g., of 350° C. and 2 minutes is made in a plasma atmosphere generated with $N_2O$ gas or $N_2$ gas. This thermal processing is for removing water from the silicon oxide film 80 while modifying the film quality of the silicon oxide film 80 to make it difficult for water to intrude into the silicon oxide film 80. This thermal processing nitrides the surface of the silicon oxide film 80, and SiON film (not illustrated) is formed on the surface of the silicon oxide film 80.

Figure 36B:
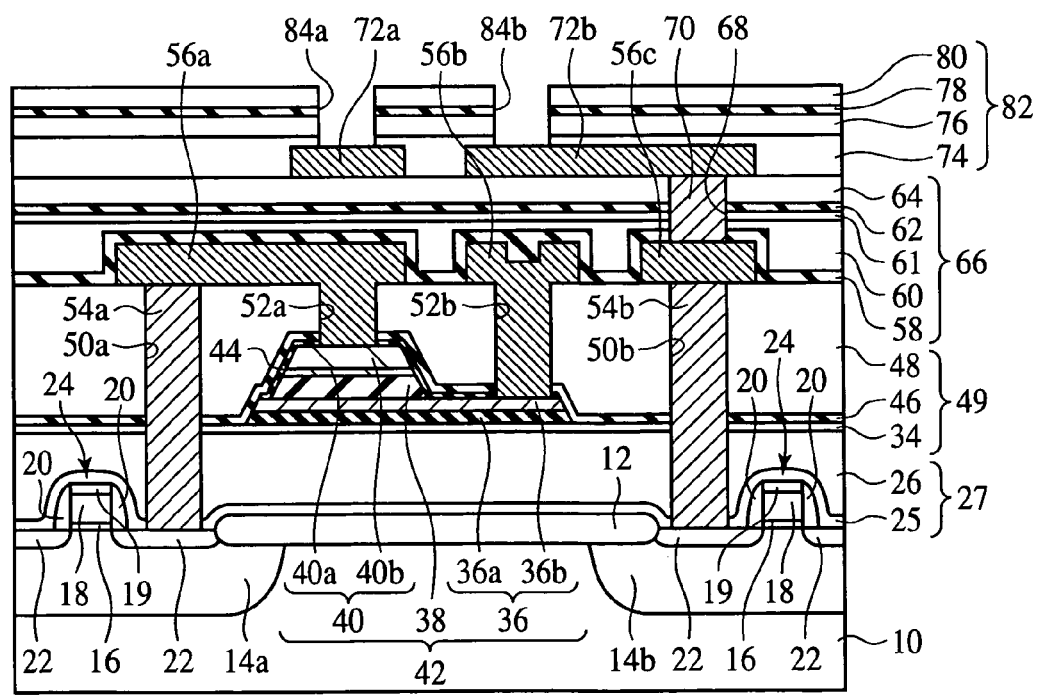

Next, by photolithography and dry etching, the contact holes 84a, 84b are formed in the silicon oxide film 80, the barrier film 78, the silicon oxide film 76 and the silicon oxide film 74 (see FIG. 36B).

Then, thermal processing, e.g., of 350° C. and 120 minutes is made in an $N_2$ atmosphere.

Then, a TiN film of, e.g., a 50 nm-thickness is formed on the entire surface by, e.g., CVD. Thus, the barrier metal film (not illustrated) is formed of the TiN film.

Then, a tungsten film of, e.g., a 500 nm-thickness is formed on the entire surface by, e.g., CVD.

Figure 37A:
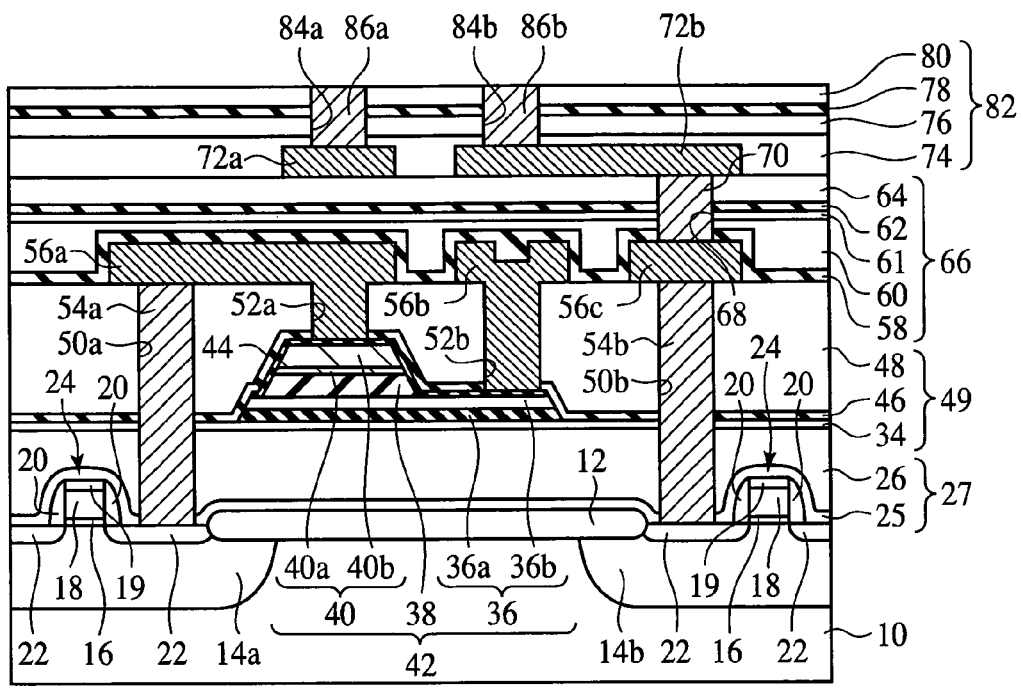
FIGS. 37A-37B are sectional views of the semiconductor device according to the first embodiment in the steps of the method for fabricating the same, which illustrate the method (Part 14).

Next, the tungsten film is etched back by, e.g., EB method until the surface of the silicon oxide film 80 is exposed. Thus, the conductor plugs 86a, 86b of tungsten are buried respectively in the contact holes 84a, 84b (see FIG. 37A).

Next, an AlCu alloy film of, e.g., a 500 nm-thickness and a TiN film of, e.g., a 150 nm-thickness are sequentially laid the latter on the former on the entire surface. Thus, the conductor film of the TiN film, the AlCu film and the TiN film sequentially laid the latter on the former is formed.

Figure 37B:
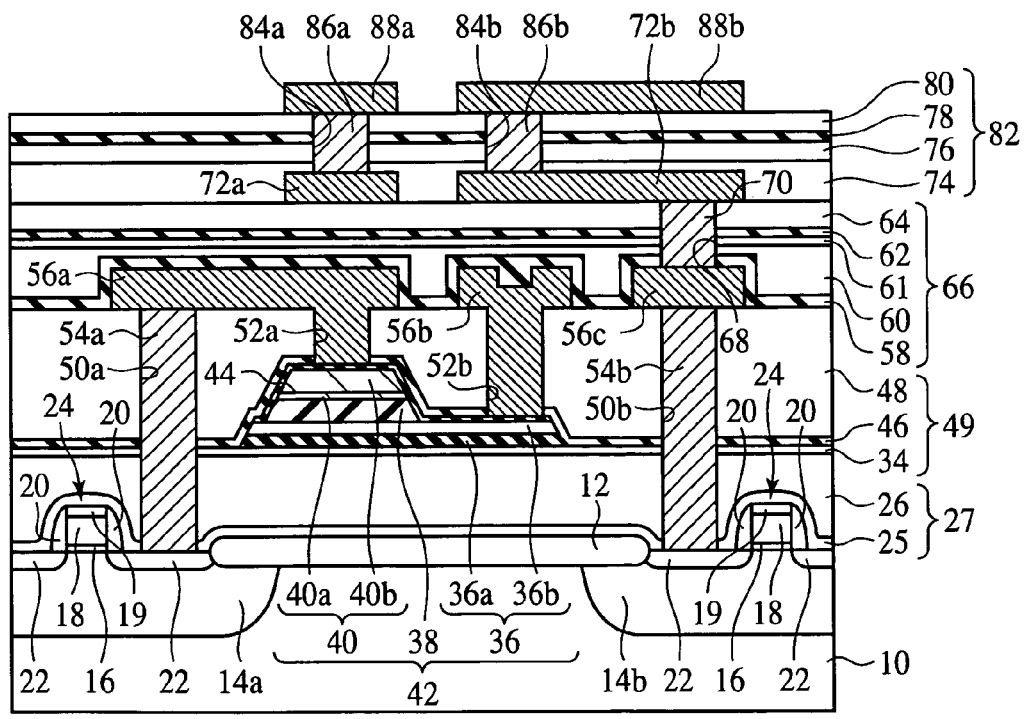

Next, by photolithography and dry etching, the conductor film is patterned. Thus, the third metal interconnection layer 88, i.e., the interconnection 88a electrically connected to the conductor plug 86a and the interconnection 88b electrically connected to the conductor plug 86b is formed (see FIG. 37B). In the dry etching for forming the interconnections 88a, 88b, the silicon oxide film 80 functions as the stopper film for the etching. The silicon oxide film 80 can protect the barrier film 78 to prevent the decrease of the film thickness or the removal of the barrier film 78 by the etching for forming the interconnections 88a, 88b. Thus, the barrier film 78 is prevented from deteriorating the function of preventing the diffusion of hydrogen and water.

Then, the silicon oxide film 90 of, e.g., a 100 nm-thickness is formed on the entire surface by, e.g., plasma TEOS CVD.

Next, thermal processing, e.g., of 350° C. and 2 minutes is made in a plasma atmosphere generated with $N_2O$ gas or $N_2$ gas. This thermal processing is for removing water from the silicon oxide film 90 while modifying the film quality of the silicon oxide film 90 to make it difficult for water to intrude into the silicon oxide film 90. This thermal processing nitrides the surface of the silicon oxide film 90, and SiON film (not illustrated) is formed on the surface of the silicon oxide film 90.

Next, the silicon nitride film 92 of, e.g., a 350 nm-thickness is formed by, e.g., CVD (see FIG. 38A). The silicon nitride film 92 is for blocking water to prevent the corrosion of the metal interconnection layers 88, 72, 56, etc. with water.

Next, a photoresist film 106 is formed on the entire surface by, e.g., spin coating.

Next, by photolithography, an opening 108 for exposing the region where the opening is to be formed in the silicon nitride film 92 and the silicon oxide film 90 down to the interconnection (bonding pad) 88b is formed in the photoresist film 106.

Next, with the photoresist film 106 as the mask, the silicon nitride film 92 and the silicon oxide film 90 are etched. Thus, the opening 96a is formed in the silicon nitride film 92 and the silicon oxide film 90 down to the interconnection (bonding pad) 88b (see FIG. 38B). Then, the photoresist film 106 is removed.

Figure 39A:
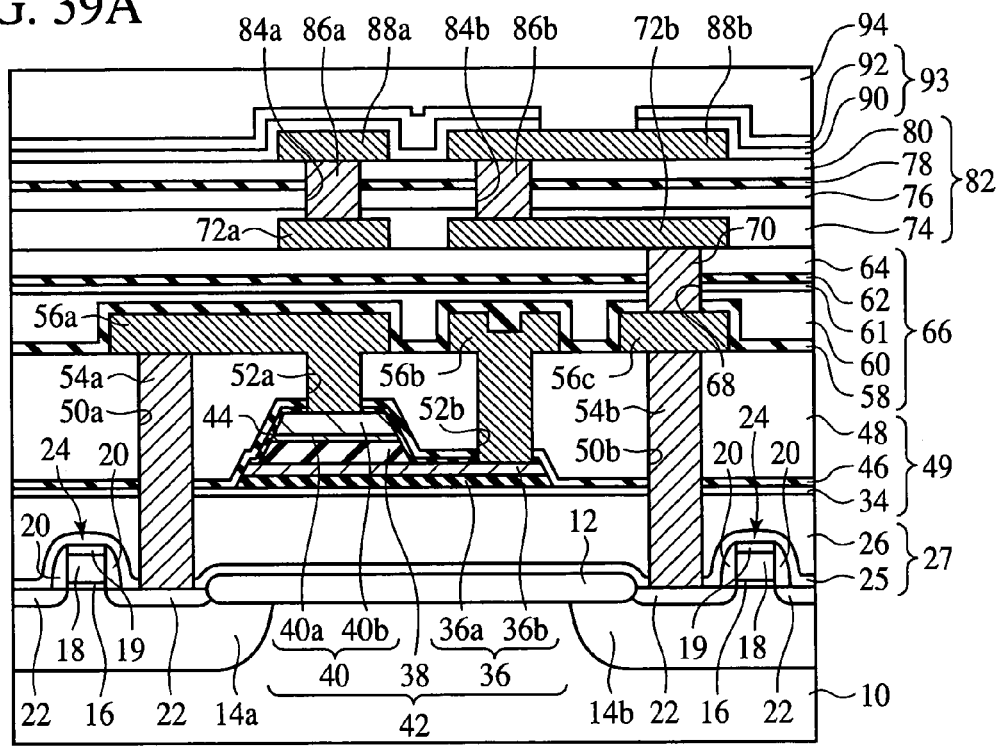
FIGS. 39A-39B are sectional views of the semiconductor device according to the first embodiment in the steps of the method for fabricating the same, which illustrate the method (Part 16).

Next, the polyimide resin film 94 of, e.g., a 2-6 μm-thickness is formed by, e.g., spin coating (see FIG. 39A).

Figure 39B:
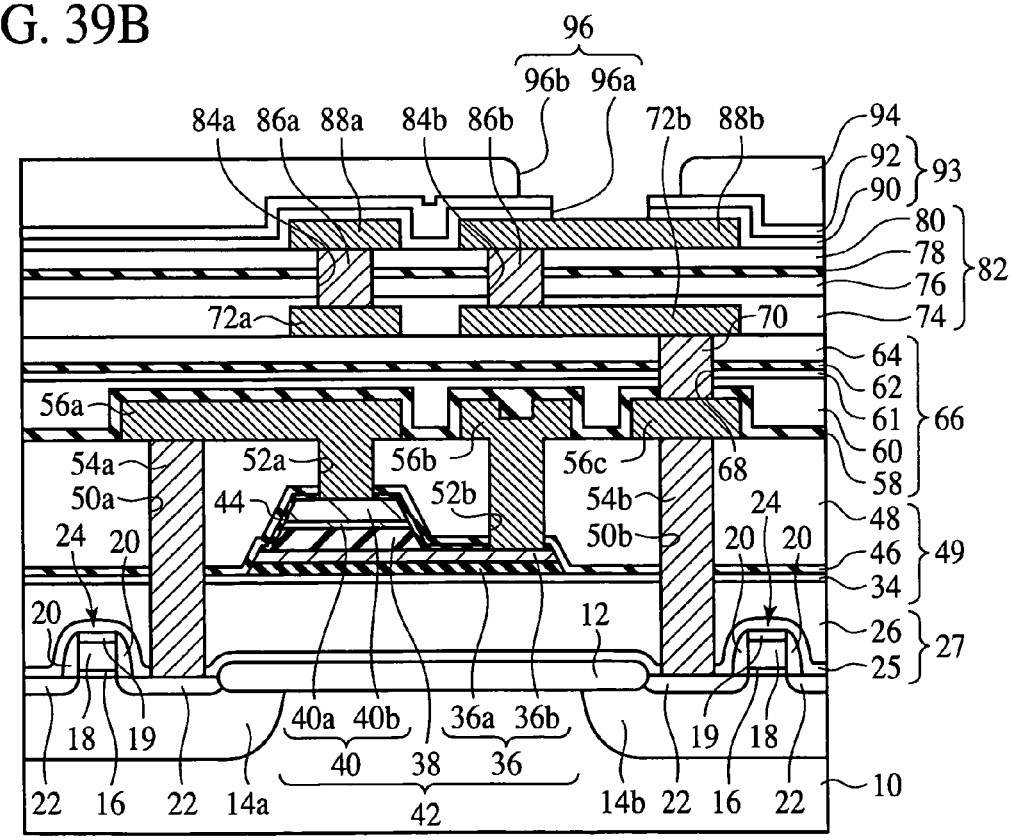

Next, the opening 96b is formed in the polyimide resin film 94 down to the interconnection (bonding pad) 88b by photolithography (see FIG. 39B).

Thus, the semiconductor device according to the present embodiment is fabricated.

(Evaluation Result)

PTHS test was made on the semiconductor device according to the present embodiment to evaluate the PTHS characteristics of the semiconductor device according to the present embodiment. The result of the evaluation will be explained.

In the PTHS test, the FeRAM chips of the semiconductor device according to the present embodiment were stored under the conditions of 2 atmospheric pressure, 121° C. temperature and 100% humidity, and at the respective timings that 168 hours, 336 hours, 504 hours and 672 hours have elapsed, 5 samples of chips using the same wafers were inspected for the presence of defective cells. In the semiconductor device according to the present embodiment subjected to the PTHS test, the barrier film 58 had a 20 nm-thickness, the flat barrier film 62 had a 50 nm-thickness, and the flat barrier film 78 had a 70 nm-thickness.

The PTHS test was made on Controls wherein the flat barrier film 58 is not formed, i.e., only one flat barrier film was formed. In the semiconductor device according to Control 1, the film thickness of the barrier film 58 was 70 nm, and the film thickness of the flat barrier film 78 was 70 nm. In the semiconductor device according to Control 2, the film thickness of the barrier film 58 was 20 nm, and the film thickness of the flat barrier film 78 was 50 nm. The structures of the semiconductor devices according to Controls 1 and 2 were the same as the structure of the semiconductor device according to the present embodiment except that the flat barrier film 58 was not formed.

The result of the PTHS test is as follows.

First, in the present embodiment, all the 5 chip samples had no defective cell at the timings when 168 hours, 336 hours, 504 hours and 672 hours had elapsed.

On the other hand, in Control 1, in a chip sample of the 5 chip samples, 1 defective cell was generated at the timing when 168 hours had elapsed, 3 defective cells were generated at the timing when 336 hours had elapsed, 10 defective cells were generated at the timing when 504 hours had elapsed, and 18 defective cells were generated at the timing when 672 hours had elapsed. In another chip sample, no defective cell was generated until the timings when 168 hours and 336 hours had elapsed, but 1 defective cell was generated at the timing when 504 hours had elapsed, and 26 defective cells were generated at the timing when 672 hours had elapsed. In further another chip sample, no defective cell was generated until the timings when 168 hours and 336 hours had elapsed, but 22 defective cells were generated at the timing when 504 hours had elapsed, and 62 defective cells were generated at the timing when 672 hours had elapsed. At the timings when 168 hours, 336 hours, 504 hours and 672 hours had elapsed, only 2 chip samples out of the 5 chip samples had no defective cell.

In Control 2, in a chip sample of the 5 chip samples, 19 defective cells were generated at the timing when 168 hours had elapsed, 34 defective cells were generated at the timing when 336 hours had elapsed, 51 defective cells were generated at the timing when 504 hours had elapsed, and 72 defective cells were generated at the timing when 672 hours had elapsed. In another chip sample, no defective cell was generated at the timing when 168 hours had elapsed, but 3 defective cells were generated at the timing when 336 hours-had elapsed, 5 defective cells were generated at the timing when 504 hours had elapsed, and 7 defective cells were generated at the timing when 672 hours had elapsed. In further another chip sample, no defective cell was generated at the timing when 168 hours had elapsed, but 3 defective ells were generated at the timing when 336 hours had elapsed, 113 defective cells were generated at the timing when 504 hours had elapsed, and 811 defective cells were generated at the timing when 672 hours had elapsed. In further another chip sample, 106 defective cells were generated at the timing when 168 hours had elapsed, 1690 defective cells were generated at the timing when 336 hours had elapsed, 3253 defective cells were generated at the timing when 504 hours had elapsed, and 5184 defective cells were generated at the timing when 672 hours had elapsed. At the timings when 168 hours, 336 hours, 504 hours and 672 hours had elapsed, only 1 chip sample out of the 5 chip samples had no defective cell.

Based on the result of the PTHS test, it has been confirmed that the present embodiment can much improve the PTHS characteristics of the semiconductor device including the ferroelectric capacitor and can sufficiently exceed the mass-production qualified level of the PTHS test for the FeRAM.

It has been also confirmed that with only one flat barrier film formed, sufficient moisture resistance cannot be ensured, and it is difficult to improve the PTHS characteristics of the semiconductor device including the ferroelectric capacitor.

PTHS test was made on samples having the FeRAM regions alone covered by only one layer of the flat barrier film, but sufficient moisture resistance could not be ensured.

Furthermore, PTHS test was made on samples having the FeRAM region and the logic circuit region covered by only one layer of the flat barrier film, but sufficient moisture resistance could not be ensured.

Furthermore, PTHS test was made on samples having the FeRAM region, the logic circuit region and the pad region covered by only one layer of the flat barrier film. The moisture resistance was a little improved but was not sufficient.

Furthermore, PTHS test was made on samples having the FeRAM region, the logic circuit region, pad region and the scribe region covered by only one layer of the flat barrier film. The moisture resistance was a little improved but was not sufficient.

As described above, according to the present embodiment, the semiconductor device includes, as the barrier films for preventing the diffusion of hydrogen and water, the flat barrier film 62 formed between the first metal interconnection layer 56 formed above the ferroelectric capacitor 42 and the second metal interconnection 72 and the flat barrier film 78 formed between the second metal interconnection layer 72 and the third metal interconnection layer 88, in addition to the barrier films 44, 46, 58, whereby hydrogen and water are surely barriered to surely prevent the hydrogen and water from arriving at the ferroelectric film 38 of the ferroelectric capacitor 42. Thus, the deterioration of the electric characteristics of the ferroelectric capacitor 42 due to hydrogen and water can be surely prevented, and the PTHS characteristics of the semiconductor device including the ferroelectric capacitor can be much improved.

A Second Embodiment

Figure 40:
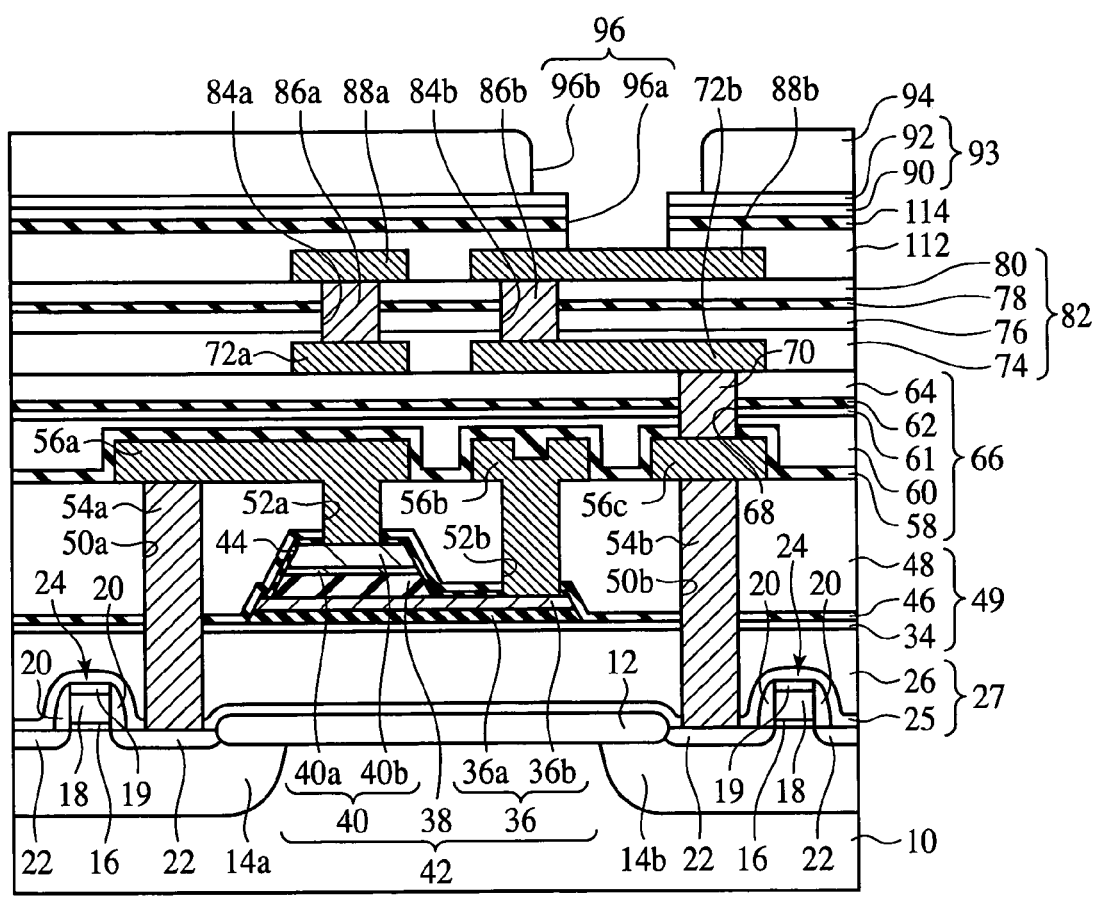
FIG. 40 is a sectional view of the semiconductor device according to a second embodiment of the present invention, which illustrates a structure thereof (Part 1).
Figure 41:
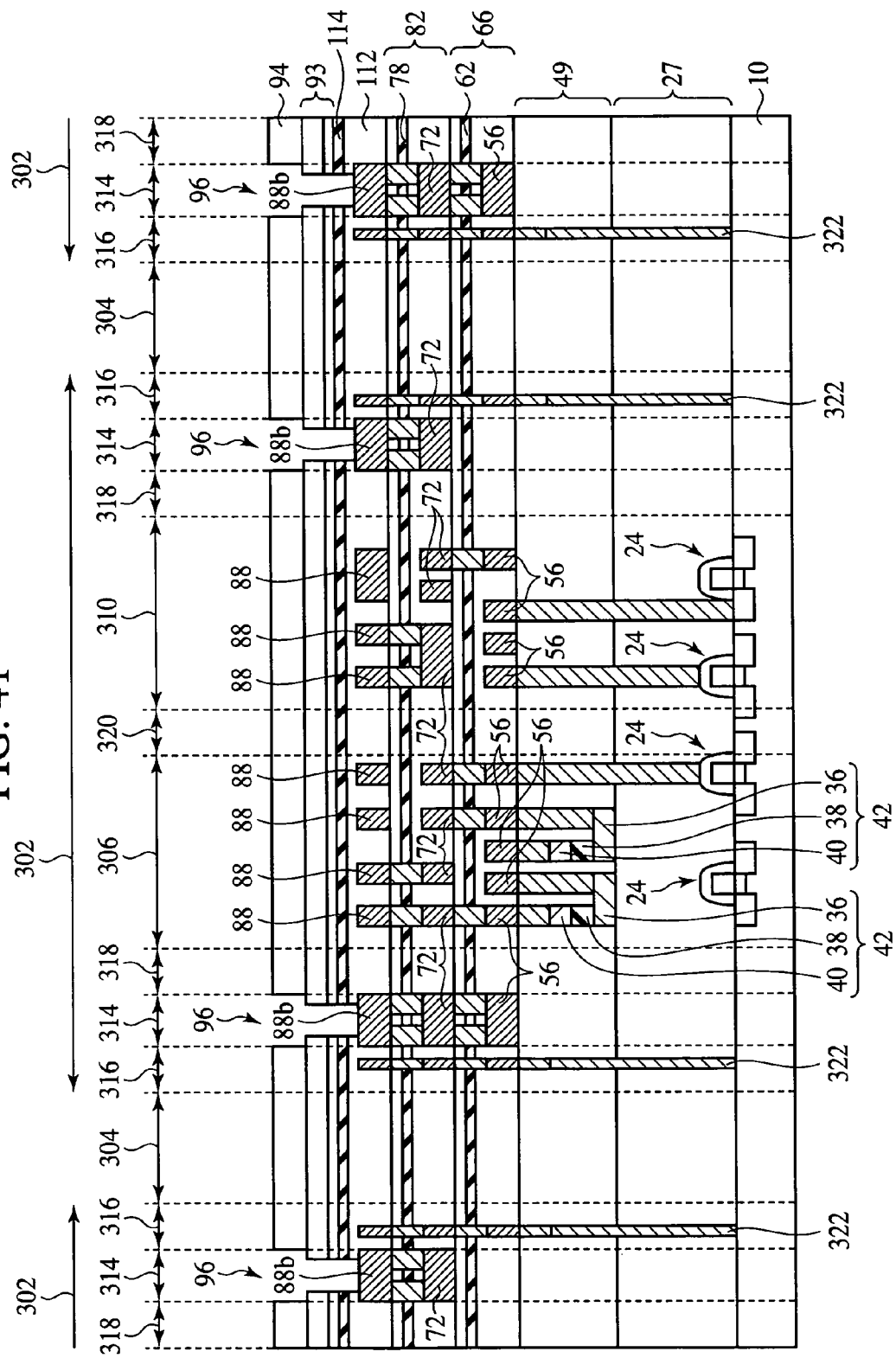
FIG. 41 is a sectional view of the semiconductor device according to the second embodiment of the present invention, which illustrates the structure thereof (Part 2).
Figure 42:
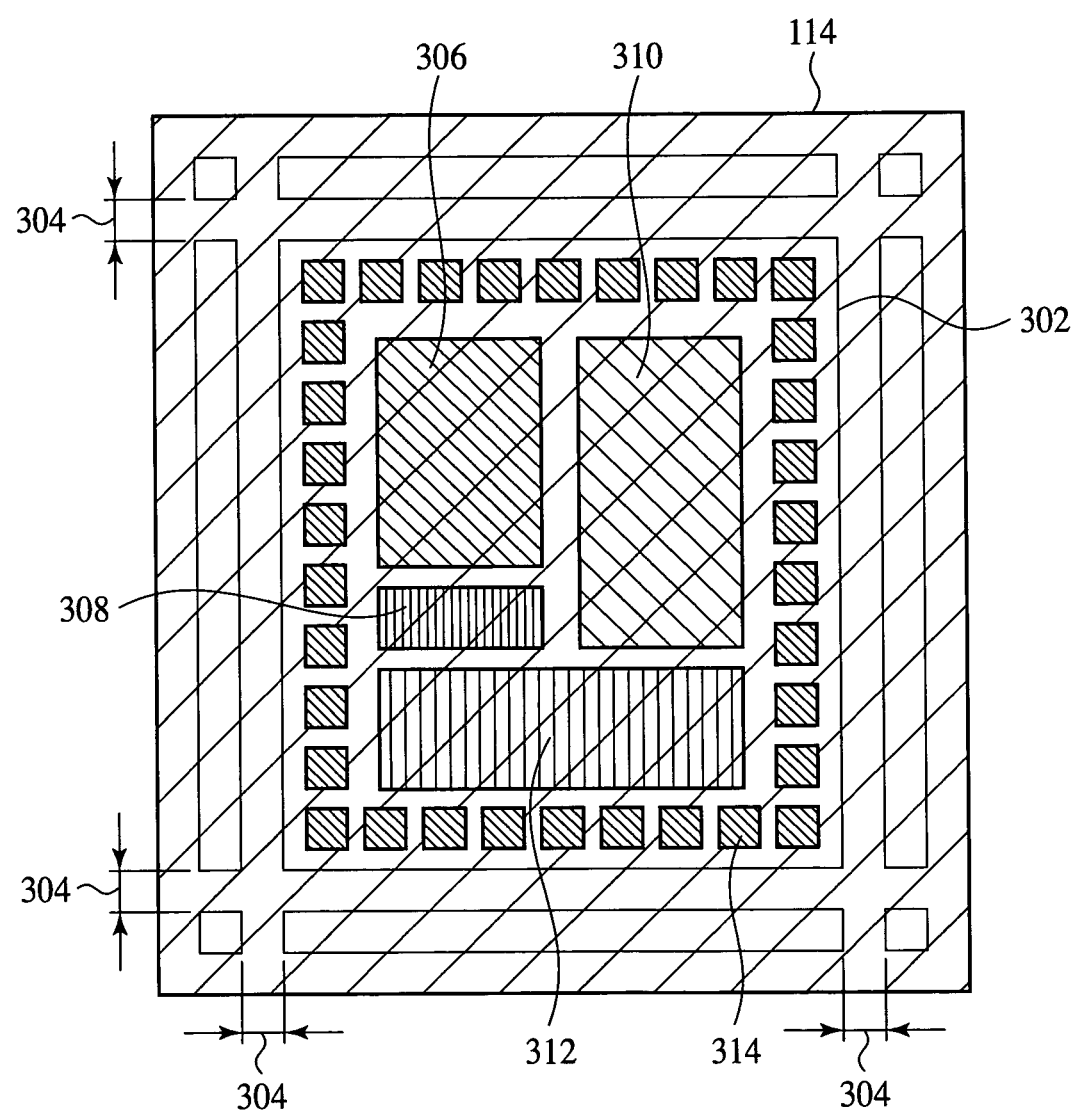
FIG. 42 is a plan view illustrating the area where the barrier film is formed in the semiconductor device according to the second embodiment of the present invention.

The semiconductor device and method for fabricating the same according to a second embodiment of the present invention will be explained with reference to FIGS. 40 to 46A-46B. FIGS. 40 and 41 are sectional views of the semiconductor device according to the present embodiment, which illustrate a structure thereof. FIG. 42 is a plan view illustrating the area where the barrier film is formed in the semiconductor device according to the present embodiment. FIGS. 43A-43B to 46A-46B are sectional views of the semiconductor device according to the present embodiment in the steps of the method for fabricating the same. The same members of the present embodiment as the semiconductor device and the method for fabricating the same according to the first embodiment are represented by the same reference numbers not to repeat or to simplify their explanation.

(The Semiconductor Device)

The basic structure of the semiconductor device according to the present embodiment is substantially the same as that of the semiconductor device according to the first embodiment. The semiconductor device according to the present embodiment is different from the semiconductor device according to the first embodiment in that the semiconductor device according to the present embodiment further includes a barrier film 114 formed above the third metal interconnection layer 88 (interconnections 88a, 88b).

That is, as illustrated in FIG. 40, a silicon oxide film 112 of, e.g., a 1500 nm-thickness is formed on an inter-layer insulation film 82 and on interconnections 88a, 88b. The silicon oxide film 112 has the surface planarized by, e.g., CMP after formed and remains in, e.g., a 350 nm-thickness on the interconnection 88b.

The barrier film 114 is formed on the planarized silicon oxide film 112. As the barrier film 114, an aluminum oxide film of, e.g., a 20-70 nm-thickness is used. The barrier film 114, which is formed on the planarized silicon oxide film 112, is flat.

The barrier film 114 has the function of preventing the diffusion of hydrogen and water, as do the barrier films 44, 46, 58, 62, 78. Furthermore, the barrier film 114, which is formed on the planarized silicon oxide film 112, is flat and, as do the barrier films 62, 78, has very good coverage in comparison with the barrier films 44, 46, 58. Accordingly, the diffusion of hydrogen and water can be more surely prevented by such flat barrier film 114. Actually, the barrier film 114 is formed, as are the barrier films 62, 78, not only over the FeRAM cell region 306, where a plurality of the memory cells including the ferroelectric capacitors 42 are laid out, and also over the FeRAM chip region 302 and the scribe region 304, and further over the neighboring FeRAM chip regions 302. This will be described later.

A silicon oxide film 90 of, e.g. a 50-150 nm-thickness is formed on the barrier film 114. The silicon oxide film 90 functions as the stopper film for etching the interconnections not illustrated. The silicon oxide film 90 protects the barrier film 114 to prevent the decrease of the film thickness or the removal of the barrier film 114 by the etching for forming the interconnection layer. Thus, the barrier film 114 is prevented from deteriorating the function of preventing the diffusion of hydrogen and water.

A silicon nitride film 92 of, e.g., a 350 nm-thickness is formed on the silicon oxide film 90.

A polyimide resin film 94 of, e.g. a 3-6 μm thickness is formed on the silicon nitride film 92.

An opening 96 is formed in the polyimide resin film 94, the silicon nitride film 92, the silicon oxide film 90, the barrier film 114 and the silicon oxide film 112 down to an interconnection (bonding pad) 88b. That is, an opening 96a is formed in the silicon nitride film 92, the silicon oxide film 90, the barrier film 114 and the silicon oxide film 112 down to the interconnection (bonding pad) 88b. An opening 99b is formed in the polyimide resin film 94 in the region containing the opening 96a formed in the silicon nitride film 92, the silicon oxide film 90, the barrier film 114 and the silicon oxide film 112.

As illustrated in FIGS. 41 and 42, the barrier film 114 is formed, as are the barrier films 62, 78, over the FeRAM chip region 302 and the scribe regions 304 and also over the neighboring FeRAM chip regions 302. That is, the barrier film 114 is formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320.

As described above, the semiconductor device according to the present embodiment is characterized mainly in that the semiconductor device includes, as the barrier films, the flat barrier film 62 formed between the first metal interconnection layer 56 (interconnections 56a, 56b, 56c) formed above the ferroelectric capacitor 42 and the second metal interconnection layer 72 (interconnections 72a, 72b), the flat barrier film 78 formed between the second metal interconnection layer 72 (interconnections 72a, 72b) and the third metal interconnection layer 88 (interconnections 88a, 88b), and the flat barrier film 114 formed above the third metal interconnection layer 88 (interconnections 88a, 88b), in addition to the barrier films 44, 46, 58.

In the semiconductor device according to the present embodiment, because of the flat barrier film 114 formed above the third metal interconnection layer 88 in addition to the flat barrier films 62, 78 of the semiconductor device according to the first embodiment, hydrogen and water can be more surely barriered, and the arrival of the hydrogen and water at the ferroelectric film 38 of the ferroelectric capacitor 42 can be more surely prevented. Thus, the deterioration of the electric characteristics of the ferroelectric capacitor 42 due to hydrogen and water can be more surely prevented, and the PTHS characteristics of the semiconductor device including the ferroelectric capacitor can be much improved.

Furthermore, in the semiconductor device according to the present embodiment, the flat barrier films 62, 78, 114 are formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320, whereby the electric characteristics of the ferroelectric capacitor 42 due to hydrogen and water can be more surely prevented.

(The Method for Fabricating the Semiconductor Device)

Next, the method for fabricating the semiconductor device according to the present embodiment will be explained with reference to FIGS. 43A-43B to 46A-46B.

First, in the same way as in the method for fabricating the semiconductor device according to the first embodiment illustrated in FIGS. 24A-24C to 37A-37B, the semiconductor device is fabricated up to the third metal interconnection layer (interconnections 88a, 88b).

Figure 43A:
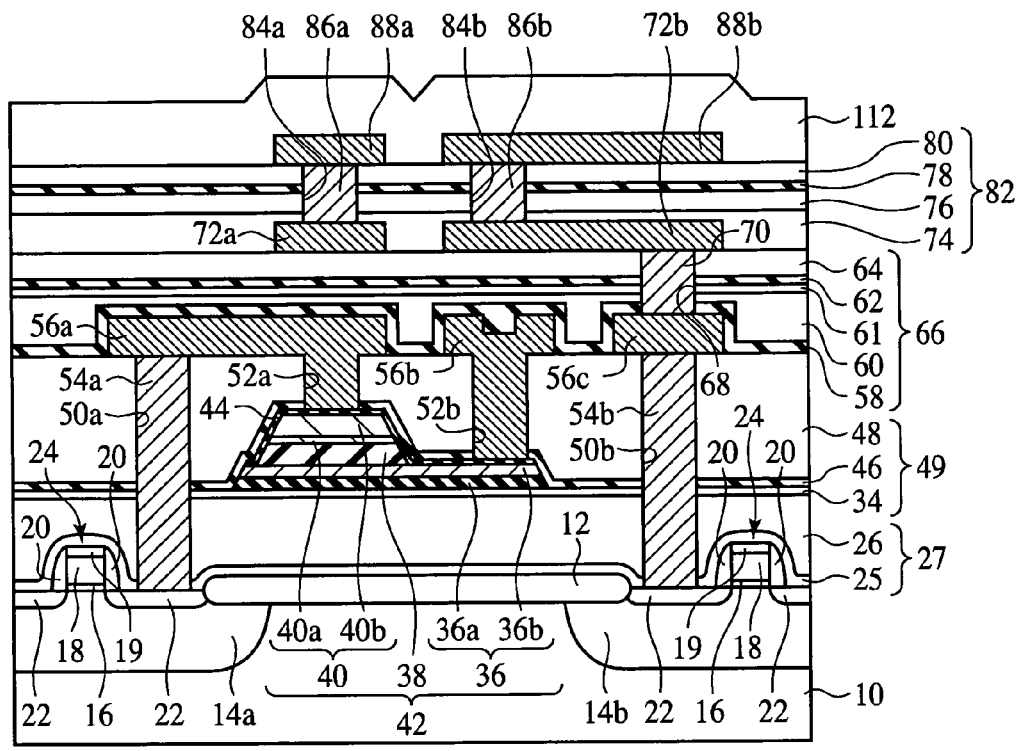
FIGS. 43A-43B are sectional views of the semiconductor device according to the second embodiment of the present invention in the steps of the method for fabricating the same (Part 1).

Then, the silicon oxide film 112 of, e.g., a 1500 nm-thickness is formed on the entire surface by, e.g., plasma TEOS CVD (see FIG. 43A).

Figure 43B:
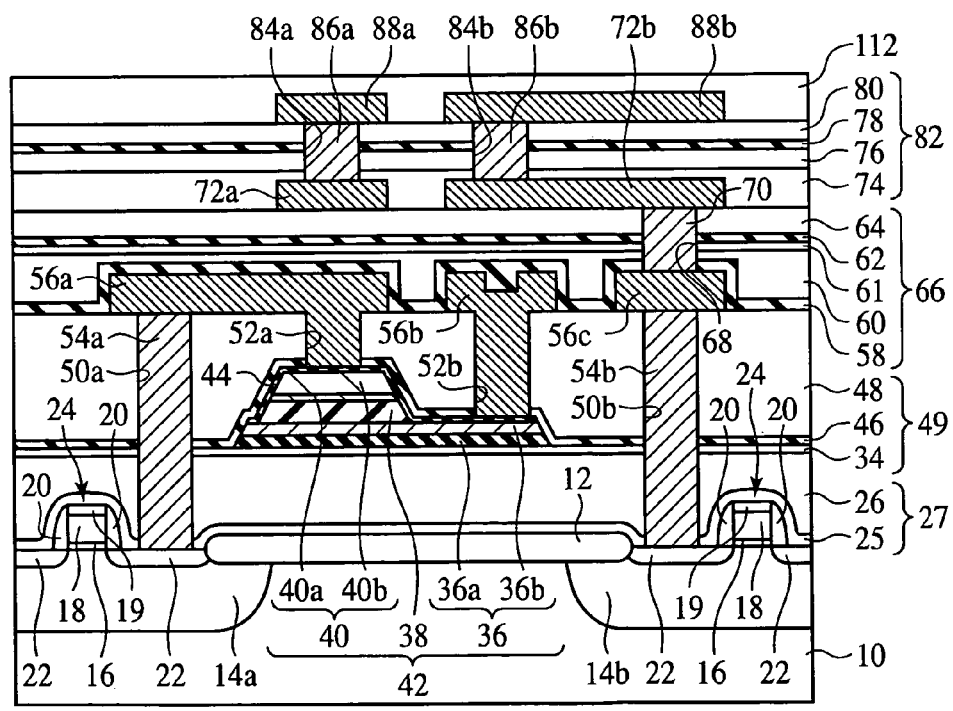

Then, the surface of the silicon oxide film 112 is planarized by, e.g., CMP (see FIG. 43B).

Next, thermal processing e.g., of 350° C. and 4 minutes is made in a plasma atmosphere generated with $N_2O$ gas or $N_2$ gas. This thermal processing is for removing water from the silicon oxide film 112 while modifying the film quality of the silicon oxide film 112 to make it difficult for water to intrude into the silicon oxide film 112. This thermal processing nitrides the surface of the silicon oxide film 112, and SiON film (not illustrated) is formed on the surface of the silicon oxide film 112.

Next, on the planarized silicon oxide film 112, the barrier film 114 is formed by, e.g., sputtering or CVD. As the barrier film 114, an aluminum oxide film of, e.g., a 20-70 nm-thickness is formed. The barrier film 114, which is formed on the planarized silicon oxide film 112, is flat.

Figure 44:
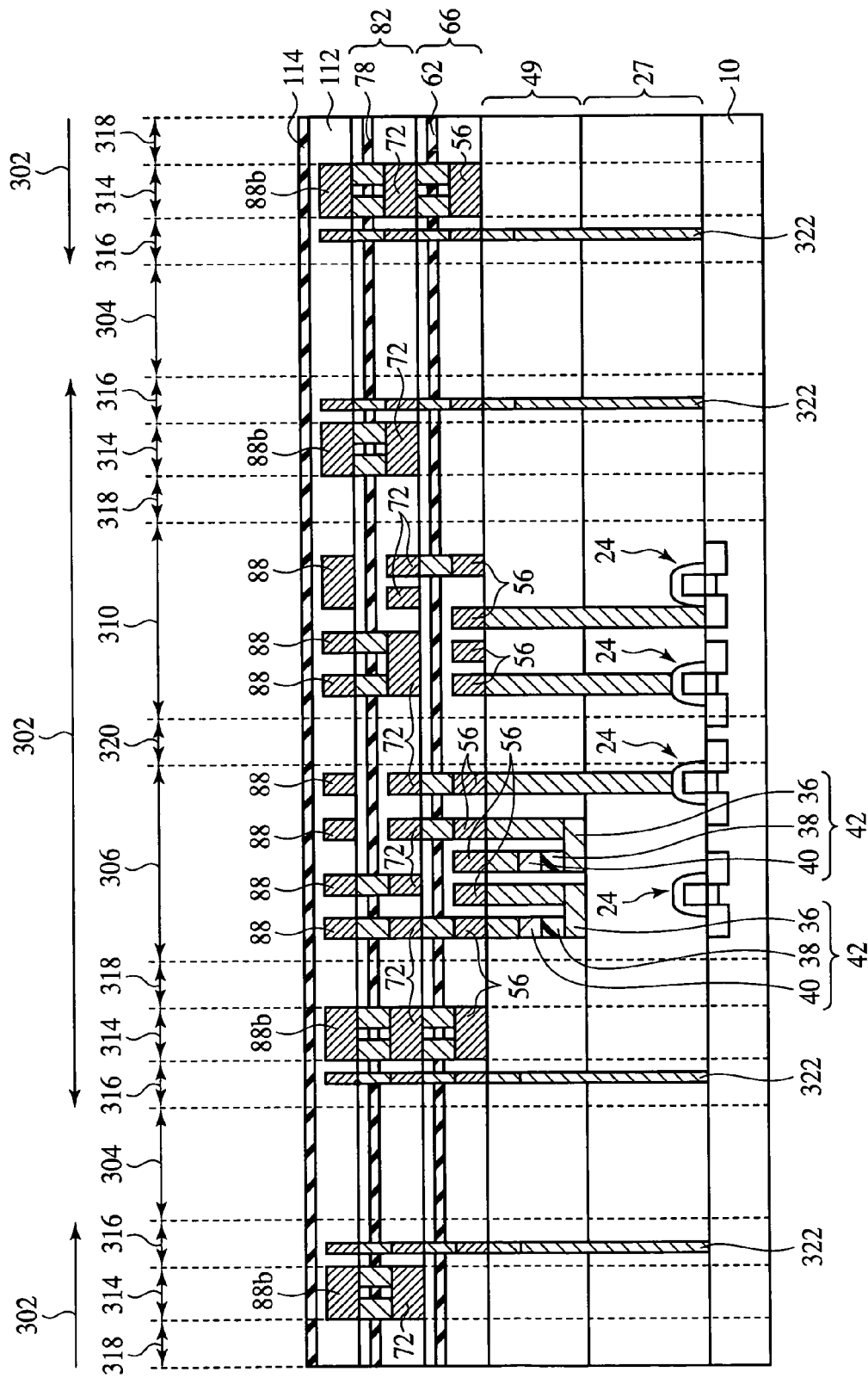
FIG. 44 is a sectional view of the semiconductor device according to the second embodiment of the present invention in the step of the method for fabricating the same, which illustrates the method (Part 2).

As illustrated in FIG. 44, the barrier film 114 is formed over the FeRAM chip region 302 and the scribe regions 304, and even over the neighboring FeRAM chip regions 302. That is, the barrier film 114 is formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320.

Then, the silicon oxide film 90 of, e.g., a 100 nm-thickness is formed on the entire surface by, e.g., plasma TEOS CVD.

Next, thermal processing, e.g., of 350° C. and 2 minutes is made in a plasma atmosphere generated with $N_2O$ gas and $N_2$ gas. This thermal processing is for removing water from the silicon oxide film 90 while modifying the film quality of the silicon oxide film 90 to make it difficult for water to intrude into the silicon oxide film 90. This thermal processing nitrides the surface of the silicon oxide film 90, and an SiON film (not illustrated) is formed on the surface of the silicon oxide film 90.

Figure 45A:
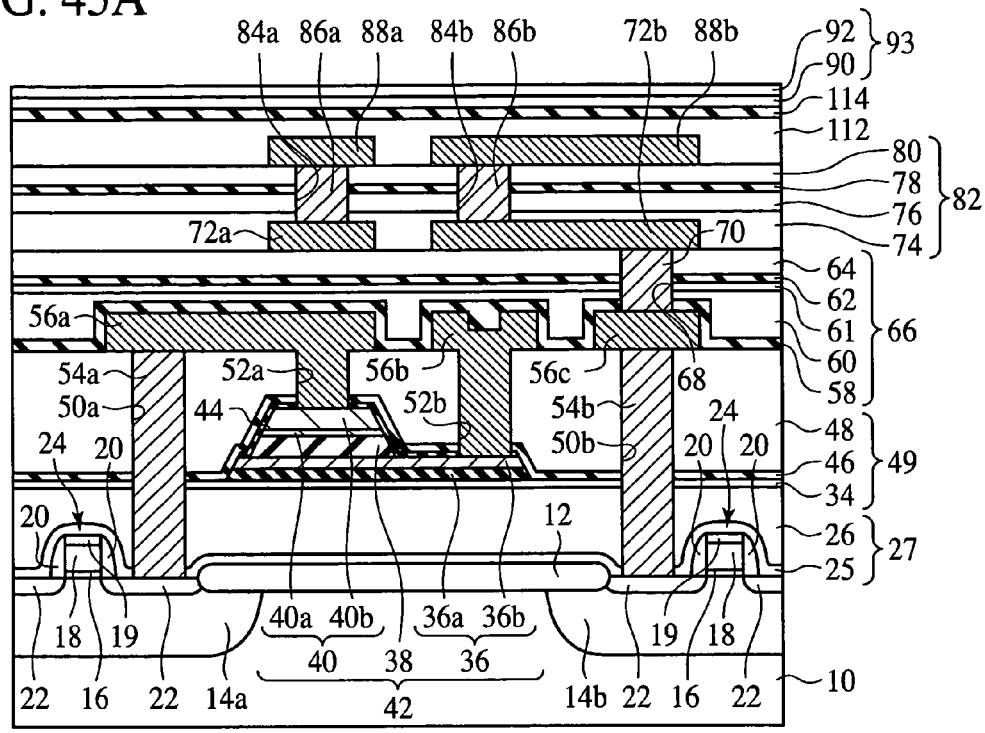
FIGS. 45A-45B are sectional views of the semiconductor device according to the second embodiment of the present invention in the steps of the method for fabricating the same, which illustrate the method (Part 3).
Figure 45B:
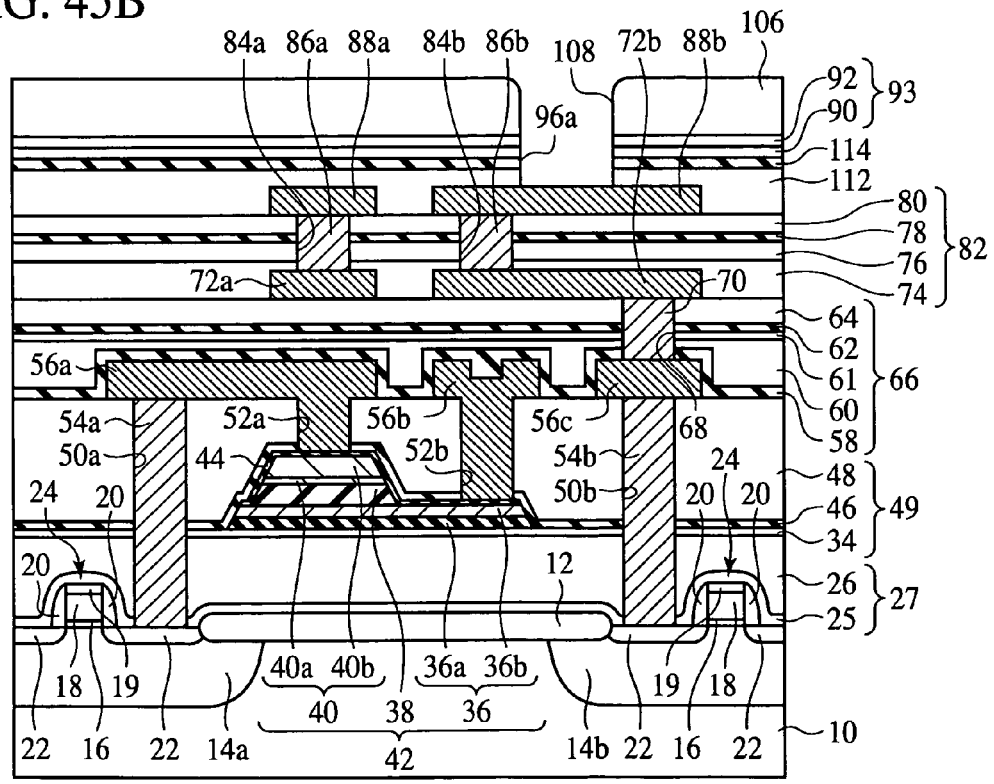

Then, the silicon nitride film 92 of, e.g., a 350 nm-thickness is formed by, e.g., CVD (see FIG. 45A). The silicon nitride film 92 is for blocking water to prevent the corrosion of the metal interconnection layers 88, 72, 56, etc. due to the water.

Next, a photoresist film 106 is formed on the entire surface by, e.g., spin coating.

Then, by photolithography, an opening 108 for exposing the region where the opening is to be formed in the silicon nitride film 92, the silicon oxide film 90, the barrier film 114 and the silicon oxide film 112 down to the interconnection (bonding pad) 88b is formed in the photoresist film 106.

Then, with the photoresist film 106 as the mask, the silicon nitride film 92, the silicon oxide film 90, the barrier film 114 and silicon oxide film 112 are etched. Thus, the opening 96a is formed in the silicon nitride film 92, the silicon oxide film 90, the barrier film 114 and the silicon oxide film 112 down to the interconnection (bonding pad) 88b (see FIG. 45B). Then, the photoresist film 106 is removed.

Figure 46A:
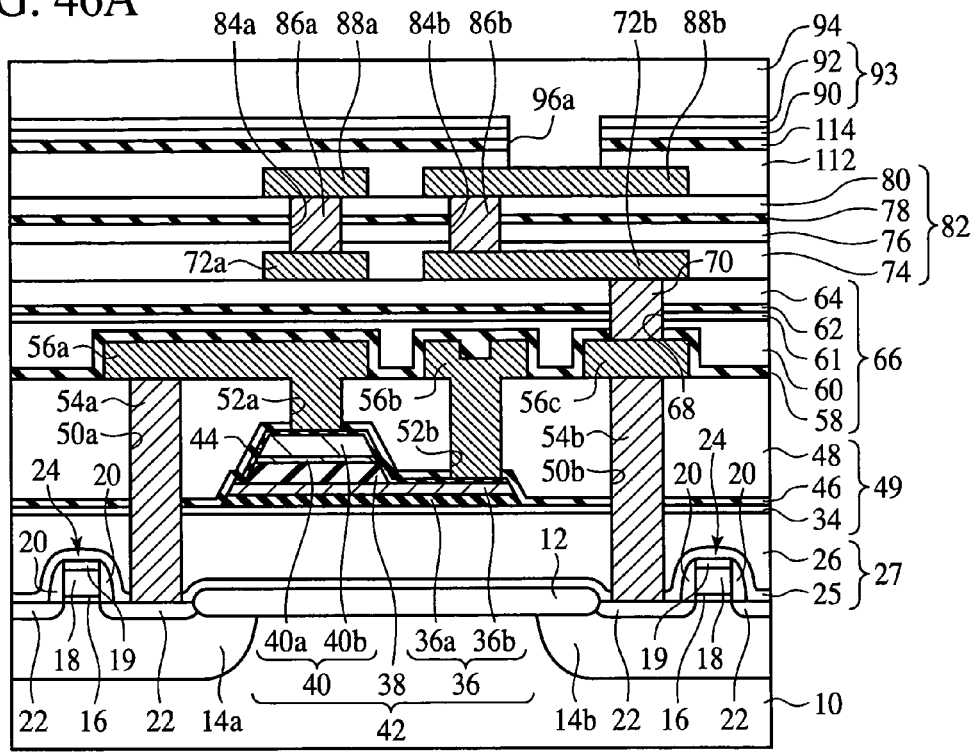
FIGS. 46A-46B are sectional views of the semiconductor device according to the second embodiment of the present invention in the steps of the method for fabricating the same, which illustrate the method (Part 4).

Next, the polyimide resin film 94 of, e.g., a 3-6 μm-thickness is formed by, e.g., spin coating (see FIG. 46A).

Figure 46B:
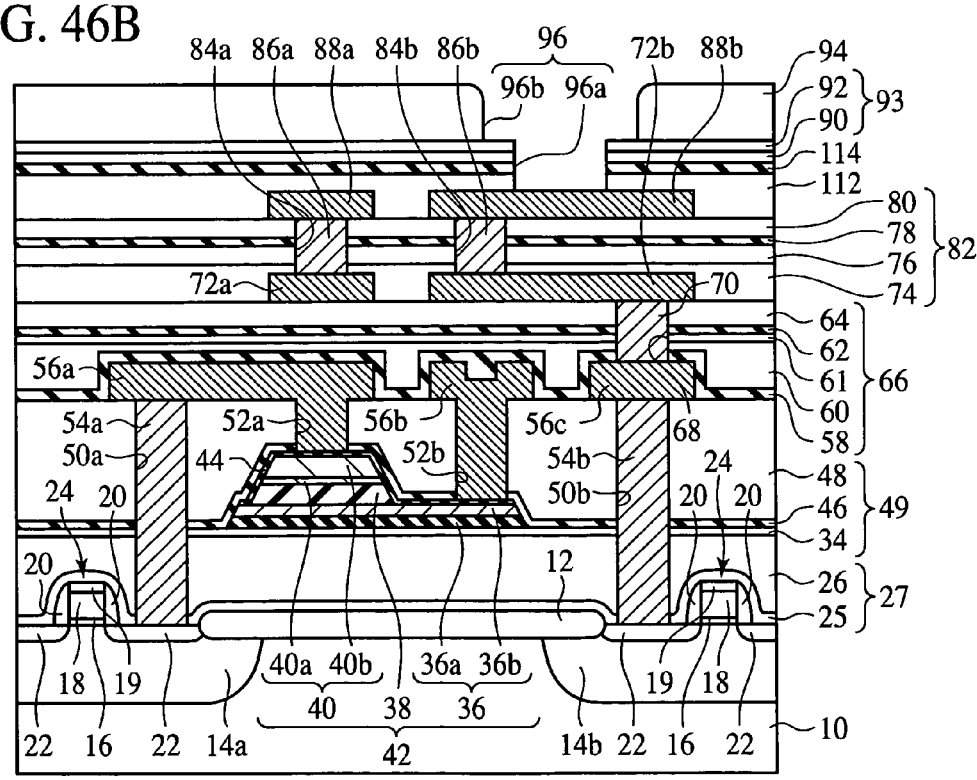

Next, by photolithography, in the polyimide resin film 94, the opening 96b is formed down to the interconnection (bonding pad) 88b through the opening 96a (see FIG. 46B).

Thus, the semiconductor device according to the present embodiment is fabricated.

As described above, according to the present embodiment, the semiconductor device includes, as the barrier films for preventing the diffusion of hydrogen and water, in addition to the barrier films 44, 46, 58, the flat barrier film 62 formed between the first metal interconnection layer 56 formed above the ferroelectric capacitor 42 and the second metal interconnection layer 72, the flat barrier film 78 formed between the second metal interconnection layer 72 and the third metal interconnection layer 88, and the flat barrier film 114 formed above the third metal interconnection layer 88, whereby hydrogen and water are more surely barriered to more surely prevent the arrival of the hydrogen and water at the ferroelectric film 38 of the ferroelectric capacitor 42. Thus, the deterioration of the electric characteristics of the ferroelectric capacitor 42 due to hydrogen and water can be surely prevented, and the PTHS characteristics of the semiconductor device including the ferroelectric capacitor can be more improved.

A Third Embodiment

Figure 47:
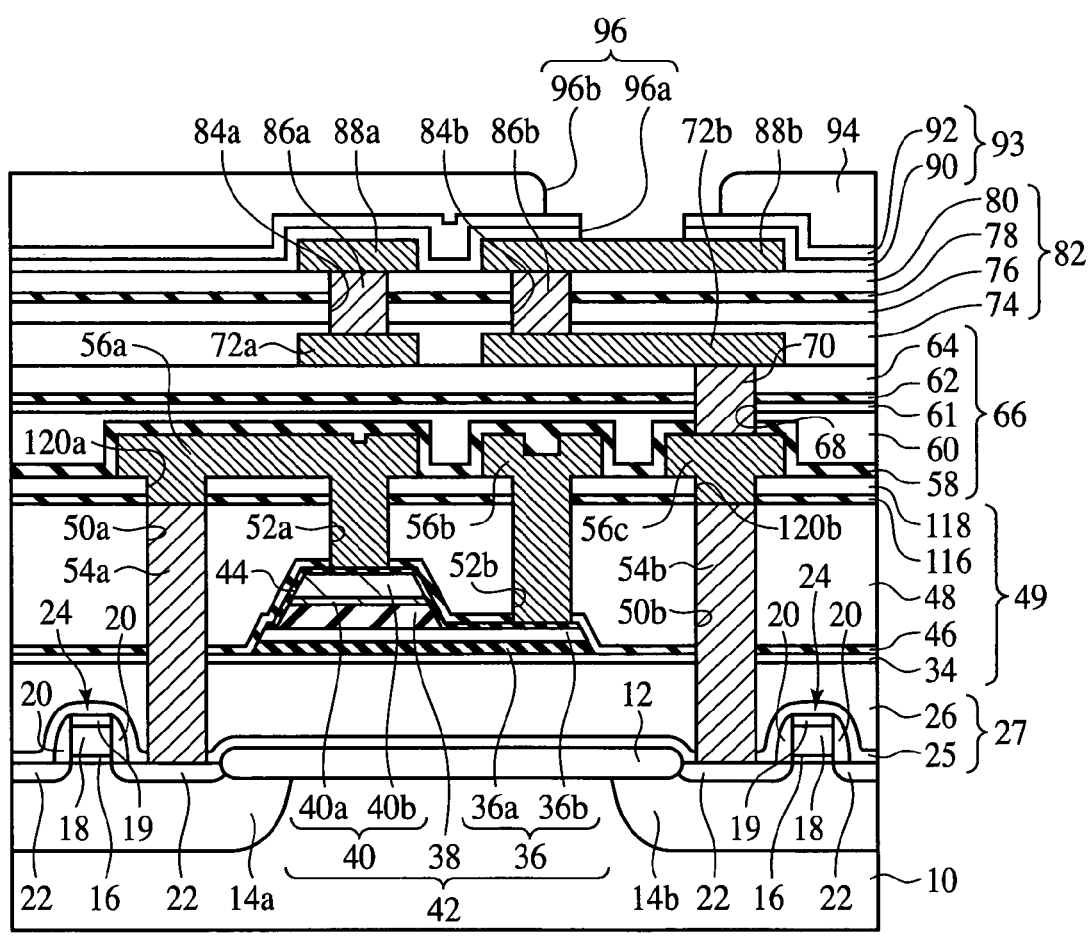
FIG. 47 is a sectional view of the semiconductor device according to a third embodiment of the present invention, which illustrates a structure thereof (Part 1).
Figure 48:
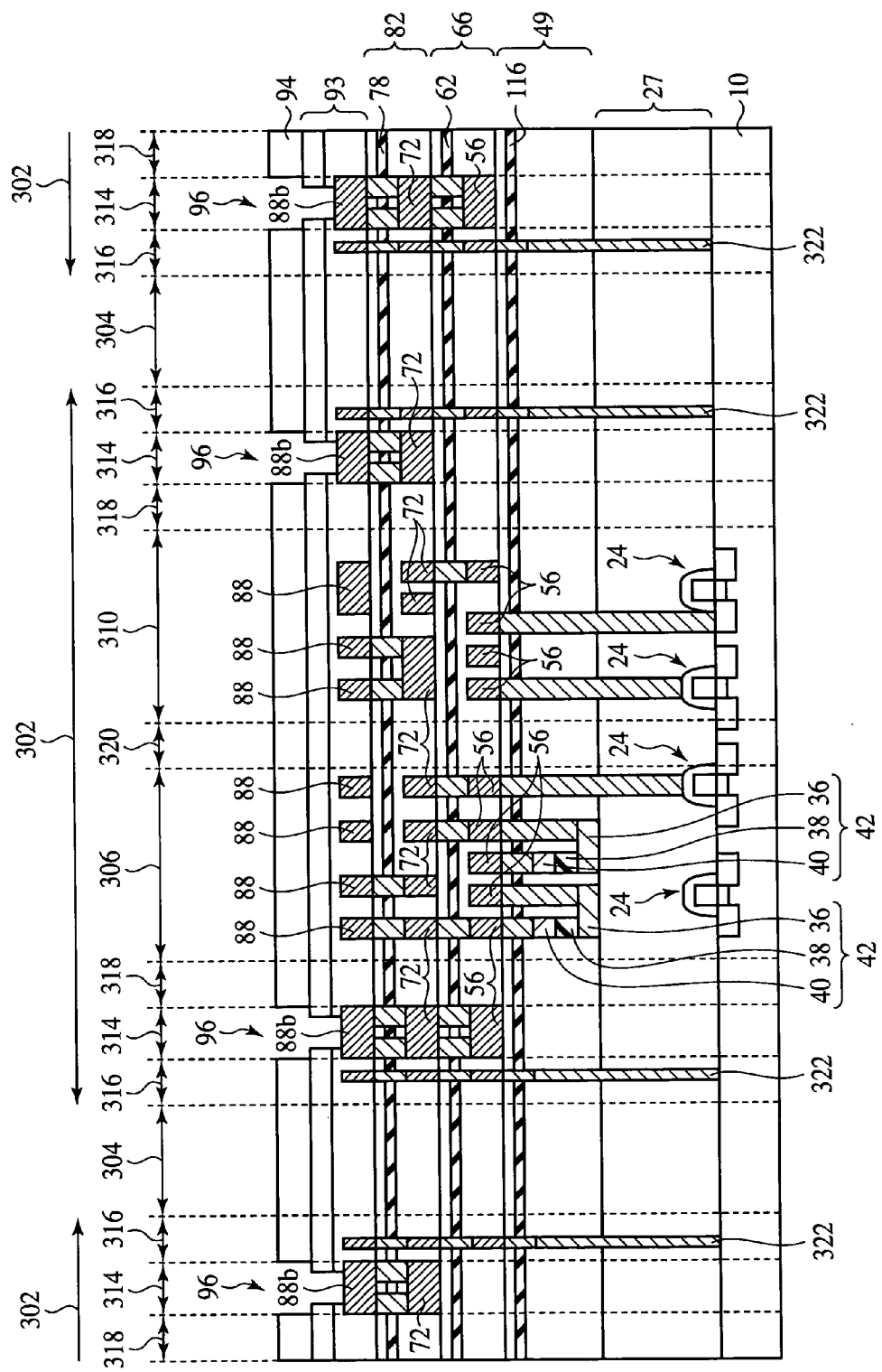
FIG. 48 is a sectional view of the semiconductor device according to the third embodiment of the present invention, which illustrates a structure thereof (Part 2).
Figure 49:
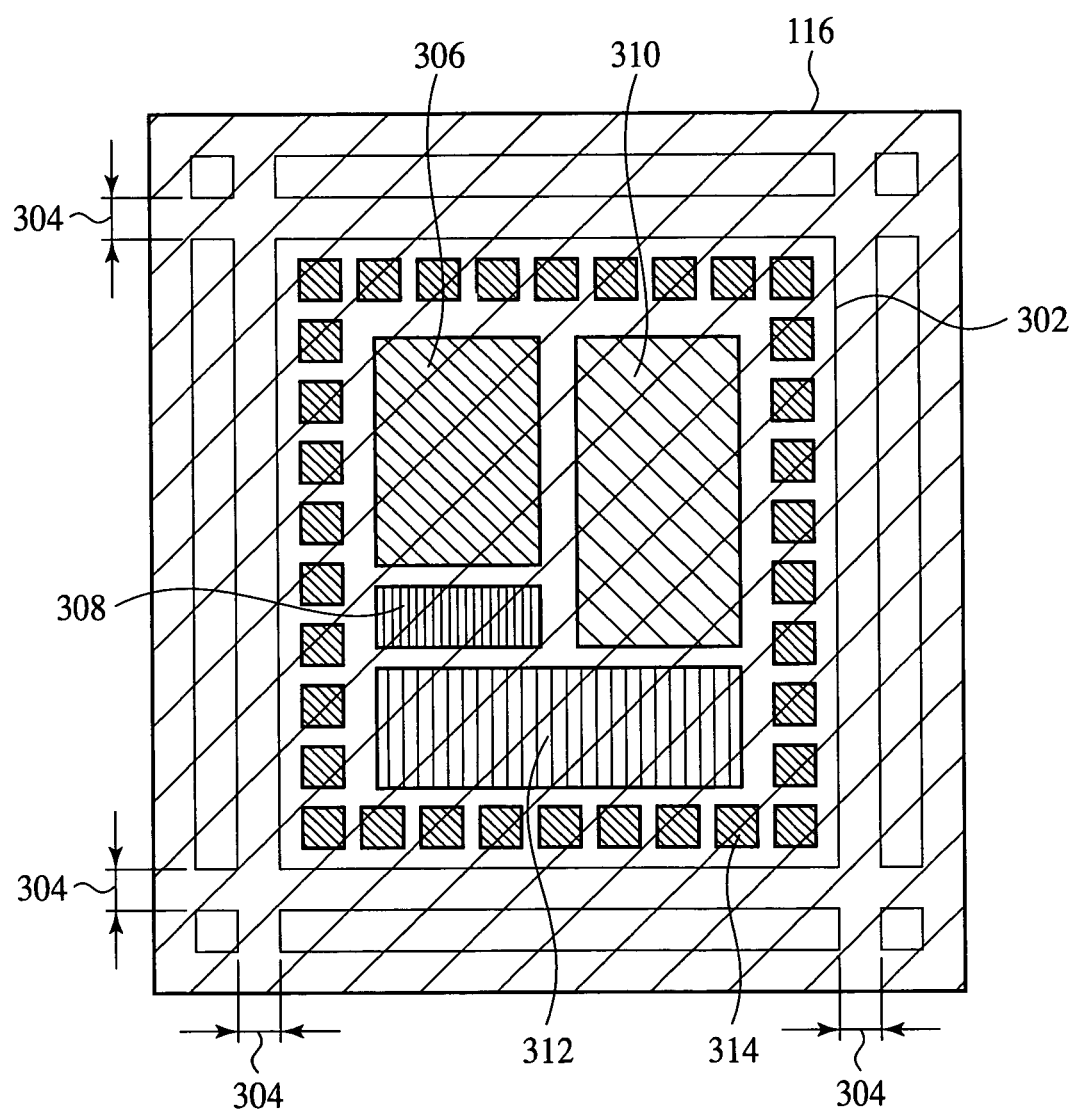
FIG. 49 is a plan view illustrating an area where the barrier film is formed in the semiconductor device according to the third embodiment of the present invention.

The semiconductor device and method for fabricating the same according to a third embodiment of the present invention will be explained with reference to FIGS. 47 to 52A-52C. FIGS. 47 and 48 are sectional views of the semiconductor device according to the present embodiment, which illustrate a structure thereof. FIG. 49 is a plan view of the area where the barrier film is formed in the semiconductor device according to the present embodiment. FIGS. 50A-50C to 52A-52C are sectional views of the semiconductor device according to the present embodiment in the steps of the method for fabricating the same, which illustrate the method. The same members of the present embodiment as those of the semiconductor device and the method for fabricating the same according to the first embodiment are represented by the same reference numbers not to repeat or to simplify their explanation.

(The Semiconductor Device)

The basic structure of the semiconductor device according to the present embodiment is substantially the same as the semiconductor device according to the first embodiment. The semiconductor device according to the present embodiment is different from the semiconductor device according to the first embodiment in that the semiconductor device according to the present embodiment further includes a flat barrier film 116 between the ferroelectric capacitor 42 and the first metal interconnection layer 56 (interconnections 56a, 56b, 56c).

That is, as illustrated in FIG. 47, the barrier film 116 is formed on a silicon oxide film 48 with conductor plugs 50a, 50b buried in. As the barrier film 116, aluminum oxide film of, e.g., a 20-70 nm-thickness is used. The silicon oxide film 48 is planarized. The barrier film 116, which is formed on the planarized silicon oxide film 48, is flat.

The barrier film 116 has the function of preventing the diffusion of hydrogen and water, as do the barrier films 44, 46, 58, 62, 78. Furthermore, the barrier film 116, which is formed on the planarized silicon oxide film 48, is flat and, as are the barrier films 62, 78, is formed with good coverage in comparison with the barrier films 44, 46, 58. Such flat barrier film 116 can more surely prevent the diffusion of hydrogen and water. Actually, the barrier film 116 is formed, as are the barrier films 62, 78, not only over the FeRAM cell region 306, where a plurality of the memory cells including the ferroelectric capacitors 42 are laid out, and also over the FeRAM chip region 302 and the scribe region 304, and further over the neighboring FeRAM chip regions 302. This will be described later.

A silicon oxide film 118 of, e.g., a 100 nm-thickness is formed on the barrier film 116. The silicon oxide film 118 functions as the stopper film for the etching for forming interconnections 56a, 56b, 56c which will be described later. The silicon oxide film 118 protects the barrier film 116 to prevent the decrease of the film thickness and the removal of the barrier film 116 in the etching for forming the interconnections 56a, 56b, 56c. Thus, the barrier film 116 is prevented from deteriorating the function of preventing the diffusion of hydrogen and water.

An inter-layer insulation film 49 is formed of the silicon oxide film 34, the barrier film 46, the silicon oxide film 48, the barrier film 116 and the silicon oxide film 118.

In the silicon oxide film 118, the barrier film 116, the silicon oxide film 48, the barrier film 46 and the barrier film 44, a contact hole 52a is formed down to the upper electrode 40. In the silicon oxide film 118, the barrier film 116, the silicon oxide film 48, the barrier film 46 and the barrier film 44, a contact hole 52b is formed down to a lower electrode 36.

Furthermore, in the silicon oxide film 118 and the barrier film 116, a contact hole 120a is formed down to the conductor plug 54a. In the silicon oxide film 118 and the barrier film 116, a contact hole 120b is formed down to the conductor plug 54b.

On the silicon oxide film 118 and in the contact holes 52a and the contact hole 120a, an interconnection 56a is formed, electrically connected to the conductor plug 54a and the upper electrode 40. On the silicon oxide film 118 and in the contact hole 52b, an interconnection 56b is formed, electrically connected to the lower electrode 36. On the silicon oxide film 118 and in the contact hole 120b, an interconnection 56c is formed, electrically connected to the conductor plug 54b.

As illustrated in FIGS. 48 and 49, the barrier film 116 is formed, as are the barrier films 62, 78, over the FeRAM chip region 302 and the scribe regions 304 and also over the neighboring FeRAM chip regions 302. That is, the barrier film 116 is formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320.

As described above, the semiconductor device according to the present embodiment is characterized mainly in that the semiconductor device includes, in addition to the barrier films 44, 46, 58, the flat barrier film 116 formed between the ferroelectric capacitor 42 and the first metal interconnection layer 56 (interconnections 56a, 56b, 56c) formed above the ferroelectric capacitor 42, the flat barrier film 62 formed between the first metal interconnection layer 56 (interconnection 56a, 56b, 56c) and the second metal interconnection layer 72 (interconnections 72a, 72b), and the flat barrier film 78 formed between the second metal interconnection layer 72 (interconnections 72a, 72b) and the third metal interconnection layer 88 (interconnections 88a, 88b).

In the semiconductor device according to the present embodiment, in addition to the flat barrier films 62, 78 of the semiconductor device according to the first embodiment, the flat barrier film 116 is formed between the ferroelectric capacitor 42 and the first metal interconnection layer 56 formed above the ferroelectric capacitor 42, whereby hydrogen and water are further surely barriered to more surely prevent the arrival of the hydrogen and water at the ferroelectric film 38 of the ferroelectric capacitor 42. Thus, the deterioration of the electric characteristics of the ferroelectric capacitor 42 due to hydrogen and water can be more surely prevented, and the PTHS characteristics of the semiconductor device including the ferroelectric capacitor can be further more improved.

Furthermore, in the semiconductor device according to the present embodiment, the flat barrier films 62, 78, 116 are formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320, whereby the deterioration of the electric characteristics of the ferroelectric capacitor 42 due to hydrogen and water can be more surely prevented.

(The Method for Fabricating the Semiconductor Device)

The method for fabricating the semiconductor device according to the present embodiment will be explained with reference to FIGS. 50A-50C to 52A-52C.

Figure 50A:
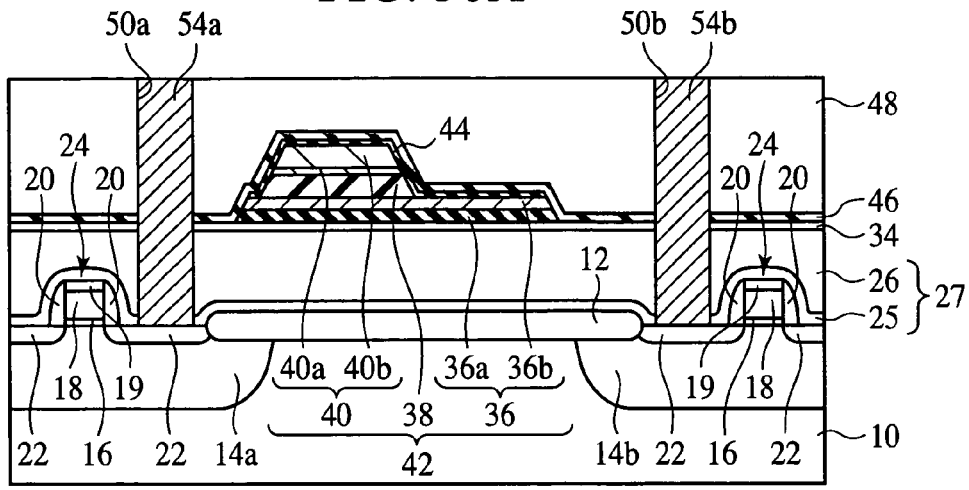
FIGS. 50A-50C are sectional views of the semiconductor device according to the third embodiment of the present invention in the steps of the method for fabricating the same, which illustrate the method (Part 1).

First, in the same way as in the method for fabricating the semiconductor device according to the first embodiment illustrated in FIGS. 24A-24C to 27A-27C, FIG. 28A and FIG. 28B, the semiconductor device is fabricated up to the conductor plugs 54a, 54b (see FIG. 50A).

Then, plasma cleaning with, e.g., argon gas is made. Thus, natural oxide film, etc. present on the surfaces of the conductor plugs 54a, 54b is removed.

Then, on the silicon oxide film 48 with the conductor plugs 54a, 54b buried in, the barrier film 116 is formed by, e.g., sputtering or CVD. As the barrier film 116, an aluminum oxide film of, e.g., a 20-70 nm-thickness is formed. The barrier film 116, which is formed on the planarized silicon oxide film 48, is flat.

Figure 51:
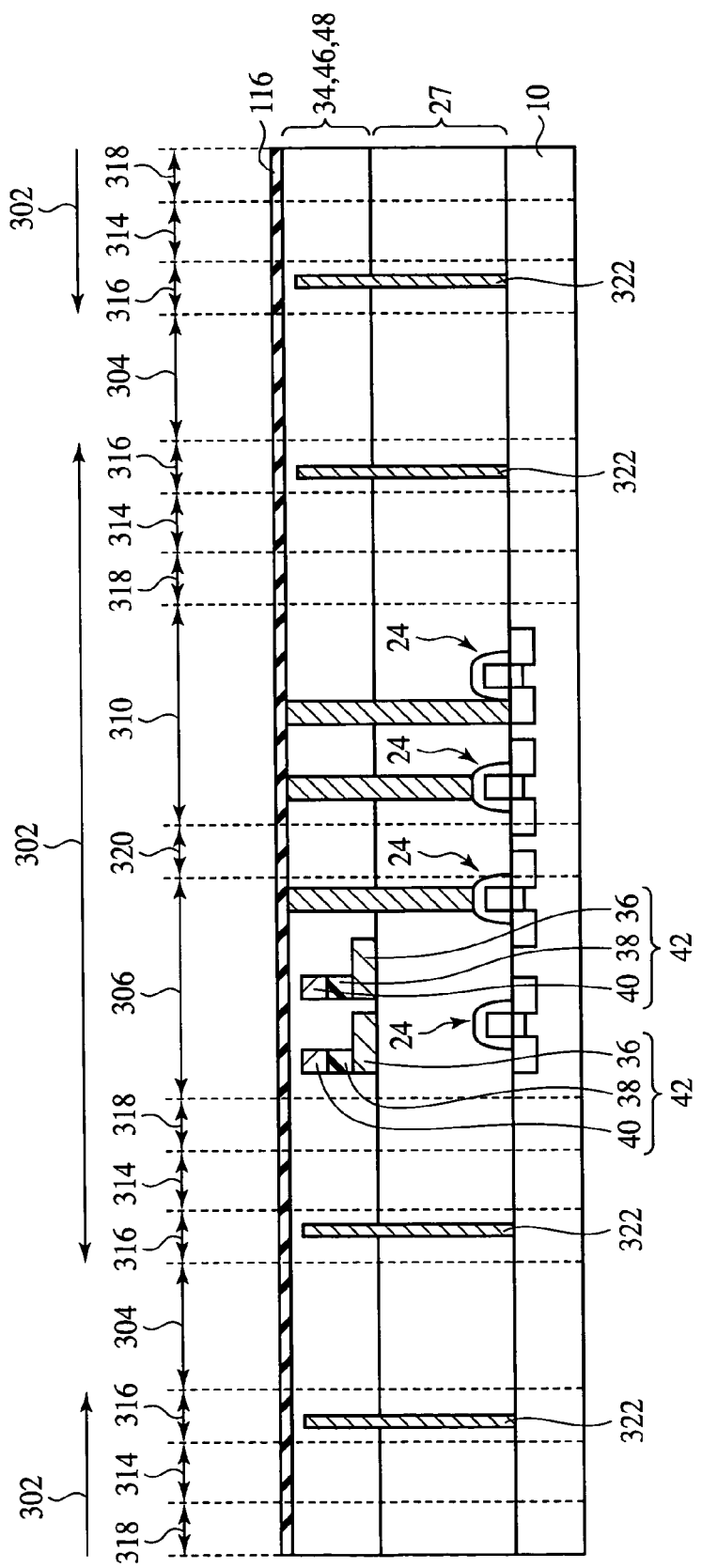
FIG. 51 is a sectional view of the semiconductor device according to the third embodiment of the present invention in the step of the method for fabricating the same, which illustrates the method (Part 2).

As illustrated in FIG. 51, the barrier film 116 is formed over the FeRAM chip region 302 and the scribe regions 304, and even over the neighboring FeRAM chip regions 302. That is, the barrier film 116 is formed over the scribe regions 304, the FeRAM cell region 306, the peripheral circuit region 308 for FeRAM, the logic circuit region 310, the peripheral circuit region 312 for logic circuit and the pad regions 314, and the interfaces between them, i.e., the scribe region-pad region interfaces 316, the pad region-circuit region interfaces 318, and the circuit region-circuit region interfaces 320.

Figure 50B:
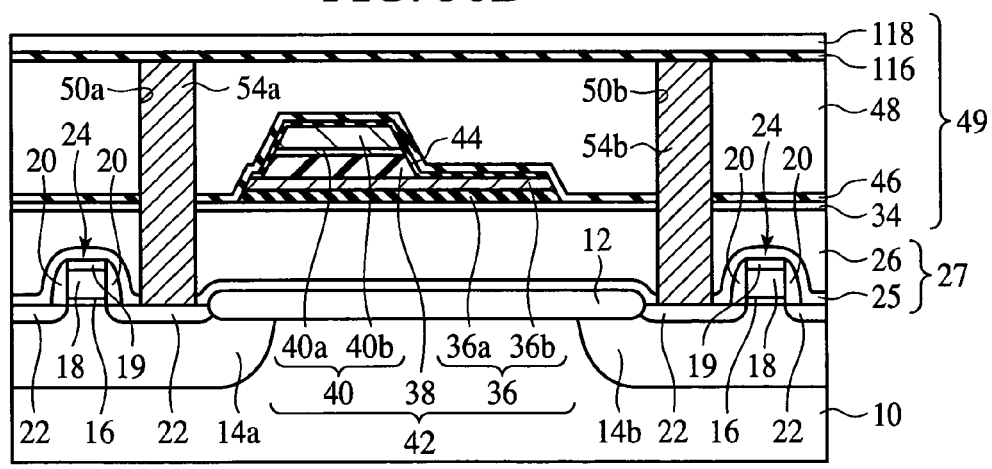

Next, the silicon oxide film 118 of, e.g., a 100 nm-thickness is formed on the entire surface by, e.g., plasma TEOS CVD (see FIG. 50B).

Figure 50C:
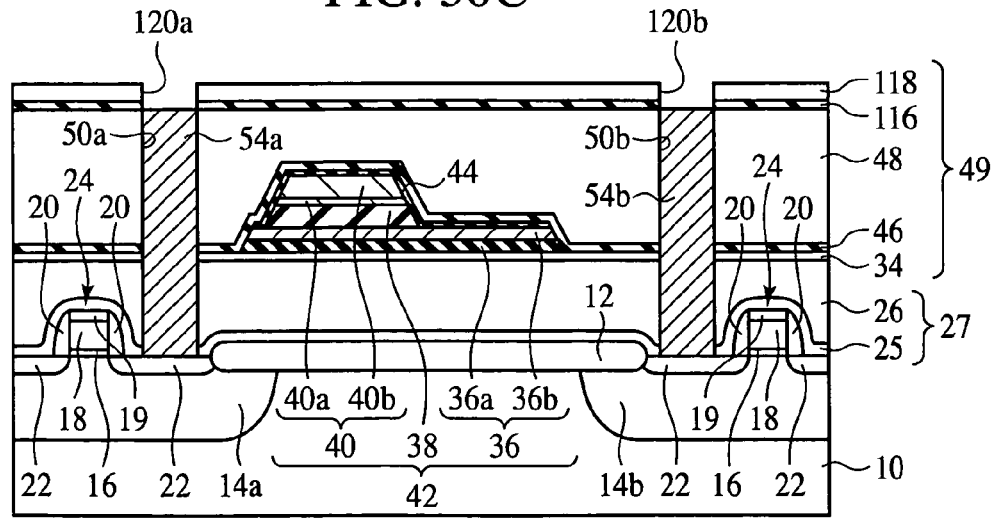

Next, by photolithography and dry etching, the contact holes 120a, 120b are formed in the silicon oxide film 118 and the barrier film 116 down to the conductor plugs 54a, 54b (see FIG. 50C).

Figure 52A:
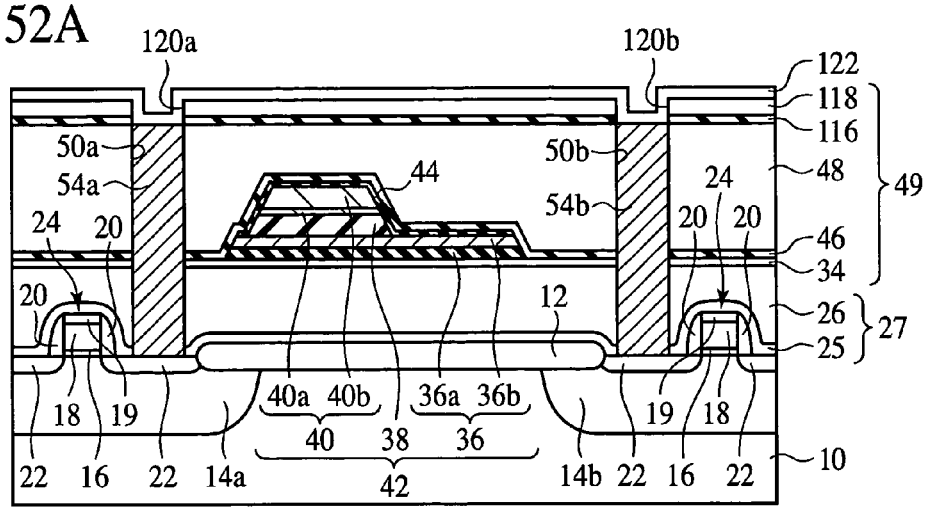
FIGS. 52A-52C are sectional views of the semiconductor device according to the third embodiment of the present invention in the steps of the method for fabricating the same, which illustrate the method (Part 3).

Next, the SiON film 122 of, e.g., a 100 nm-thickness is formed on the entire surface by, e.g., CVD (see FIG. 52A).

Figure 52B:
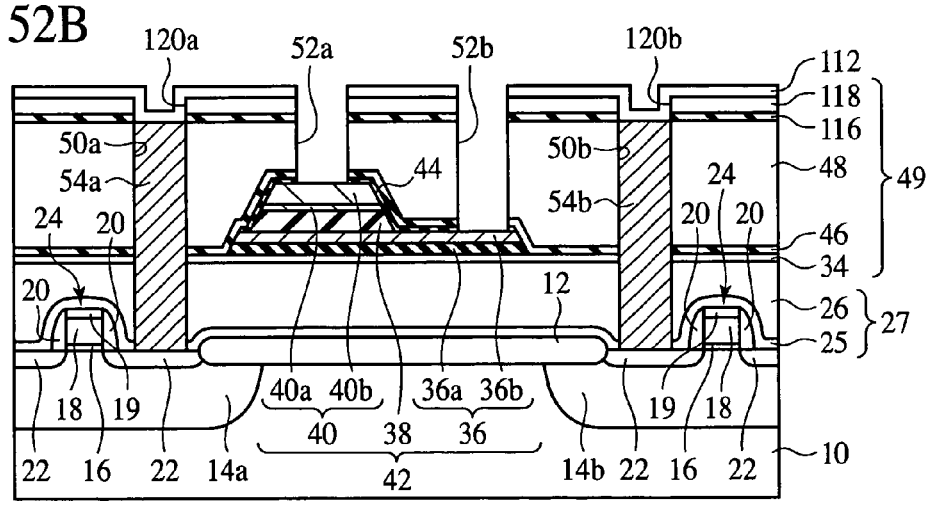
Figure 52C:
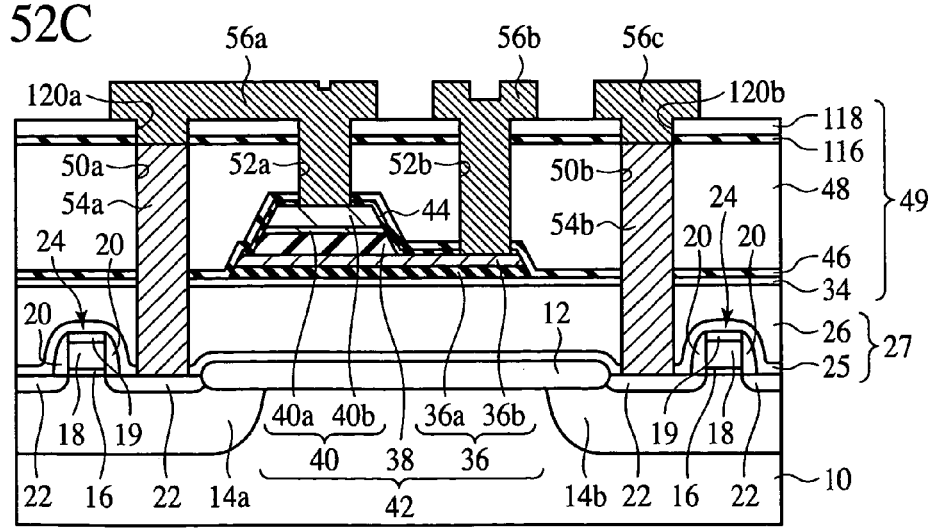

Then, by photolithography and dry etching, the contact hole 52a and the contact hole 52b are formed respectively down to the upper electrode 40 of the ferroelectric capacitor 42 and down to the lower electrode 36 of the ferroelectric capacitor 42 in the SiON film 122, the silicon oxide film 118, the barrier film 116, the silicon oxide film 48, the barrier film 46 and the barrier film 44 (see FIG. 52B).

Next, thermal processing, e.g., 500° C. and 60 minutes is made in an oxygen atmosphere. This thermal processing feeds oxygen to the ferroelectric film 38 of the ferroelectric capacitor 42 to recover the electric characteristics of the ferroelectric capacitor 42.

Then, the SiON film 122 is removed by etching.

Next, a TiN film of, e.g., a 150 nm-thickness, an AlCu alloy film of, e.g., a 550 nm-thickness, a Ti film of, e.g., a 5 nm-thickness and a TiN film of, e.g., a 150 nm-thickness are sequentially laid the latter on the former on the entire surface. Thus, the conductor film of the TiN film, the AlCu alloy film, the Ti film and the TiN film sequentially laid the latter on the former is formed.

Next, the conductor film is patterned by photolithography and dry etching. Thus, the first metal interconnection layer 56, i.e., the interconnection 56a electrically connected to the upper electrode 40 of the ferroelectric capacitor 42 and the conductor plug 54a, the interconnection 56b electrically connected to the lower electrode 36 of the ferroelectric capacitor 42, and the interconnection 56c electrically connected to the conductor plug 54b is formed (see FIG. 52C). In the dry etching for forming the interconnections 56a, 56b, 56c, the silicon oxide film 118 functions as the stopper film. The silicon oxide film 118 protects the barrier film 116 to prevent the decrease of the film thickness and the removal of the barrier film 116 by the etching for forming the interconnections 56a, 56b, 56c. Thus, the barrier film 116 is prevented from deteriorating the function of preventing the diffusion of hydrogen and water.

The steps following hereafter are the same as those of the method for fabricating the semiconductor device according to the first embodiment illustrated in FIGS. 29B to 39B, and their explanation will not be repeated.

As described above, according to the present invention, the semiconductor device includes, as the barrier films for preventing the diffusion of hydrogen and water, in addition to the barrier films 44, 46, 58, the flat barrier film 116 formed between the ferroelectric capacitor 42 and the first metal interconnection layer 56 formed above the ferroelectric capacitor 42, the flat barrier film 62 formed between the first metal interconnection layer 56 and the second metal interconnection layer 72, and the flat barrier film 78 formed between the second metal interconnection layer 72 and the third metal interconnection layer 88, whereby hydrogen and water are more surely barriered to more surely prevent the arrival of the hydrogen and water at the ferroelectric film 38 of the ferroelectric capacitor 42. Thus, the deterioration of the electric characteristics of the ferroelectric capacitor 42 due to hydrogen and water can be surely prevented, and the PTHS characteristics of the semiconductor device including the ferroelectric capacitor can be more improved.

In the present embodiment, the barrier film 116 is formed after the conductor plugs 54a, 54b have been formed but the barrier film 116 may be formed before the conductor plugs 54a, 54b are formed.

Specifically, first, in the same way as in the method for fabricating the semiconductor device according to the first embodiment illustrated in FIGS. 24A to 27C, the semiconductor device is fabricated up to the silicon oxide film 48 having the surface planarized by CMP.

Next, the barrier film 116 is formed on the silicon oxide film 48 having the surface planarized by CMP.

Next, a silicon oxide film of, e.g., a 100 nm-thickness is formed on the barrier film 116.

Next, in the silicon oxide film on the barrier film 116, the barrier film 116, the silicon oxide film 48, the barrier film 46, the silicon oxide film 34 and the inter-layer insulation film 27, the contact holes 50a, 50b are formed down to the source/drain diffused layers 22.

Next, the conductor plugs 54a, 54b are formed, buried in the contact holes 50a, 50b.

In the way described above, the barrier film 116 may be formed before the conductor plugs 54a, 54b are formed.

Modified Embodiments

The present invention is not limited to the above-described embodiments and includes other various modifications.

For example, in the above-described embodiments, the ferroelectric film 38 is PZT film. However, the ferroelectric film 38 is not essentially PZT film and can be suitably any other ferroelectric film. To give examples, as the ferroelectric film 38, $Pb_{1-x}La_xZr_{1-y}Ti_yO_3$ film (PLZT film), $SrBi_2(Ta_xNb_{1-x})_2O_9$ film, $Bi_4Ti_2O_{12}$ film, etc. may be used.

In the above-described embodiments, the lower electrode 36 is formed of the layered film of the aluminum oxide film 36a and the Pt film 36b. However, the conductor film, etc. forming the lower electrode 36 are not essentially these materials. The lower electrode 38 may be formed of, e.g., Ir film, $IrO_2$ film, Ru film, $RuO_2$ film, SrRuO (strontium ruthenium oxide) film (SRO film) or Pd film.

In the above-described embodiments, the upper electrode 40 is formed of the layered film of the $IrO_X$ film 40a and the $IrO_Y$ film 40b. However, the conductor film forming the upper electrode 40 is not essentially formed of these materials. The upper electrode 40 may be formed of, e.g., Ir film, Ru film, $RuO_2$ film, SRO film or Pd film.

In the above-described embodiments, the flat barrier films are, in the first embodiment, the barrier film 62 formed between the first metal interconnection layer 56 and the second metal interconnection layer 72, and the barrier film 78 formed between the second metal interconnection layer 72 and the third metal interconnection layer 88, in the second embodiment, the barrier film 114 formed above the third metal interconnection layer 88 in addition to the barrier films 62, 78, and in the third embodiment, the barrier film 116 formed between the ferroelectric capacitor 42 and the first metal interconnection layer 56 in addition to the barrier films 62, 78. The combinations of the barrier films 62, 78, 114, 116 are not limited to those described in the above-described embodiments. The flat barrier films can be at least two layers of the barrier films 62, 78, 114, 116; three layers of the barrier films 62, 78, 114, 116 may be formed, or all the four layers of the barrier films 62, 78, 224, 116 may be formed. More flat barrier films may be formed corresponding to a number, etc. of the metal interconnection layers formed above the semiconductor substrate 10. In this case, the film thickness of the flat barrier films is set at preferably, e.g., above 50 nm including 50 nm and below 100 nm excluding 100 nm, more preferably above 50 nm including 50 nm and below 80 nm including 80 nm.

In terms of effectively preventing the deterioration of the electric characteristics of the ferroelectric capacitor, it is preferable that the flat barrier film is formed first between the bonding pad and the uppermost metal interconnection layer below the bonding pads and another flat barrier film is formed between other metal interconnection layers.

In the above-described embodiments, the barrier films are aluminum oxide film but are not limited to aluminum oxide film. Films which have the function of preventing the diffusion of hydrogen and water can be suitably used as the barrier films. As the barrier films, films of, e.g., metal oxide can be suitably used. As the barrier film of metal oxide, films of tantalum oxide, titanium oxide, etc., for example, can be used. The barrier films are not limited to films of metal oxide. Silicon nitride film ($Si_3N_4$ film), silicon oxynitride film (SiON film), etc., for example, can be used as the barrier films. Coated oxide film and hygroscopic organic film, such as resin film of polyimide, polyarylene, poly(arylene ether), benzocyclobutene, etc., can be used as the barrier films.

In the above-described embodiments, the barrier films are formed of the same material but may be formed suitably of different materials as will be described below.

For example, in the semiconductor device according to the first or the second embodiment, aluminum oxide film may be used as the barrier film 62, which is formed nearest the ferroelectric capacitor 42 of the flat barrier films 62, 78, 114, and silicon nitride film may be used as the barrier film 78 or the barrier film 114, which are formed above the barrier film 62. On the aluminum oxide film, titanium oxide film, for example, may be formed.

In the semiconductor device according to the second embodiment, as the flat barrier films 62, 78 formed below the third metal interconnection layer 88, metal oxide film, such as aluminum oxide film or others, inorganic film, such as silicon nitride film or others, may be used, and hygroscopic organic film may be used as the flat barrier film 114 with the opening 96b formed down to the interconnection (bonding pad) 88b.

In the above-described embodiment, as the insulation film forming the inter-layer insulation films, silicon oxide film is formed, but other various insulation films may be formed in place of silicon oxide film.

In the above-described embodiments, the surfaces of the insulation films forming the inter-layer insulation films are planarized by CMP but may not be planarized essentially by CMP. For example, the surfaces of the insulation films may be planarized by etching. The etching gas can be, e.g., Ar gas.

In the above-described embodiments, the circuit is formed of three layers of the first metal interconnection layer 56, the second metal interconnection layer 72 and the third metal interconnection layer 88 on the semiconductor substrate 10, but the number of the layers of the metal interconnection layers forming the circuit on the semiconductor substrate 10 is not essentially three layers. The number of the metal interconnection layers can be suitably set in accordance with the design of the circuit formed on the semiconductor substrate 10.

In the above-described embodiments, 1T1C memory cells each including one transistor 24 and one ferroelectric capacitor 42 are formed. The constitution of the memory cells is not essentially 1T1C-type. As the constitution of the memory cells, various constitutions, e.g., 2T2C-type including two transistors and two ferroelectric capacitors, and other constitutions can be used.

In the above-described embodiments, the semiconductor device of the FeRAM structure including planar cells is explained, but the application of the present invention is not limited to the planar cells. For example, the present invention is applicable to the semiconductor device of the FeRAM structure including stacked cells and having the gate length set at, e.g., 0.18 μm.

Figure 53:
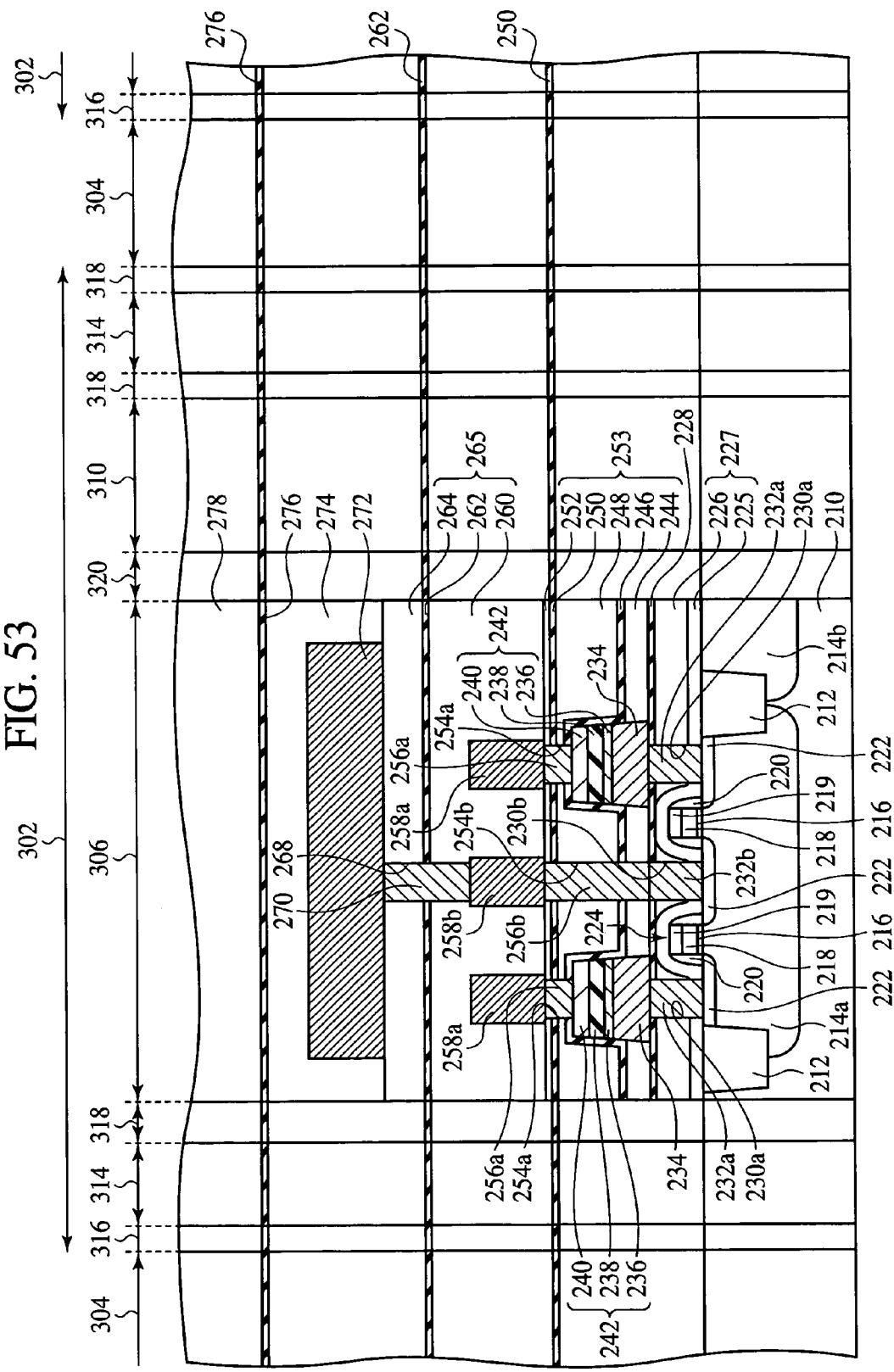
FIG. 53 is a sectional view of the semiconductor device of the FeRAM structure including the stacked cells the present invention is applied to, which illustrates a structure thereof (Part 1).

FIG. 53 is a sectional view of a semiconductor device of the FeRAM structure of stacked cells the present invention is applied to, which illustrates a structure thereof. In FIG. 53, in the regions other than the FeRAM cell region 306, the structure other than the barrier films is omitted.

As illustrated, in a semiconductor substrate 210 of, e.g., silicon, a device isolation region 212 for defining device regions is formed. In the semiconductor substrate 210 with the device isolation region 212 formed in, wells 214a, 214b are formed.

On the semiconductor substrate 210 with the wells 214a, 214b formed in, gate electrodes (gate interconnections) 218 are formed with a gate insulation film 216 formed therebetween. The gate electrodes 218 have, e.g., the polycide structure of a cobalt silicide film, a nickel silicide film, a tungsten silicide film, etc. formed on a polysilicon film in accordance with a gate length, etc. A silicon oxide film 219 is formed on the gate electrode 218. A sidewall insulation film 220 is formed on the side walls of the gate electrode 218 and the silicon oxide film 219.

Source/drain diffused layers 222 are formed in the semiconductor substrate 210 on both sides of the gate electrode 218 with the sidewall insulation film 220 formed on. Thus, transistors 224 each including the gate electrode 218 and the source/drain diffused layers 222 are formed. The gate length of the transistor 224 is set at, e.g., 0.18 μm.

On the semiconductor substrate 210 with the transistors 224 formed on, an inter-layer insulation film 227 of an SiON film 225 and a silicon oxide film 226 sequentially laid the latter on the former is formed. The surface of the inter-layer insulation film 227 is planarized.

On the inter-layer insulation film 227, a barrier film 228 of, e.g., aluminum oxide film is formed.

Contact holes 230a, 230b are formed in the barrier film 228 and the inter-layer insulation film 227 down to the source/drain diffused layers 222.

In the contact holes 230a, 230b, a barrier metal film (not illustrated) of a Ti film and a TiN film sequentially laid the later on the former is formed.

Conductor plugs 232a, 232b of tungsten are buried in the contact holes 230a, 230b with the barrier metal film formed in.

On the barrier film 228, an Ir film 234 is formed, electrically connected to the conductor plug 232a.

On the Ir film 234, a lower electrode 236 of a ferroelectric capacitor 242 is formed.

On the lower electrode 236, the ferroelectric film 238 of the ferroelectric capacitor 242 is formed. The ferroelectric film 238 is, e.g., PZT film.

On the ferroelectric film 238, an upper electrode 240 of the ferroelectric capacitor 242 is formed.

The stacked upper electrode 240, the ferroelectric film 238, the lower electrode 236 and the Ir film 234 are patterned at once by etching and have substantially the same plane shape.

Thus, the ferroelectric capacitor 242 including the lower electrode 236, the ferroelectric film 238 and the upper electrode 240 is constituted. The lower electrode 236 of the ferroelectric capacitor 242 is electrically connected to the conductor plug 232a via the Ir film 234.

In the region of the inter-layer insulation film 227, where the Ir film 234 is not formed, an SiON film 244 is formed in substantially the same film thickness as the Ir film 234 or in a smaller film thickness than the Ir film 234. In place of the SiON film 244, silicon oxide film may be formed.

On the ferroelectric capacitor 242 and the SiON film 244, a barrier film 246 which has the function of preventing the diffusion of hydrogen and water is formed. As the barrier film 246, aluminum oxide film, for example, is used.

A silicon oxide film 248 is formed on the barrier film 246. The ferroelectric capacitor 242 is buried with the silicon oxide film 248. The surface of the silicon oxide film 248 is planarized.

A flat barrier film 250 which has the function of preventing the diffusion of hydrogen and water is formed on the planarized silicon oxide film 248. As the barrier film 250, aluminum oxide film, for example, is used. The barrier film 250 is formed over the FeRAM chip region 302 and the scribe regions 304 and also over the neighboring FeRAM chip regions 302. That is, the barrier film 250 is formed over the scribe regions 304, the FeRAM cell region 306, the peripheral circuit region for FeRAM (not illustrated), the logic circuit region 310, the peripheral circuit region for logic circuit (not illustrated) and the pad regions 314, and the interfaces between them, i.e., the scribe region-pad region interfaces 316, the pad region-circuit region interfaces 318, and the circuit region-circuit region interfaces 320.

A silicon oxide film 252 is formed on the barrier film 250.

Thus, an inter-layer insulation film 253 is formed of the SiON film 244, the barrier film 246, the silicon oxide film 248, the barrier film 250 and the silicon oxide film 252.

A contact hole 254a is formed in the silicon oxide film 252, the barrier film 250, the silicon oxide film 248 and the barrier film 246 down to the upper electrode 240 of the ferroelectric capacitor 242. A contact hole 254b is formed in the silicon oxide film 252, the barrier film 250, the silicon oxide film 248, the barrier film 246 and the SiON film 244 down to the conductor plug 262b.

A barrier film (not illustrated) of a Ti film and a TiN film sequentially laid the latter on the former is formed in the contact holes 254a, 254b. The barrier metal film may be formed of a TiN film alone without a Ti film.

In the contact holes 254a, 254b with the barrier metal film formed in, conductor plugs 256a, 256b of tungsten are respectively buried in.

On the silicon oxide film 252, an interconnection 258a and an interconnection 258b are formed, electrically connected respectively to the conductor plug 256a and to the conductor plug 256b.

A silicon oxide film 260 is formed on the silicon oxide film 252 with the interconnections 258a, 258b formed on, a silicon oxide film 260 is formed, and the interconnections 258a, 258b are buried with the silicon oxide film 260. The surface of the silicon oxide film 260 is planarized.

A flat barrier film 262 which has the function of preventing the diffusion of hydrogen and water is formed on the planarized silicon oxide film 260. The barrier film 262 is, e.g., aluminum oxide film. The barrier film 262 is formed over the FeRAM chip region 302 and the scribe regions 304 and also over the neighboring FeRAM chip regions 302. That is, the barrier film 262 is formed over the scribe regions 304, the FeRAM cell region 306, the peripheral circuit region for FeRAM (not illustrated), the logic circuit region 310, the peripheral circuit region for logic circuit (not illustrated) and the pad regions 314, and the interfaces between them, i.e., the scribe region-pad region interfaces 316, the pad region-circuit region interfaces 318, and the circuit region-circuit region interfaces 320.

A silicon oxide film 264 is formed on the barrier film 262.

Thus, an inter-layer insulation film 265 is formed of the silicon oxide film 260, the barrier film 262 and the silicon oxide film 264.

A contact hole 268 is formed in the silicon oxide film 264, the barrier film 262 and the silicon oxide film 260 down to the interconnection 258b.

A barrier metal film (not illustrated) of a Ti film and a TiN film sequentially laid the latter on the former is formed in the contact hole 268.

A conductor plug 270 of tungsten is buried in the contact hole 268 with the barrier metal film formed in.

An interconnection 272 is formed on the silicon oxide film 264, electrically connected to the conductor plug 268.

A silicon oxide film 274 is formed on the silicon oxide film 264 with the interconnection 272 formed on, and the interconnection 272 is buried with the silicon oxide film 274. The surface of the silicon oxide film 274 is planarized.

On the planarized silicon oxide film 274, a flat barrier film 276 which has the function of preventing the diffusion of hydrogen and water is formed. The barrier film 276 is, e.g., aluminum oxide film. The barrier film 276 is formed over the FeRAM chip region 302 and the scribe regions 304 and also over the neighboring FeRAM chip regions 302. That is, the barrier film 276 is formed over the scribe regions 304, the FeRAM cell region 306, the peripheral circuit region for FeRAM (not illustrated), the logic circuit region 310, the peripheral circuit region for logic circuit (not illustrated) and the pad regions 314, and the interfaces between them, i.e., the scribe region-pad region interfaces 316, the pad region-circuit region interfaces 318, and the circuit region-circuit region interfaces 320.

A silicon oxide film 278 is formed on the barrier film 276.

On the silicon oxide film 278, although not illustrated, interconnections buried in inter-layer insulation films formed of silicon oxide film, etc. are suitably formed in accordance with a circuit design.

As described above, the semiconductor device of the FeRAM structure including stacked cells as well as in the above-described embodiments, includes the flat barrier films 250, 262, 276 for preventing the diffusion of hydrogen and water, whereby the deterioration of the electric characteristics of the ferroelectric capacitor 242 due to hydrogen and water can be prevented, and the PTHS characteristics can be much improved. In this case as well, at least two layers of the flat barrier film for preventing the diffusion of hydrogen and water may be formed, and all the three layers of the barrier film 250, 262, 276 may not be formed. More flat films may be formed as required.

In the above-described embodiments, the interconnections are formed mainly of Al but may not be formed mainly of Al. For example, the interconnections may be formed mainly of Cu by damascene method, etc.

Figure 54:
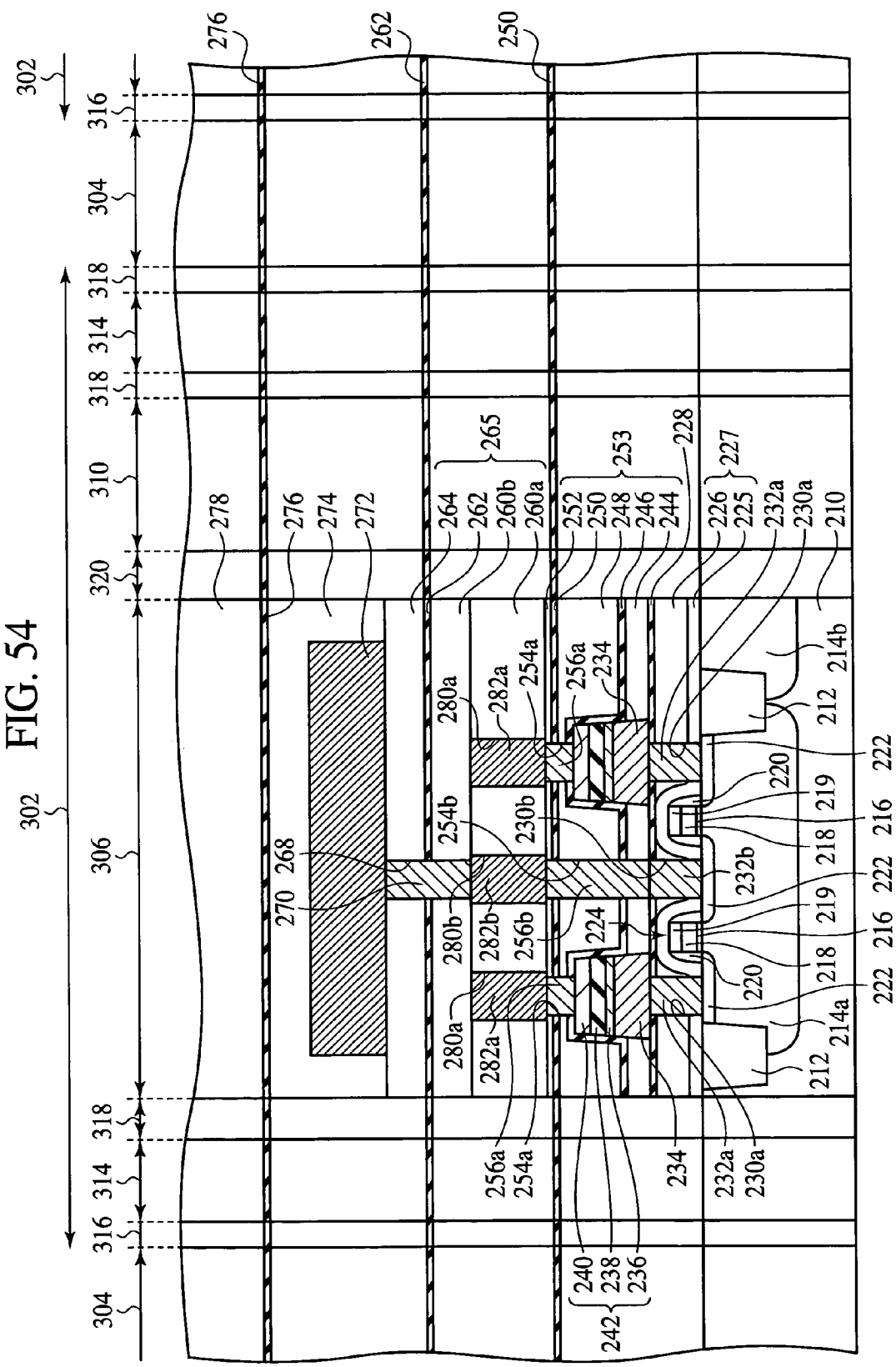
FIG. 54 is a sectional view of the semiconductor device of the semiconductor device of the FeRAM structure including the stacked cells the present invention is applied to, which illustrates a structure thereof (Part 2).
Figure 55:
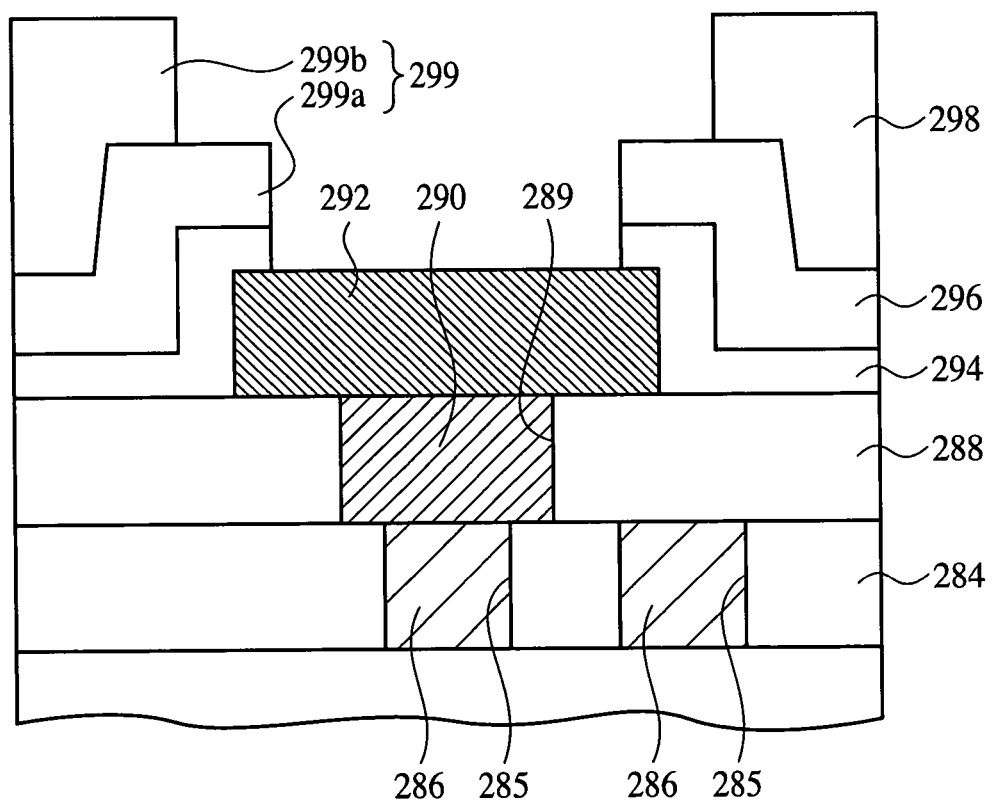
FIG. 55 is a sectional view of the bonding pad with the Cu interconnection, which illustrates a structure thereof.

The case in which the interconnection formed mainly of Cu will be explained with reference to FIGS. 54 and 55. FIG. 54 is a sectional view of the semiconductor device using the Cu interconnections in the semiconductor device illustrated in FIG. 53, which illustrates a structure thereof, and FIG. 55 is a sectional view of the semiconductor device using the Cu interconnections, which illustrate a structure of the bonding pad. As does FIG. 53, FIG. 54 illustrates the structure of the semiconductor device of the FeRAM structure including stacked cells. The same members as those of the semiconductor device illustrated in FIG. 53 are represented by the same reference numbers not to repeat or to simplify their explanation.

As illustrated in FIG. 54, a silicon oxide film 260a is formed on an inter-layer insulation film 253 with conductor plugs 256a, 256b of tungsten buried in.

Interconnections trenches 280a, 280b are formed in the silicon oxide film 260a.

In the interconnection trench 280a a Cu interconnection 282a is buried, electrically connected to the conductor plug 256a. In an interconnection trench 280b a Cu interconnection 282b is buried, electrically connected to the conductor plug 256b.

On the silicon oxide film 260a with the Cu interconnections 282a, 282b buried in, a silicon oxide film 260b is formed. The surface of the silicon oxide film 260b is planarized.

On the planarized silicon oxide film 260b, a flat barrier film 262 which has the function of preventing the diffusion of hydrogen and water is formed.

A silicon oxide film 264 is formed on the barrier film 262.

Thus, an inter-layer insulation film 265 is formed of the silicon oxide film 260, the barrier film 262 and the silicon oxide film 264.

A contact hole 268 is formed in the silicon oxide film 264, the barrier film 262 and the silicon oxide film 260b down to the Cu interconnection 282b.

In the contact hole 268, a layered film of a Ta film of, e.g., a 15 nm-thickness and a Cu film of, e.g., a 130 nm-thickness sequentially laid the latter on the former is formed. Thus, in the contact hole 268 with the barrier metal film (not illustrated) of the Ta film, a conductor plug 270 of the Cu is buried.

In the case where the Cu interconnections are used as described above, the bonding pad is formed of a metal film formed mainly of Al, such as AlCu alloy film or others.

As illustrated in FIG. 55, an interconnection trench 285 is formed in an inter-layer insulation film 284.

A Cu interconnection 286 is buried in the interconnection trench 285.

On the inter-layer insulation film 284 with the Cu interconnection 286 buried in, an inter-layer insulation film 288 of a silicon oxide film is formed. The silicon oxide film forming the inter-layer insulation film 288 is formed by, e.g., plasma TEOS CVD.

A contact hole 289 is formed in the inter-layer insulation film 288 down to the Cu interconnection 286.

In the contact hole 289, a conductor plug 290 of tungsten is buried in.

On the inter-layer insulation film 288 with the conductor plug 290 buried in, a bonding pad 292 is formed, electrically connected to the conductor plug 290. The bonding bad 292 is formed of an AlCu alloy film.

Between the Cu interconnection 286 and the bonding pad 292, a barrier film for preventing the diffusion of hydrogen and water may be formed.

On the inter-layer insulation film 288 and the bonding pad 292, a silicon oxide film 294 is formed. The silicon oxide film 294 is formed by, e.g., plasma TEOS CVD.

A silicon nitride film 296 is formed on the silicon oxide film 294.

A polyimide resin film 298 is formed on the silicon nitride film 294.

An opening 299 is formed in the polyimide resin layer 298, the silicon nitride film 296 and the silicon oxide film 294 down to the bonding pad 292. That is, an opening 299a is formed in the silicon nitride film 296 and the silicon oxide film 294 down to the bonding pad 292. An opening 299b is formed in the polyimide resin film 298 in the region containing the opening 299a formed in the silicon nitride film 296 and the silicon nitride film 294.

The bonding pad 292 is electrically connected to an outside circuit (not illustrated) through the opening 299.

Thus, the interconnection formed mainly of Cu may be used in place of the interconnection formed mainly of Al.

In the case that the Cu interconnection is used in the semiconductor device of the FeRAM structure including stacked cells as illustrated in FIG. 53, for example, the first layer of the flat barrier film may be formed between the ferroelectric capacitor and the first Cu interconnection above the ferroelectric capacitor, and the second layer of the flat barrier film may be formed between the bonding pad and the uppermost Cu interconnection layer below the bonding pad. In addition to the two layers of the flat barrier film, a flat barrier film is further formed between other Cu interconnections, whereby the moisture resistance can be further improved.

INDUSTRIAL APPLICABILITY

The semiconductor device and method for fabricating the same according to the present invention are useful to improve the reliability of a semiconductor device including a ferroelectric capacitor.

The invention claimed is:

1. A semiconductor device comprising:
 a ferroelectric capacitor formed above a semiconductor substrate and including a lower electrode, a ferroelectric film formed on the lower electrode and an upper electrode formed on the ferroelectric film;
 a first insulation film formed above the semiconductor substrate and the ferroelectric capacitor, and having a surface planarized;
 a fifth insulation film formed above the first insulation film and having a flat surface;
 a flat first barrier film formed above the overall flat surface of the fifth insulation film, for preventing the diffusion of hydrogen or water;
 a sixth insulation film formed above the first barrier film and having a flat surface;
 a second insulation film formed above the sixth insulation film and having a surface planarized; a seventh insulation film formed above the second insulation film and having a flat surface;
 a flat second barrier film formed above the seventh insulation film, for preventing the diffusion of hydrogen or water;
 an eighth insulation film formed above the second barrier film and having a flat surface;
 a first interconnection electrically connected to the lower electrode of the ferroelectric capacitor, covered by the fifth insulation film;
 a second interconnection formed above the first interconnection; and
 a third interconnection formed, above the second interconnection and electrically connected to an outside circuit,
 wherein the first insulation film, the fifth insulation film, the sixth insulation film and the first barrier film are formed between the first interconnection and the second interconnection,
 wherein the second insulation, film, the seventh insulation film, the eight insulation film and the second barrier film are formed between the second interconnection and the third interconnection.

2. A semiconductor device according to claim 1, further comprising:
 a third insulation film formed above the third interconnection and having a surface planarized; and
 a flat third barrier film formed above the third insulation film, for preventing the diffusion of hydrogen or water, an opening being formed in the third insulation film and the third barrier film down to the third interconnection.

3. A semiconductor device according to claim 1, further comprising:
 a ninth insulation film formed covering the ferroelectric capacitor;
 a seventh barrier film formed above the ninth insulation film; and
 a tenth insulation film formed above the seventh barrier film;
 wherein the ninth insulation film, the tenth insulation film and the seventh barrier film are formed between the ferroelectric capacitor and the first interconnection.

4. A semiconductor device comprising:
 a ferroelectric capacitor formed above a semiconductor substrate and including a lower electrode, a ferroelectric film formed on the lower electrode and an upper electrode formed on the ferroelectric film;
 a first insulation film formed above the semiconductor substrate and the ferroelectric capacitor, and having a surface planarized;
 a fifth insulation film formed above the first insulation film and having a flat surface;
 a flat first, barrier film formed above the overall flat surface of the fifth insulation film, for preventing the diffusion of hydrogen or water;
 a sixth insulation film formed above the first barrier film and having a flat surface;
 a second insulation film formed above the sixth insulation film and having a surface planarized; a seventh insulation film formed above the second insulation film and having a flat surface;
 a flat second barrier film formed above the seventh insulation film, for preventing the diffusion of hydrogen or water;
 an eighth insulation film formed above the second barrier film and having a flat surface;
 a first interconnection electrically connected to the lower electrode of the ferroelectric capacitor, covered by the fifth insulation film;
 a second interconnection formed above the first interconnection; and
 a third interconnection formed above the second interconnection and electrically connected to an outside circuit,
 wherein the first insulation film, the fifth insulation film, the sixth insulation film and the first barrier film are formed between the first interconnection and the second interconnection,
 wherein the second insulation film, the seventh insulation film, the eighth, insulation film and the second barrier film are formed above the third interconnection, and an opening is formed in the second insulation film, the seventh insulation film, the eighth insulation film and the second barrier film down to the third interconnection.

5. A semiconductor device comprising:
 a ferroelectric capacitor formed above a semiconductor substrate, and including a lower electrode, a ferroelectric film formed on the lower electrode and an upper electrode formed on the ferroelectric film;
 a first insulation film formed above the semiconductor substrate and the ferroelectric capacitor, and having a surface planarized;
 a fifth insulation film formed above the first insulation film and having a flat surface;
 a flat first barrier film formed above the overall flat surface of the fifth insulation film, for preventing the diffusion of hydrogen or water;
 a sixth insulation film formed above the first barrier film and having a flat surface;
 a second insulation film formed above the sixth insulation film and having a surface planarized; a seventh insulation film formed above the second insulation film and having a flat surface;

a flat second barrier film formed above the seventh insulation film, for preventing the diffusion of hydrogen or water;
an eighth insulation film formed above the second barrier film, and having a flat surface;
a first interconnection electrically connected to the lower electrode of the ferroelectric capacitor, covered by the fifth insulation film;
a second interconnection formed above the first interconnection; and
a third interconnection formed, above the second interconnection and electrically connected to an outside circuit,
wherein the first insulation film, the fifth insulation film, the sixth insulation film and the first barrier film are formed between the second interconnection and the third interconnection, the second insulation film, the seventh insulation film, the eighth insulation film and the second barrier film are formed above the third interconnection, and an opening is formed in the second insulation film, the seventh insulation film, the eighth insulation film and the second barrier film down to the third interconnection.

6. A semiconductor device comprising:
a ferroelectric capacitor formed above a semiconductor substrate and including a lower electrode, a ferroelectric film formed on the lower electrode and an upper electrode formed on, the ferroelectric film;
a first insulation film formed above the semiconductor substrate and the ferroelectric capacitor, and having a surface planarized;
a fifth insulation film formed above the first insulation film and having a flat surface;
a flat first barrier film formed above the overall flat surface of the fifth insulation film, for preventing the diffusion of hydrogen or water;
a sixth insulation film formed above the first barrier film and having a flat surface;
a second insulation film formed above the sixth insulation, film, and having a surface planarized; a seventh insulation film formed above the second insulation film and having a flat surface;
a flat second barrier film formed above the seventh insulation film, for preventing the diffusion of hydrogen or water;
an eighth insulation film, formed above the second barrier film and having a flat surface;
a first interconnection electrically connected to the lower electrode of the ferroelectric capacitor, covered by the fifth insulation film;
a second interconnection formed above the first interconnection; and
a third interconnection formed above the second interconnection and electrically connected to an outside circuit,
wherein the second insulation film, the seventh insulation film, the eighth insulation film and the second barrier film are formed between the first interconnection and the second interconnection.

7. A semiconductor device according to claim 6, further comprising:
a third insulation film formed between the second interconnection and the third interconnection, and having a surface planarized; and
a flat third barrier film formed, below the third interconnection and above the third insulation film, for preventing the diffusion of hydrogen or water.

8. A semiconductor device according to claim 7, further comprising:
a fourth insulation film formed above the third interconnection and having a surface planarized; and a flat fourth barrier film formed above the fourth insulation film, for preventing the diffusion of hydrogen or water, an opening being formed in the fourth insulation film and the fourth barrier film down to the third interconnection.

9. A semiconductor device comprising:
a ferroelectric capacitor formed above a semiconductor substrate, and including a lower electrode, a ferroelectric film formed on the lower electrode and an upper electrode formed on, the ferroelectric film;
a first insulation film formed above the semiconductor substrate and the ferroelectric capacitor, and having a surface planarized;
a fifth insulation film formed above the first insulation film and having a flat surface;
a flat first barrier film formed above the overall flat surface of the fifth insulation film, for preventing the diffusion of hydrogen or water;
a sixth insulation film formed above the first barrier film and having a flat surface;
a second insulation film formed above the sixth insulation film and having a surface planarized; a seventh insulation film formed above the second insulation film and having a flat surface;
a flat second barrier film formed above the seventh insulation film, for preventing the diffusion of hydrogen or water;
an eighth insulation film formed above the second barrier film and having a flat surface;
a first interconnection electrically connected to the lower electrode of the ferroelectric capacitor, covered by the fifth insulation film;
a second interconnection formed above the first interconnection; and
a third interconnection formed, above the second interconnection and electrically connected to an outside circuit,
wherein the second insulation film, the seventh insulation film, the eighth insulation film and the second barrier film are formed above the third interconnection, and an opening is formed in the second insulation film, the seventh insulation film, the eighth insulation film and the second barrier film down to the third interconnection.

* * * * *